(12) United States Patent
Liu et al.

(10) Patent No.: US 12,322,649 B2
(45) Date of Patent: Jun. 3, 2025

(54) INTERCONNECT STRUCTURE OF SEMICONDUCTOR DEVICE

(71) Applicant: Taiwan Semiconductor Manufacturing Co., Ltd., Hsinchu (TW)

(72) Inventors: Yao-Min Liu, Taipei (TW); Chia-Pang Kuo, Taoyuan (TW); Shu-Cheng Chin, Hsinchu (TW); Chih-Chien Chi, Hsinchu (TW); Cheng-Hui Weng, Hsinchu (TW); Hung-Wen Su, Jhubei (TW); Ming-Hsing Tsai, Chu-Pei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 569 days.

(21) Appl. No.: 17/669,665

(22) Filed: Feb. 11, 2022

(65) Prior Publication Data

US 2022/0165616 A1    May 26, 2022

Related U.S. Application Data

(63) Continuation-in-part of application No. 17/143,496, filed on Jan. 7, 2021, now Pat. No. 11,527,476.
(Continued)

(51) Int. Cl.
  *H01L 21/768* (2006.01)
  *H01L 23/522* (2006.01)
  *H01L 23/532* (2006.01)

(52) U.S. Cl.
  CPC .. *H01L 21/76843* (2013.01); *H01L 21/76879* (2013.01); *H01L 23/5226* (2013.01); *H01L 23/53238* (2013.01)

(58) Field of Classification Search
  CPC .......... H01L 23/5226; H01L 21/76843; H01L 21/76879; H01L 2221/1063;
(Continued)

(56) References Cited

U.S. PATENT DOCUMENTS

| | | | |
|---|---|---|---|
| 7,964,497 B2 | 6/2011 | McFeely et al. | |
| 10,319,629 B1 * | 6/2019 | Yang | H01L 21/76834 |

(Continued)

FOREIGN PATENT DOCUMENTS

| | | |
|---|---|---|
| JP | 2008205298 A | 9/2008 |
| JP | 2009027157 A | 2/2009 |
| KR | 20120016652 A | 2/2012 |

*Primary Examiner* — Karen Kusumakar
(74) *Attorney, Agent, or Firm* — Slater Matsil, LLP

(57) ABSTRACT

A method includes forming a first conductive feature in a first dielectric layer. A second dielectric layer is formed over the first conductive feature and the first dielectric layer. An opening is formed in the second dielectric layer. The opening exposes a top surface of the first conductive feature. The top surface of the first conductive feature includes a first metallic material and a second metallic material different from the first metallic material. A native oxide layer is removed from the top surface of the first conductive feature. A surfactant soaking process is performed on the top surface of the first conductive feature. The surfactant soaking process forms a surfactant layer over the top surface of the first conductive feature. A first barrier layer is deposited on a sidewall of the opening. The surfactant layer remains exposed at the end of depositing the first barrier layer.

20 Claims, 40 Drawing Sheets

Related U.S. Application Data

(60) Provisional application No. 63/076,999, filed on Sep. 11, 2020.

(58) Field of Classification Search
CPC ......... H01L 21/76826; H01L 21/76844; H01L 21/76846; H01L 23/53238; H01L 21/76814; H01L 21/76831; H01L 23/528; H01L 2221/1057
See application file for complete search history.

(56) References Cited

U.S. PATENT DOCUMENTS

| | | |
|---|---|---|
| 2003/0139034 A1 | 7/2003 | Yuang |
| 2008/0132057 A1 | 6/2008 | Feustel et al. |
| 2008/0280432 A1 | 11/2008 | Chang et al. |
| 2009/0209099 A1 | 8/2009 | Yu et al. |
| 2012/0091588 A1 | 4/2012 | Miyoshi |
| 2016/0189966 A1 | 6/2016 | Kolics |
| 2020/0105592 A1 | 4/2020 | Kuo et al. |

\* cited by examiner

INTERCONNECT STRUCTURE OF SEMICONDUCTOR DEVICE

PRIORITY CLAIM AND CROSS-REFERENCE

This application is a continuation-in-part of U.S. patent application Ser. No. 17/143,496, filed on Jan. 7, 2021, now U.S. Pat. No. 11,527,476, issued Dec. 13, 2022, which claims the benefit of U.S. Provisional Application No. 63/076,999, filed on Sep. 11, 2020, which applications are hereby incorporated herein by reference.

BACKGROUND

Generally, active devices and passive devices are formed on and in a semiconductor substrate. Once formed, these active devices and passive devices may be connected to each other and to external devices using a series of conductive and insulating layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
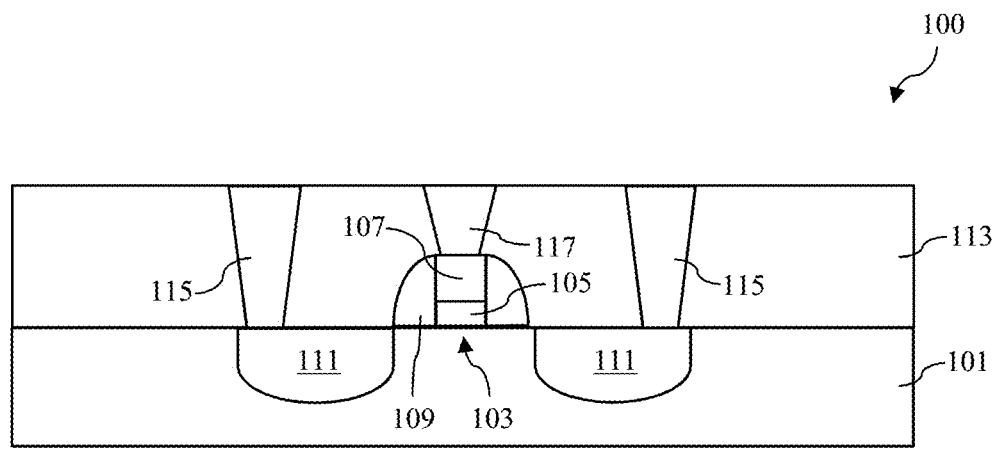
FIGS. 1, 2, 5, 6, 8-10, 11A, 11B, 12A, 12B, and 13-28 illustrate cross-sectional views of various intermediate stages of fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, an interconnect structure of a semiconductor device and a method of forming the same. Some embodiments allow for altering a deposition rate of a barrier layer on a surface of a first conductive feature that is exposed by an opening in an overlying dielectric layer, such that the deposition rate on the bottom of the opening (i.e., on the exposed surface of the first conductive feature) is reduced or suppressed, and such that the barrier layer is selectively deposited on sidewalls of the opening and not on the bottom of the opening. In some embodiments, the deposition rate of the barrier layer on the bottom of the opening may be reduced or suppressed by performing a surface modification process on the exposed surface of the first conductive feature. In some embodiments, the surface modification process includes performing an oxide reduction process on the exposed surface of the conductive feature followed by performing a surfactant soaking process on the exposed surface of the conductive feature. Various embodiments discussed herein allow for reducing an amount of the barrier layer within the opening and reducing a contact resistance between the first conductive feature and a second conductive feature formed in the opening.

FIGS. 1, 2, 5, 6, 8-10, 11A, 11B, 12A, 12B, and 13-28 illustrate cross-sectional views of various intermediate stages of fabrication of a semiconductor device 100 in accordance with some embodiments. Referring to FIG. 1, the process for forming the semiconductor device 100 comprises providing a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 103 (illustrated in FIG. 1 as a single transistor) are formed on the substrate 101. The one or more active and/or passive devices 103 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also used as appropriate for a given application.

In some embodiments, the transistor 103 includes a gate stack comprising a gate dielectric 105 and a gate electrode 107, spacers 109 on opposite sidewalls of the gate stack, and source/drain regions 111 adjacent to the respective spacers 109. For simplicity, components that are commonly formed in integrated circuits, such as gate silicides, source/drain silicides, contact etch stop layers, and the like, are not illustrated. In some embodiments, the transistor 103 may be formed using any acceptable methods. In some embodiments, the transistor 103 may be a planar MOSFET, a FinFET, or the like.

In some embodiments, one or more interlayer dielectric (ILD) layers 113 are formed over the substrate and the one or more active and/or passive devices 103. In some embodiments, the one or more ILD layers 113 may comprise, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, and may be formed by any suitable method, such as spin-on coating, chemical vapor deposition (CVD), plasma-enhanced CVD (PECVD), atomic layer deposition (ALD), a combination thereof, or the like.

In some embodiments, source/drain contact plugs 115 and a gate contact plug 117 are formed in the one or more ILD layers 113. The source/drain contact plugs 115 provide electrical contacts to the source/drain regions 111. The gate contact plug 117 provides electrical contact to the gate electrode 107. In some embodiments, the steps for forming the contact plugs 115 and 117 include forming openings in the one or more ILD layers 113, depositing one or more barrier/adhesion layers (not explicitly shown) in the openings, depositing seed layers (not explicitly shown) over the one or more barrier/adhesion layers, and filling the openings with a conductive material (not explicitly shown). A chemical mechanical polishing (CMP) is then performed to remove excess materials of the one or more barrier/adhesion layers, the seed layers, and the conductive material overfilling the openings. In some embodiments, topmost surfaces of the contact plugs 115 and 117 are substantially coplanar or level with a topmost surface of the one or more ILD layers 113 within process variations of the CMP process.

In some embodiments, the one or more barrier/adhesion layers may comprise titanium, titanium nitride, tantalum, tantalum nitride, a combination thereof, a multilayer thereof, or the like, and may be formed using physical vapor deposition (PVD), CVD, ALD, a combination thereof, or the like. The one or more barrier/adhesion layers protect the one or more ILD layers 113 from diffusion and metallic poisoning. The seed layers may comprise copper, titanium, nickel, gold, manganese, a combination thereof, a multilayer thereof, or the like, and may be formed by ALD, CVD, PVD, sputtering, a combination thereof, or the like. The conductive material may comprise copper, aluminum, tungsten, cobalt, ruthenium, molybdenum, combinations thereof, alloys thereof, multilayers thereof, or the like, and may be formed using, for example, plating, or other suitable methods.

Figure 2:
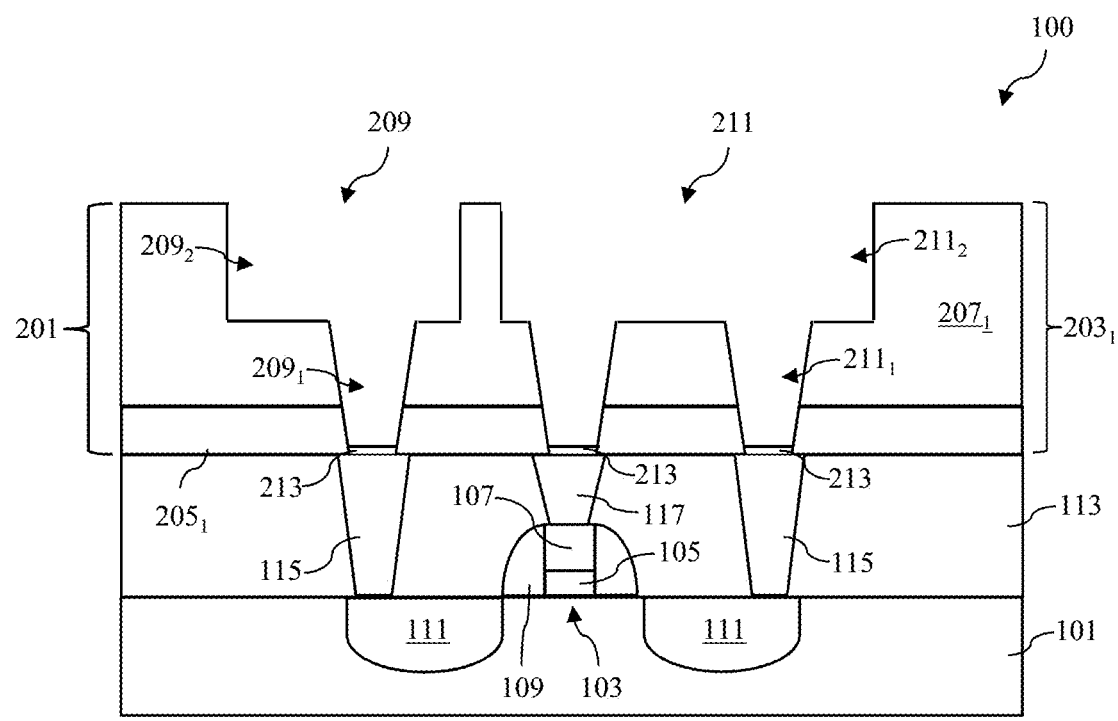

FIGS. 2, 5, 6, 8-10, 11A, 11B, 12A, 12B, and 13-28 illustrate cross-sectional views of various intermediate stages of fabrication of an interconnect structure 201 over the structure of FIG. 1 in accordance with some embodiments. Referring to FIG. 2, in some embodiments, the steps for forming the interconnect structure 201 starts with forming a metallization layer $203_1$ over the one or more ILD layers 113 and the contact plugs 115 and 117. In some embodiments, the formation of the metallization layer $203_1$ starts with forming an etch stop layer (ESL) $205_1$ over the one or more ILD layers 113 and the contact plugs 115 and 117, and forming an inter-metal dielectric (IMD) layer $207_1$ over the ESL $205_1$.

In some embodiments, a material for the ESL $205_1$ is chosen such that an etch rate of the ESL $205_1$ is less than an etch rate of the IMD layer $207_1$. In some embodiments, the ESL $205_1$ may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like. In some embodiments, the IMD layer $207_1$ may be formed using similar materials and methods as the one or more ILD layers 113 described above with reference to FIG. 1, and the description is not repeated herein. In some embodiments, the one or more ILD layers 113 and the IMD layer $207_1$ may comprise a same material. In other embodiments, the one or more ILD layers 113 and the IMD layer $207_1$ may comprise different materials.

Referring further to FIG. 2, the IMD layer $207_1$ and the ESL $205_1$ are patterned to form openings 209 and 211 in the IMD layer $207_1$ and the ESL $205_1$. In some embodiments, the opening 209 exposes a top surface of the source/drain contact plug 115, and the opening 211 exposes a top surface of the source/drain contact plug 115 and a top surface of the gate contact plug 117. The opening 209 comprises a lower portion 209$_1$, which may be also referred to as a via opening 209$_1$, and an upper portion 209$_2$, which may be also referred to as a line opening 209$_2$. The opening 211 comprises lower portions 211$_1$, which may be also referred to as via openings 211$_1$, and an upper portion 211$_2$, which may be also referred to as a line opening 211$_2$. In some embodiments, the openings 209 and 211 may be formed by a "via first" process. In such embodiments, the via openings of the openings 209 and 211 are formed before the line openings of the openings 209 and 211. In other embodiments, the openings 209 and 211 may be formed by a "trench first" process. In such embodiments, the via openings of the openings 209 and 211 are formed after the line openings of the openings 209 and 211. In some embodiments, the openings 209 and 211 may be formed using suitable photolithography and etching processes. The etching processes may include one or more dry etching processes. The etching processes may be anisotropic.

In some embodiments, after forming the openings 209 and 211, the resulting structure is transferred to an apparatus 400 (see Figure) for forming a barrier layer as described below with reference to FIGS. 3A-3C, 4-6, 7A-7C, 8-10, 11A, 11B, 12A, 12B, and 13-15. In some embodiment, the transferring process may break the vacuum and oxide layers 213 may be formed on the exposed surfaces of the contact plugs 115 and 117. The oxide layers 213 are native oxide layers. In some embodiments when the contact plugs 115 and 117 comprise a metallic material, the oxide layers 213 comprise an oxide of the metallic material.

Figure 3A:
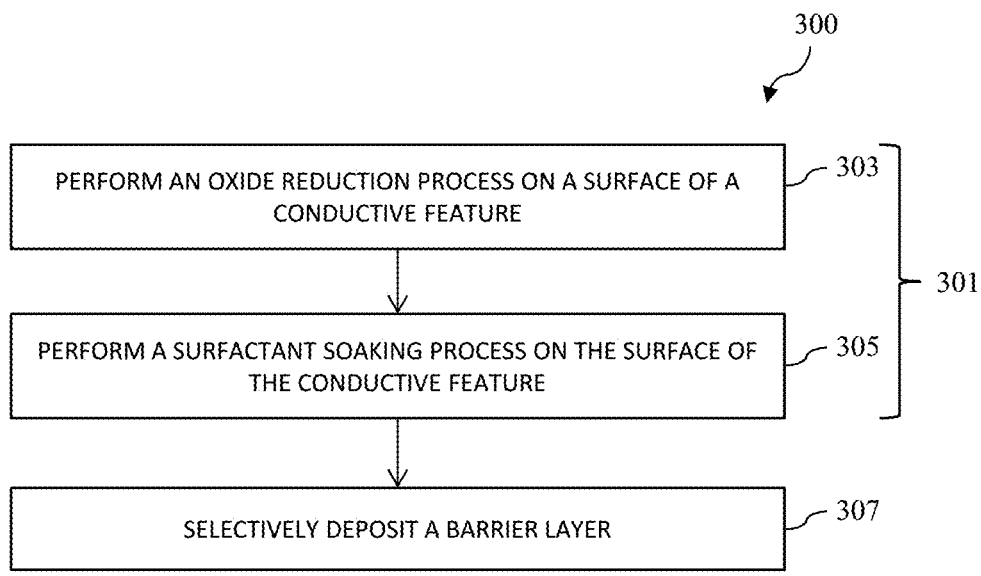
FIG. 3A is a flow diagram illustrating a method of forming a barrier layer in accordance with some embodiments.
Figure 3B:
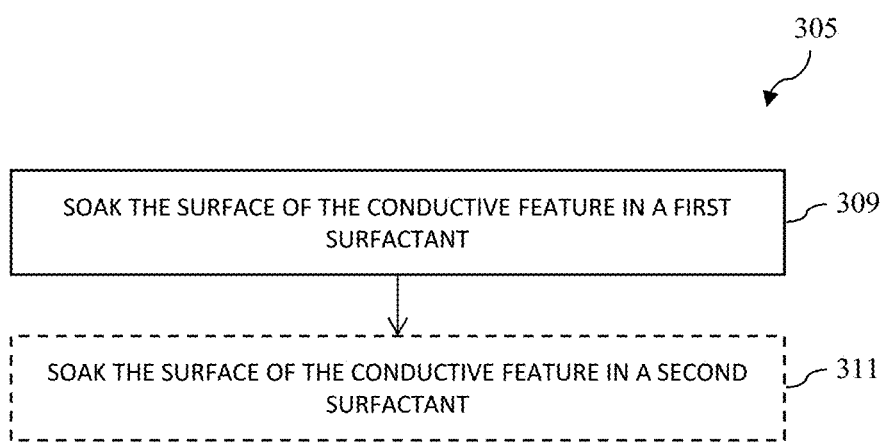
FIG. 3B is a flow diagram illustrating a surfactant soaking process in accordance with some embodiments.
Figure 3C:
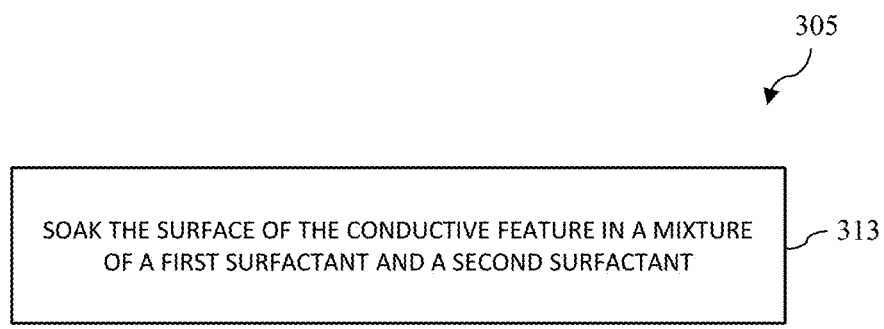
FIG. 3C is a flow diagram illustrating a surfactant soaking process in accordance with some embodiments.
Figure 4:
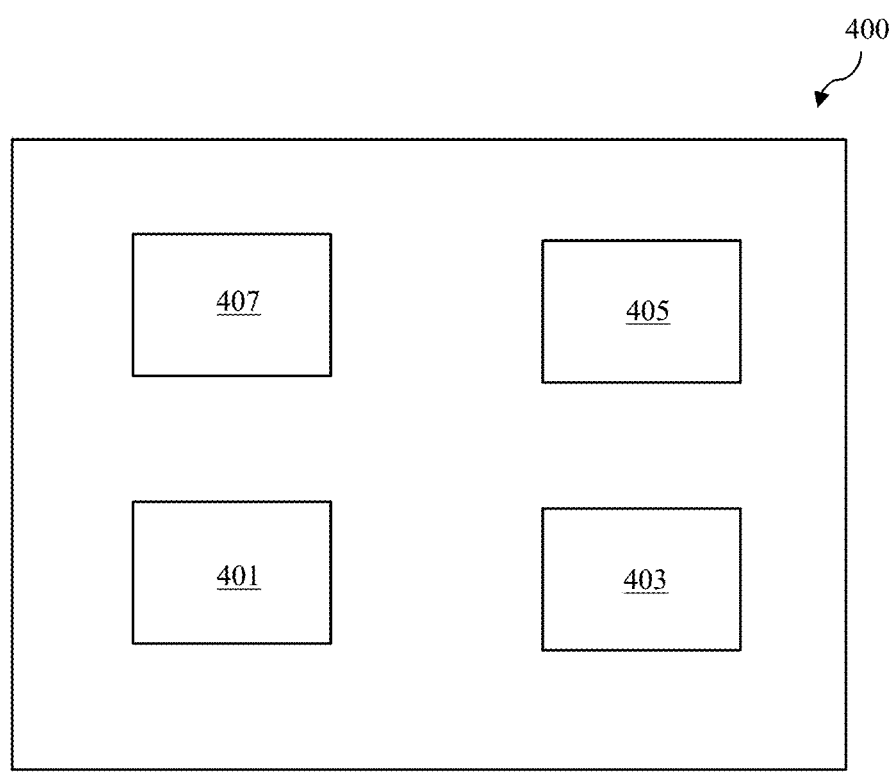
FIG. 4 illustrates a schematic view of an apparatus for forming a barrier layer in accordance with some embodiments.

FIG. 3A is a flow diagram illustrating a method 300 of forming a barrier layer 1501 (see FIG. 15) in the openings 209 and 211 (see FIG. 2) in accordance with some embodiments. FIGS. 3B and 3C are flow diagrams illustrating a surfactant soaking process 305 performed in the method 300 in accordance with some embodiments. FIG. 4 illustrates a schematic view of an apparatus 400 for forming the barrier layer 1501 in accordance with some embodiments. FIGS. 5, 6, 7A-7C, 8-10, 11A, 11B, 12A, 12B, and 13-15 illustrate cross-sectional views of various intermediate stages of fabrication of the barrier layer 1501 in the openings 209 and 211 in accordance with the method 300.

Figure 5:
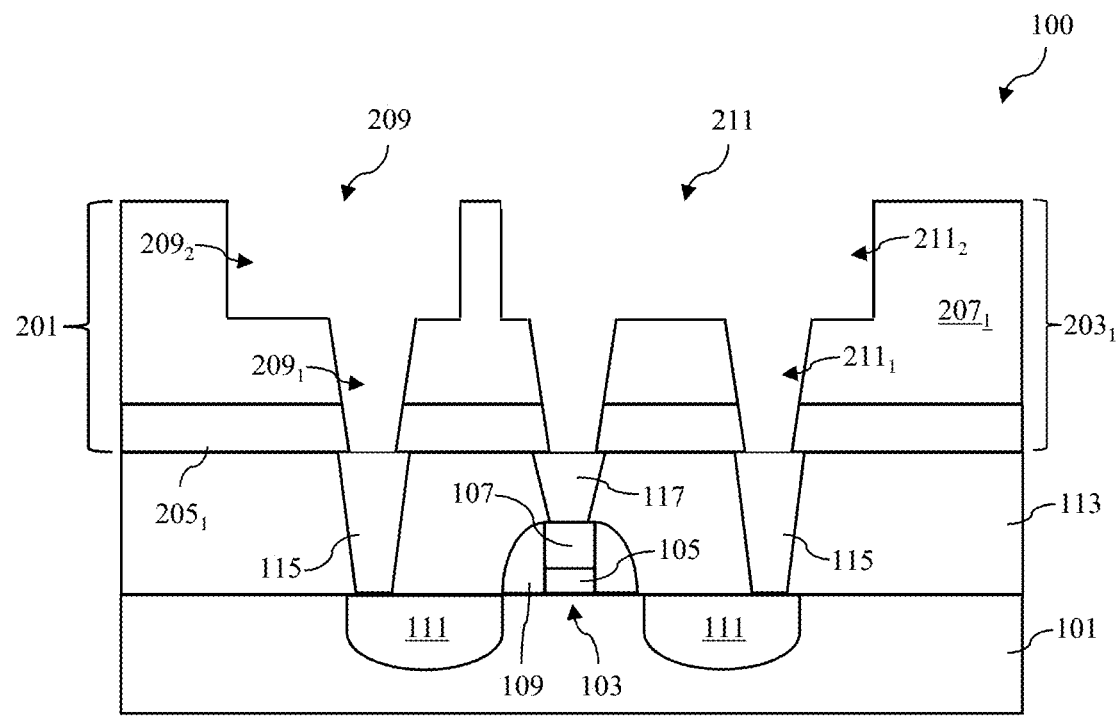

Referring to FIGS. 3A, 4, and 5, the method 300 starts with step 301 when a surface modification process is performed on the exposed surfaces of contact plugs 115 and 117. In some embodiments, step 301 comprises steps 303 and 305. In step 303, an oxide reduction process is performed on the oxide layers 213 (see FIG. 2) to remove oxygen from the oxide layers 213. In some embodiments when the oxide layers 213 comprise an oxide of a metallic material, the oxide reduction process removes oxygen from the oxide of the metallic material and leaves the metallic material behind. In some embodiments, the oxide reduction process comprises performing a plasma process on the oxide layers 213.

In some embodiments, the plasma process is performed by a plasma module 401 of the apparatus 400. In such embodiments, the structure of FIG. 2 is loaded into the plasma module 401 for performing the plasma process. The plasma module may be a remote plasma module or a direct plasma module. In some embodiments, the plasma process uses a plasma generated from a gas comprising $H_2$, Ar, a combination thereof, or the like.

In some embodiments when the oxide layers 213 comprise copper oxide, cobalt oxide, or ruthenium oxide, the plasma process may comprise an $H_2$ plasma process. In some embodiments, the $H_2$ plasma process is a remote plasma process with a positive ion filter, and may be performed at a temperature between about 300° C. and 350° C., and at a pressure between about 0.2 Torr to 3 Torr. In some embodiments, in addition to removing oxygen from the oxide layers 213, the $H_2$ plasma process may also remove etch byproducts formed on sidewalls and bottoms of the openings 209 and 211 during the etching process for forming the openings 209 and 211 (see FIG. 2).

In some embodiments wherein the oxide layers 213 (see FIG. 2) comprise tungsten oxide, the $H_2$ plasma process may not be efficient for removing oxygen from the tungsten oxide without causing carbon depletion of a low-k material of the IMD layer 207$_1$. In such embodiments, the plasma process comprises an Ar plasma process followed by the $H_2$ plasma process. In some embodiments, the Ar plasma process is a direct plasma process, and may be performed at a temperature between about 300° C. and 350° C., and at a pressure between about 2 mTorr to 30 mTorr.

Referring to FIGS. 3A-3C, 4, and 6, in step 305, a surfactant soaking process is performed on the structure of FIG. 5. The surfactant soaking process alters exposed top surfaces of conductive features (such as, for example, the contact plugs 115 and 117). In some embodiments, the surfactant soaking process may be performed by soaking modules 403 and 405 of the apparatus 400. In some embodiments, the surfactant soaking process comprises steps 309 and 311 (see FIG. 3B). In step 309, the structure of FIG. 5 is soaked in a gas of first surfactant molecules. In step 311, the structure of FIG. 5 is soaked in a gas of second surfactant molecules different from the first surfactant molecules. In some embodiments, step 311 may be omitted.

In some embodiments when step 311 is omitted, the step 309 is performed by the soaking module 403 and the soaking module 405 is not used. In such embodiments, in step 309, the structure of FIG. 5 is transferred from the plasma module 401 into the soaking module 403 and the gas of the first surfactant molecules is flown into a chamber of the soaking module 403. As described below in greater detail, such embodiments may be used when the top surfaces of conductive features (such as, for example, the contact plugs 115 and 117) comprises a single metallic material, or when the top surfaces of the conductive features (such as, for example, the contact plugs 115 and 117) comprise two or more metallic materials.

In some embodiments when both step 309 and 311 are performed, both step 309 and 311 are performed by the soaking module 403 and the soaking module 405 is not used. In such embodiments, in step 309, the structure of FIG. 5 is transferred from the plasma module 401 into the soaking module 403 and the gas of the first surfactant molecules is flown into the chamber of the soaking module 403. After completing step 309, in step 911, the gas of the second surfactant molecules is flown in the chamber of the soaking module 403. As described below in greater detail, such embodiments may be used when the top surfaces of the conductive features (such as, for example, the contact plugs 115 and 117) comprise two or more metallic materials.

In some embodiments when both step 309 and 311 are performed, step 309 is performed by the soaking module 403 and step 311 is performed by the soaking module 405. In such embodiments, in step 309, the structure of FIG. 5 is transferred from the plasma module 401 into the soaking module 403 and the gas of the first surfactant molecules is flown into the chamber of the soaking module 403. After completing step 309, in step 911, the structure of FIG. 5 is transferred from the soaking module 403 into the soaking module 405 and the gas of the second surfactant molecules is flown into a chamber of the soaking module 405. As described below in greater detail, such embodiments may be used when the top surfaces of the conductive features (such as, for example, the contact plugs 115 and 117) comprise two or more metallic materials.

In some embodiments, the surfactant soaking process comprises step 313 (see FIG. 3C). In step 313, the structure of FIG. 5 is soaked in a gas comprising a mixture of first surfactant molecules and second surfactant molecules different from the first surfactant molecules. In some embodiments, step 313 is performed by the soaking module 403 and the soaking module 405 is not used. In such embodiments, in step 313, the structure of FIG. 5 is transferred from the plasma module 401 into the soaking module 403 and the gas comprising the mixture of the first surfactant molecules and the second surfactant molecules is flown into the chamber of the soaking module 403. As described below in greater detail, such embodiments may be used when the top surfaces of the conductive features (such as, for example, the contact plugs 115 and 117) comprise two or more metallic materials.

In some embodiments, the surfactant soaking process is performed for a soaking process time between about 20 sec to about 300 sec. In some embodiments, the surfactant soaking process forms surfactant layers 601 on the exposed top surfaces of the contact plugs 115 and 117. In some embodiments, the surfactant layers 601 are not formed on surfaces of the IMD layer $207_1$ exposed by the openings 209 and 211. In some embodiments, the surfactant layers 601 may comprises one or more layers of the surfactant molecules. Each of the surfactant layers 601 may be a monolayer. In some embodiments, the surfaces of the IMD layer $207_1$ exposed by the openings 209 and 211 may be free from surfactant molecules. As described below in greater detail, the surfactant layers 601 prevent the barrier layer from forming over top surface of the conductive features (such as, for example, the contact plugs 115 and 117).

In some embodiments, the surfactant molecules comprise functional groups (also referred to as head groups) that bind to metal atoms of the conductive features (such as, for example, the contact plugs 115 and 117). The surfactant molecules may be unsaturated hydrocarbon molecules (such as alkene molecules, alkyne molecules, aromatic compounds, or the like) that comprise unsaturated carbon functional groups, molecules (such as alkylamine molecules, monoamine molecules, diamine molecules, triamine molecules, tetraamine molecules, or the like) that comprise nitrogen-based functional groups such as amine functional groups, molecules (such as aminoalkyne molecules, or the like) that comprise more than one functional group, or the like. In some embodiments when the surfactant molecules are molecules that comprise more than one functional group, each surfactant molecule may comprise an unsaturated carbon functional group, a nitrogen-based functional group (such as amine functional group), a combination thereof, or any functional group that binds to metal atoms. In some embodiments when the surfactant molecules are aminoalkyne molecules, each surfactant molecule comprises an unsaturated carbon functional group and a nitrogen-based functional group (such as amine functional group). The alkene molecules have a chemical formula $C_nH_{2n+1}CH=CHC_mH_{2m+1}$, with n and m being in a range from 0 to 10, and with n and m being equal or different from one another. The alkyne molecules have a chemical formula $C_nH_{2n+1}C\equiv CC_mH_{2m+1}$, with n and m being in a range from 0 to 10, and with n and m being equal or different from one another. The alkylamine molecules have a chemical formula $C_nH_{2n+1}NH_2$, with n being in a range from 1 to 10, a chemical formula $(C_nH_{2n+1})(C_mH_{2m+1})NC_2H_4N(C_jH_{2j+1})(C_kH_{2k+1})$, with n, m, j and k being in a range from 0 to 10, a chemical formula $(C_nH_{2n+1})(C_mH_{2m+1})NC_2H_4N(C_jH_{2l+1})C_2H_4N(C_jH_{2j+1})(C_kH_{2k+1})$, with n, m, j, k and l being in a range from 0 to 10, or a chemical formula $N(C_2H_4N)_3(C_nH_{2n+1})(C_mH_{2m+1})(C_jH_{2j+1})(C_kH_{2k+1})(C_iH_{2i+1})(C_hH_{2h+1})$, with n, m, j, k, i and h being in a range from 0 to 10.

Figure 7A:
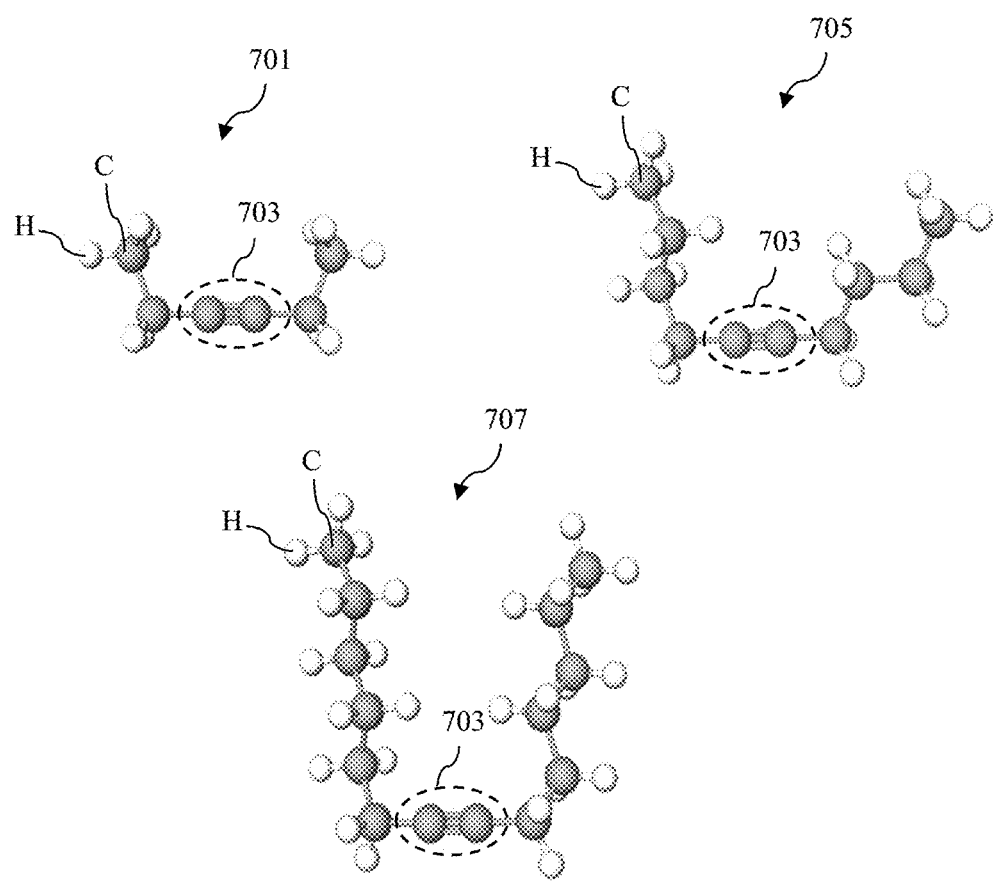
FIGS. 7A-7C illustrate various surfactant molecules in accordance with some embodiments.

FIG. 7A illustrate various surfactant molecules in accordance with some embodiments. The surfactant molecules 701, 705 and 707 are alkyne molecules that comprise unsaturated carbon functional groups 703 such as alkyne moieties. The surfactant molecule 701 has a chemical formula $C_2H_5C\equiv CC_2H_5$. The surfactant molecule 705 has a chemical formula $C_4H_9C\equiv CC_4H_9$. The surfactant molecule 707 has a chemical formula $C_6H_{13}C\equiv CC_6H_{13}$. A length of the surfactant molecule 705 is greater than a length of the surfactant molecule 701. A length of the surfactant molecule 707 is greater than lengths of the surfactant molecules 701 and 705. The surfactant molecules 701, 705 and 707 bond to a metallic material through the unsaturated carbon functional groups 703. Longer surfactant molecules provide enhanced electron density of CC bonds and enhanced coverage of the surface of the metallic material per adsorbed surfactant molecule.

Figure 7B:
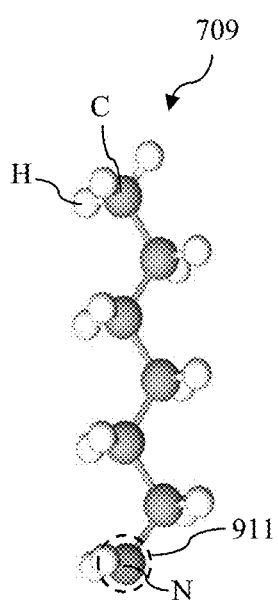

FIG. 7B illustrates a surfactant molecule in accordance with some embodiments. The surfactant molecule 709 is an alkylamine molecule having a nitrogen-based functional group 711 at one end of the molecule. The surfactant molecule 709 has a chemical formula $C_6H_{13}NH_2$. The surfactant molecule 709 bonds to a metallic material through the nitrogen-based functional group 711.

Figure 7C:
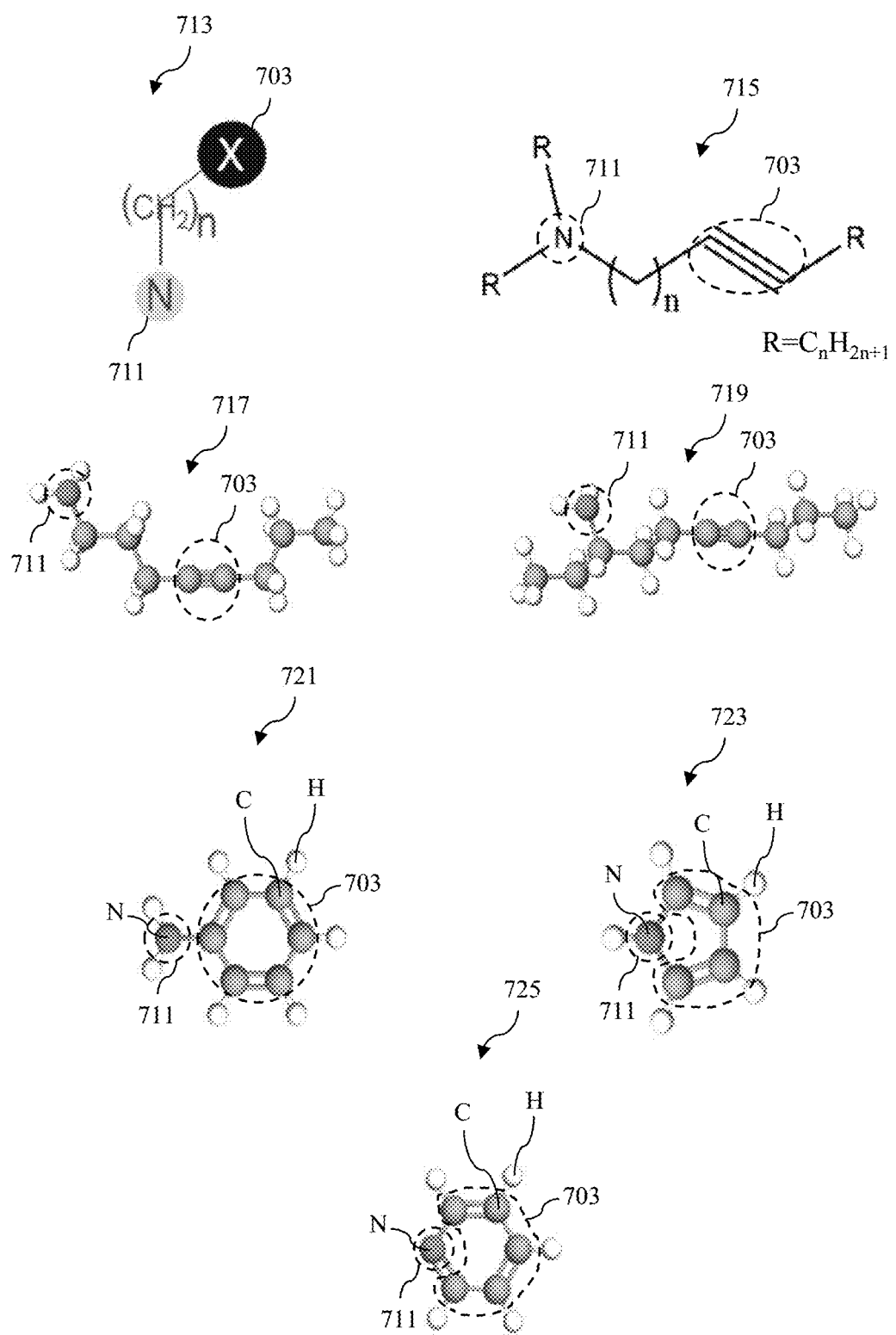

FIG. 7C illustrate various surfactant molecules in accordance with some embodiments. The surfactant molecules 713, 715, 717, 719, 721, 723, and 725 are molecules that comprise both unsaturated carbon functional groups 703 and nitrogen-based functional groups 711. The surfactant molecule 713 is a linear molecule comprising an unsaturated carbon functional group 703 at one end of the molecule and a nitrogen-based functional group 711 at opposite end of the molecule. The surfactant molecule 715 is a linear molecule comprising an unsaturated carbon functional group 703 at an interior of the molecule and a nitrogen-based functional group 711 at one end of the molecule, with R being a hydrocarbon such as, for example, $C_nH_{2n+1}$. The surfactant molecule 717 is a linear molecule comprising an unsaturated carbon functional group 703 at an interior of the molecule and a nitrogen-based functional group 711 at one end of the molecule. The surfactant molecule 719 is a linear molecule comprising an unsaturated carbon functional group 703 and a nitrogen-based functional group 711 at an interior of the molecule. The surfactant molecule 721 is a cyclic molecule comprising a ring of carbon atoms, the ring comprising unsaturated carbon functional groups 703, and a nitrogen-based functional group 711 being bonded to the ring. The surfactant molecule 723 is a heterocyclic molecule comprising a ring made of carbon and nitrogen atoms, the ring comprising unsaturated carbon functional groups 703 and a nitrogen-based functional group 711. The surfactant molecule 725 is a heterocyclic molecule comprising a ring made of carbon and nitrogen atoms, the ring comprising unsaturated carbon functional groups 703 and a nitrogen-based functional group 711. As described below in greater detail, the surfactant molecules 713, 715, 717, 719, 721, 723, and 725 bond to a metallic material through unsaturated carbon functional groups 703 or nitrogen-based functional groups 711 depending on the electropositivity of the metallic material.

Figure 8:
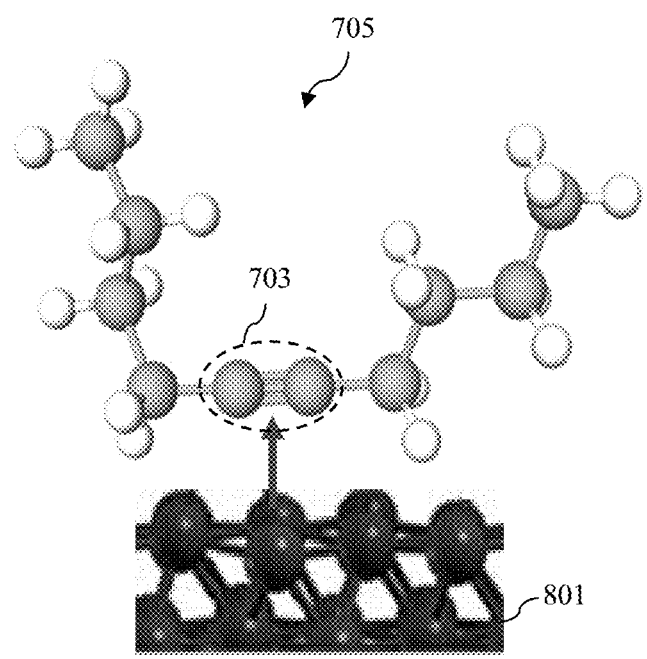

FIG. 8 illustrates a cross-sectional view of a surfactant soaking process performed on a surface of a metallic layer 801 in accordance with some embodiments. The metallic layer 801 may be a top portion of a conductive feature (such as, for example, the contact plug 115 or 117 illustrated in FIG. 5). The metallic layer 801 may comprise tungsten, molybdenum, cobalt, ruthenium, or copper, which have been ordered according to decreasing electropositivity. In some embodiments when surfactant molecules comprise molecules having the unsaturated carbon functional groups 703 such as, for example, the surfactant molecule 705, the surfactant molecules are bonded to atoms of the metallic layer 801 through the unsaturated carbon functional groups 703. Bond strength between the unsaturated carbon functional group 703 and an atom of the metallic layer 801 is greater for the metallic layer 801 having a lesser electropositivity. Bond strength between the unsaturated carbon functional group 703 and a copper atom is greater than bond strength between the unsaturated carbon functional group 703 and a ruthenium atom. Bond strength between the unsaturated carbon functional group 703 and a ruthenium atom is greater than bond strength between the unsaturated carbon functional group 703 and a cobalt atom. Bond strength between the unsaturated carbon functional group 703 and a cobalt atom is greater than bond strength between the unsaturated carbon functional group 703 and a molybdenum atom. Bond strength between the unsaturated carbon functional group 703 and a molybdenum atom is greater than bond strength between the unsaturated carbon functional group 703 and a tungsten atom. Accordingly, due to the strong bonding, the surfactant molecules having unsaturated carbon functional groups 703 sufficiently cover the metallic layer 801 made of copper. Furthermore, due to the weak bonding, the surfactant molecules having unsaturated carbon functional groups 703 may partially cover or do not cover the metallic layer 801 made of tungsten, molybdenum, cobalt, or ruthenium. In some embodiments when the metallic layer 801 is made of tungsten, molybdenum, cobalt, or ruthenium, the surfactant molecules having unsaturated carbon functional groups 703 may not be used while performing the surfactant soaking process.

Figure 9:
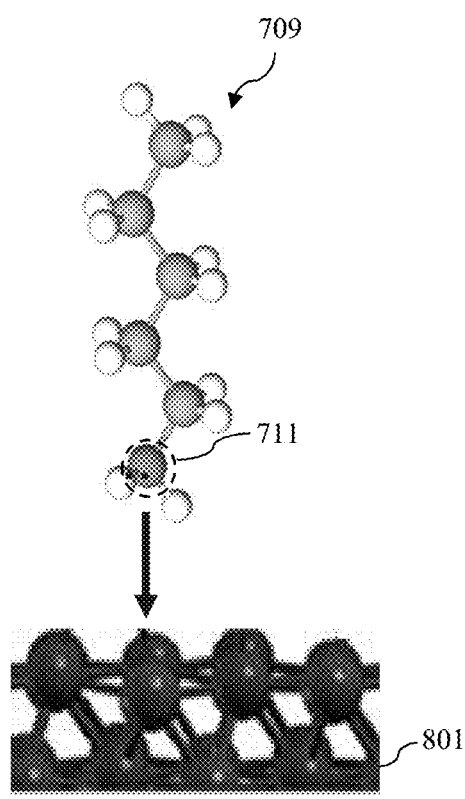

FIG. 9 illustrates a cross-sectional view of a surfactant soaking process performed on the surface of the metallic layer 801 in accordance with some embodiments. In some embodiments when surfactant molecules comprise molecules having the nitrogen-based functional groups 711 such as, for example, the surfactant molecule 709, the surfactant molecules are bonded to atoms of the metallic layer 801 through the nitrogen-based functional groups 711. Bond strength between the nitrogen-based functional groups 711 and an atom of the metallic layer 801 is greater for metallic layer 801 having a greater electropositivity. Bond strength between the nitrogen-based functional groups 711 and a tungsten atom is greater than bond strength between the nitrogen-based functional groups 711 and a molybdenum atom. Bond strength between the nitrogen-based functional groups 711 and a molybdenum atom is greater than bond strength between the nitrogen-based functional groups 711 and a cobalt atom. Bond strength between the nitrogen-based functional groups 711 and a cobalt atom is greater than bond strength between the nitrogen-based functional groups 711 and a ruthenium atom. Bond strength between the nitrogen-based functional groups 711 and a ruthenium atom is greater than bond strength between the nitrogen-based functional groups 711 and a copper atom. Accordingly, due to the strong bonding, the surfactant molecules having nitrogen-based functional groups 711 sufficiently cover the metallic layer 801 made of tungsten, molybdenum, cobalt, or ruthenium. Furthermore, due to the weak bonding, the surfactant molecules having nitrogen-based functional groups 711 partially cover or do not cover the metallic layer 801 made of copper. In some embodiments when the metallic layer 801 is made of copper, the surfactant molecules having nitrogen-based functional groups 711 may not be used while performing the surfactant soaking process.

Figure 10:
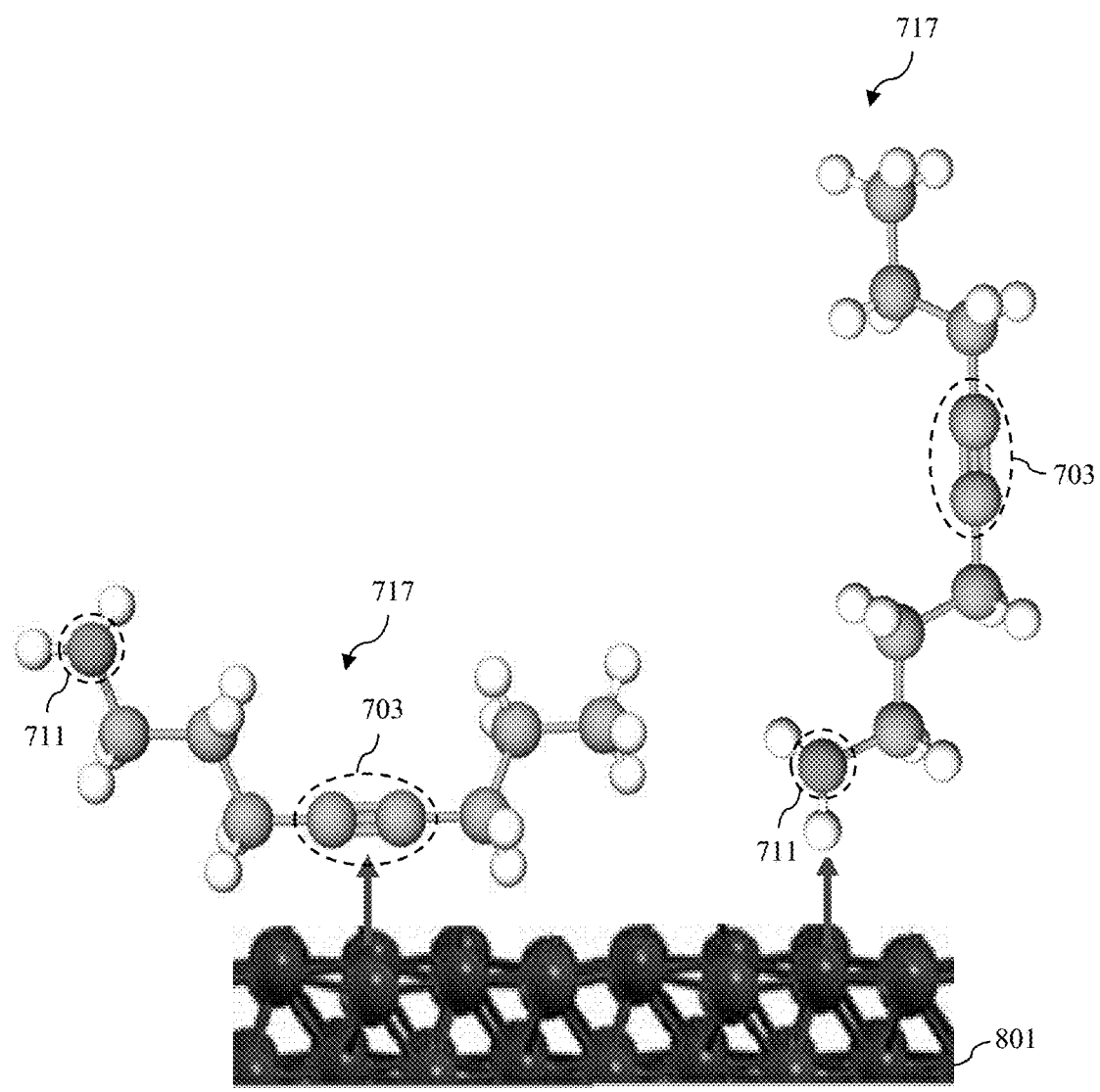

FIG. 10 illustrates a cross-sectional view of a surfactant soaking process performed on a surface of a metallic layer 801 in accordance with some embodiments. In some embodiments when surfactant molecules comprise molecules having both unsaturated carbon functional groups 703 and the nitrogen-based functional groups 711 such as, for example, the surfactant molecules 717, the surfactant molecules are bonded to atoms of the metallic layer 801 through the unsaturated carbon functional groups 703 or the nitrogen-based functional groups 711. In some embodiments when the metallic layer 801 is made of copper, surfactant molecules are bonded to atoms of the metallic layer 801 through the unsaturated carbon functional groups 703. In some embodiments when the metallic layer 801 is made of tungsten, molybdenum, cobalt, or ruthenium, surfactant molecules are bonded to atoms of the metallic layer 801 through the nitrogen-based functional groups 711.

Figure 11A:
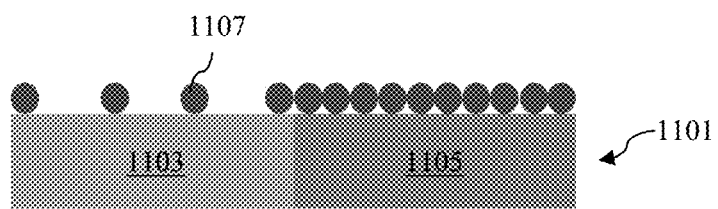
Figure 11B:
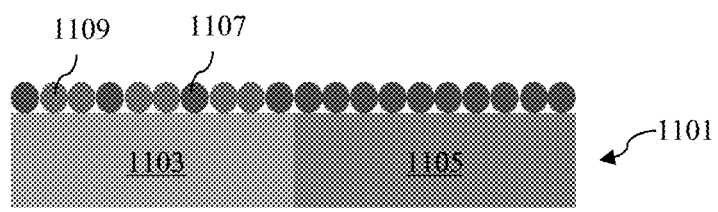

FIGS. 11A and 11B illustrate cross-sectional views of a surfactant soaking process performed on a surface of a metallic layer 1101 in accordance with some embodiments. The metallic layer 1101 may comprise a first metallic material 1103 and a second metallic material 1105 different from the first metallic material 1103. The first metallic material 1103 may be more electropositive than the second metallic material 1105. The first metallic material 1103 may be made of tungsten, molybdenum, cobalt, ruthenium, or a combination thereof. The second metallic material 1105 may be made of copper. In some embodiments, the surfactant soaking process may be performed according to the method 305 (see FIG. 3B).

Referring to FIG. 11A, the surface of the metallic layer 1101 is soaked in a gas of surfactant molecules 1107. The surfactant molecules 1107 may be molecules having only unsaturated carbon functional groups. The surfactant molecules 1107 are adsorbed on the surface of the metallic layer 1101, such that the surfactant molecules 1107 partially cover a surface of the first metallic material 1103 and fully cover a surface of the second metallic material 1105 due to the difference in electropositivity. The surfactant molecules 1107 are adsorbed on the surface of the metallic layer 1101 through unsaturated carbon functional groups (such as, for example, unsaturated carbon functional groups 703 illustrated in FIG. 7A).

Referring to FIG. 11B, the surface of the metallic layer 1101 is soaked in a gas of surfactant molecules 1109. The surfactant molecules 1109 may be molecules having only nitrogen-based functional groups. The surfactant molecules 1109 are adsorbed on the surface of the metallic layer 1101 such that the surfactant molecules 1109 fully cover the uncovered portions of the surface of the first metallic material 1103. The surfactant molecules 1109 are adsorbed on the surface of the metallic layer 1101 through nitrogen-based functional groups (such as, for example, nitrogen-based functional groups 711 illustrated in FIG. 7B). In some embodiments, the adsorbed surfactant molecules 1107 and 1109 form a surfactant layer on the surface of the metallic layer 1101.

In some embodiments, the surfactant soaking process described above with reference to FIGS. 11A and 11B is performed using a single soaking module (such as, for example, the soaking module 403 or 405 of the apparatus 400 illustrated in FIG. 4). In other embodiments, the process steps described above with reference to FIG. 11A is performed using a first soaking module (such as, for example, the soaking module 403 of the apparatus 400 illustrated in FIG. 4) and the process steps described above with reference to FIG. 11B is performed using a second soaking module (such as, for example, the soaking module 405 of the apparatus 400 illustrated in FIG. 4).

Figure 12A:
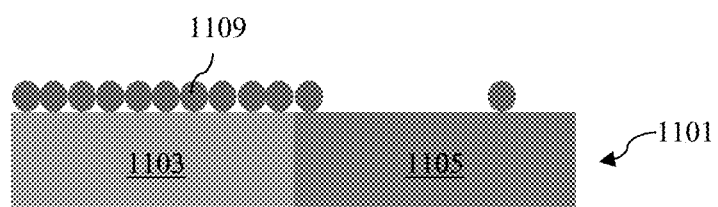
Figure 12B:
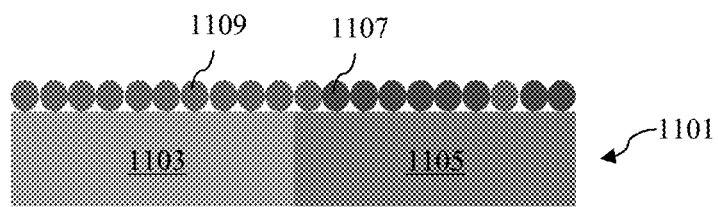

FIGS. 12A and 12B illustrate cross-sectional views of a surfactant soaking process performed on the surface of the metallic layer 1101 in accordance with some embodiments. In some embodiments, the surfactant soaking process may be performed according to the method 305 (see FIG. 3B). Referring to FIG. 12A, the surface of the metallic layer 1101 is soaked in a gas of surfactant molecules 1109. The surfactant molecules 1109 may be molecules having only nitrogen-based functional groups. The surfactant molecules 1109 are adsorbed on the surface of the metallic layer 1101, such that surfactant molecules 1109 fully cover the surface of the first metallic material 1103 and partially cover the surface of the second metallic material 1105 due to the difference in electropositivity. The surfactant molecules 1109 are adsorbed on the surface of the metallic layer 1101 through nitrogen-based functional groups (such as, for example, nitrogen-based functional groups 711 illustrated in FIG. 7B).

Referring to FIG. 12B, the surface of the metallic layer 1101 is soaked in a gas of surfactant molecules 1107. The surfactant molecules 1107 may be molecules having only unsaturated carbon functional groups. The surfactant molecules 1107 are adsorbed on the surface of the metallic layer 1101, such that surfactant molecules 1107 fully cover the uncovered portions of the surface of the second metallic material 1105. The surfactant molecules 1107 are adsorbed on the surface of the metallic layer 1101 through unsaturated carbon functional groups (such as, for example, unsaturated carbon functional groups 703 illustrated in FIG. 7A). In some embodiments, the adsorbed surfactant molecules 1107 and 1109 form a surfactant layer on the surface of the metallic layer 1101.

In some embodiments when the first metallic material 1103 is made of cobalt, by soaking the metallic layer 1101 first in the surfactant molecules 1109 and subsequently in the surfactant molecules 1107, carbide formation due to bonding of cobalt and unsaturated hydrocarbons is reduced or avoided.

In some embodiments, the surfactant soaking process described above with reference to FIGS. 12A and 12B is performed using a single soaking module (such as, for example, the soaking module 403 or 405 of the apparatus 400 illustrated in FIG. 4). In other embodiments, the process steps described above with reference to FIG. 21A is performed using a first soaking module (such as, for example, the soaking module 403 of the apparatus 400 illustrated in FIG. 4) and the process steps described above with reference to FIG. 12B is performed using a second soaking module (such as, for example, the soaking module 405 of the apparatus 400 illustrated in FIG. 4).

Figure 13:
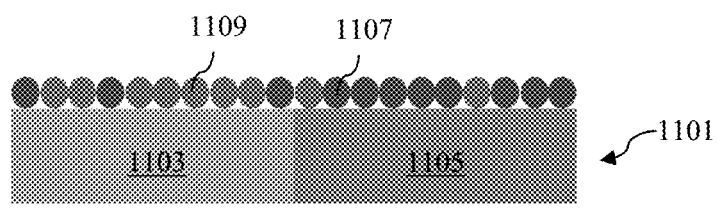

FIG. 13 illustrates a cross-sectional view of a surfactant soaking process performed on the surface of the metallic layer 1101 in accordance with some embodiments. In some embodiments, the surfactant soaking process may be performed according to the method 305 (see FIG. 3C). In some embodiments, the surface of the metallic layer 1101 is soaked in a gas comprising a mixture of surfactant molecules 1107 and 1109. The surfactant molecules 1107 and 1109 are adsorbed to the surface of the metallic layer 1101, such that the surface of the first metallic material 1103 is predominantly covered by the surfactant molecules 1109 and portions of the surface of the first metallic material 1103 not covered by the surfactant molecules 1109 are covered by the surfactant molecules 1107 due to the difference in electropositivity. Furthermore, the surface of the second metallic material 1105 is predominantly covered by the surfactant molecules 1107 and portions of the surface of the second metallic material 1105 not covered by the surfactant molecules 1107 are covered by the surfactant molecules 1109 due to the difference in electropositivity. The surfactant molecules 1107 are adsorbed on the surface of the metallic layer 1101 through unsaturated carbon functional groups (such as, for example, unsaturated carbon functional groups 703 illustrated in FIG. 7A). The surfactant molecules 1109 are adsorbed on the surface of the metallic layer 1101 through nitrogen-based functional groups (such as, for example, nitrogen-based functional groups 711 illustrated in FIG. 7B). The adsorbed surfactant molecules 1107 and 109 form a surfactant layer on the surface of the metallic layer 1101. In some embodiments, the surfactant soaking process described above with reference to FIG. 13 is performed using a single soaking module (such as, for example, the soaking module 403 or 405 of the apparatus 400 illustrated in FIG. 4).

Figure 14:
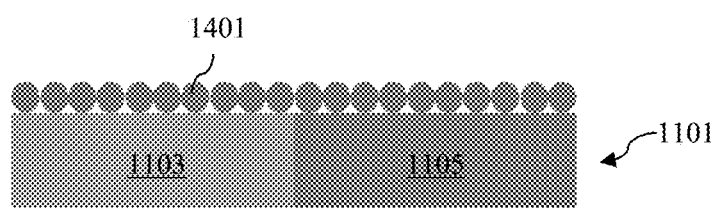

FIG. 14 illustrates a cross-sectional view of a surfactant soaking process performed on the surface of the metallic layer 1101 in accordance with some embodiments. In some embodies, the surfactant soaking process may be performed according to step 309 of the method 305 (see FIG. 3B). In some embodiments, the surface of the metallic layer 1101 is soaked in a gas of surfactant molecules 1401. The surfactant molecules 1401 may be molecules having both unsaturated carbon functional groups and nitrogen-based functional groups. The surfactant molecules 1401 are adsorbed on the surface of the metallic layer 1101, such that surfactant molecules 1401 fully cover both the surface of the first metallic material 1103 and the surface of the second metallic material 1105. The surfactant molecules 1401 are adsorbed on the surface of the first metallic material 1103 through nitrogen-based functional groups (such as, for example, nitrogen-based functional groups 711 illustrated in FIG. 7C). The surfactant molecules 1401 are adsorbed on the surface of the second metallic material 1105 through unsaturated carbon functional groups (such as, for example, unsaturated carbon functional groups 703 illustrated in FIG. 7C). In some embodiments, the adsorbed surfactant molecules 1401 form a surfactant layer on the surface of the metallic layer 1101.

Figure 6:
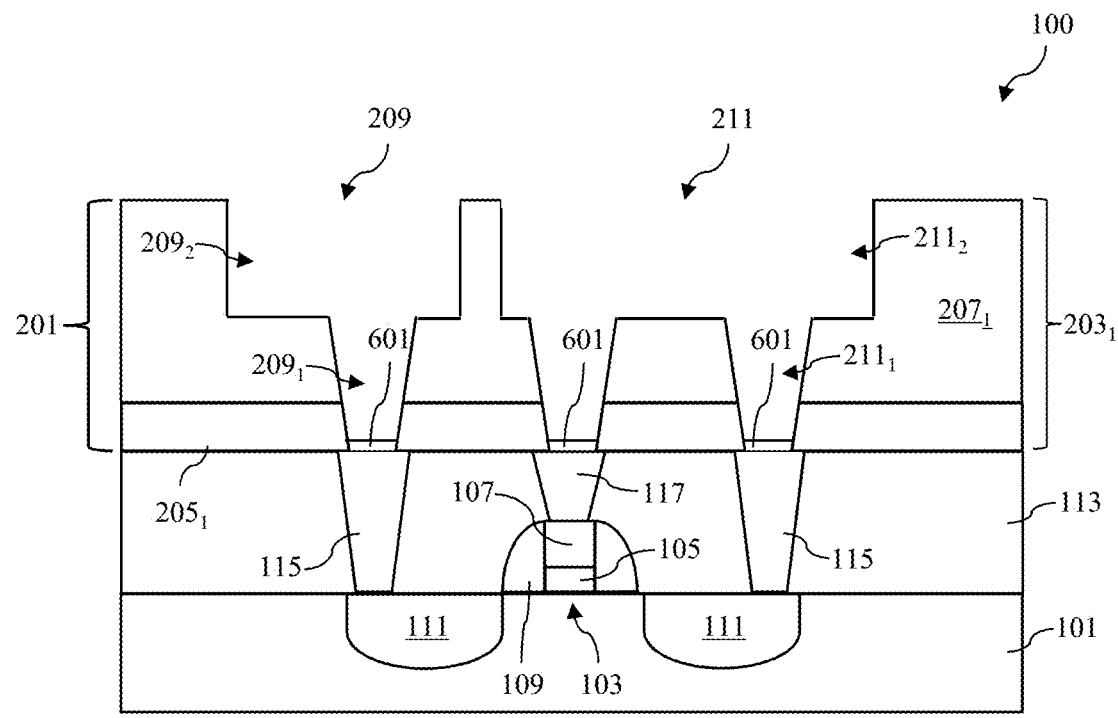
Figure 15:
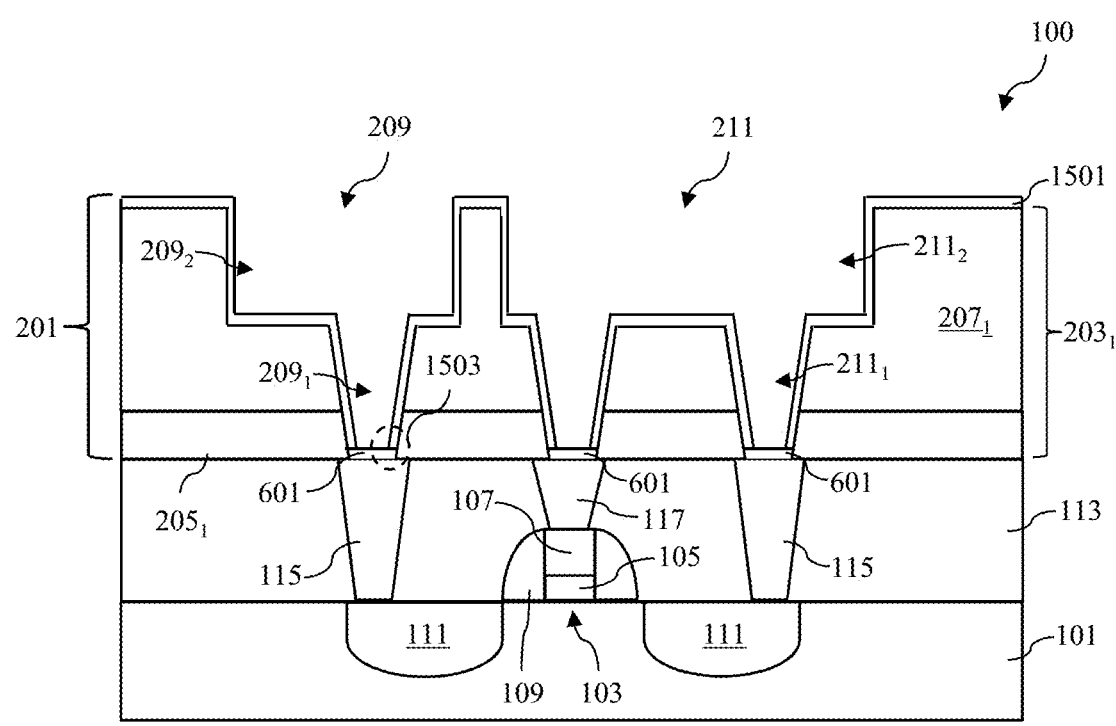

Referring to FIGS. 3A, 4 and 15, in step 307, a barrier layer 1501 is formed in the openings 209 and 211, and over the IMD layer $207_1$. The barrier layer 1501 may comprise titanium, titanium nitride, tantalum, tantalum nitride, a combination thereof, a multilayer thereof, or the like. In some embodiments, the barrier layer 1501 is deposited using an ALD process. The surfactant soaking process described above with reference to FIG. 6 alters an ALD deposition rate of the barrier layer 1501 over the top surfaces of the contact plugs 115 and 117. In some embodiments, the surfactant soaking process suppresses the ALD deposition rate of the barrier layer 1501 over the surfactant layer 601, such that the barrier layer 1501 is deposited on the exposed surfaces of the IMD layer $207_1$ and is not deposited over the top surfaces of the contact plugs 115 and 117. In some embodiments, the barrier layer 1501 may be formed using a deposition module 407 of the apparatus 400. In such embodiments, the structure of the FIG. 6 is transferred from the soaking modules 403 or 405 to the deposition module 407. In some embodiments, the barrier layer 1501 has a thickness between about 0 Å and about 20 Å.

Figure 16:
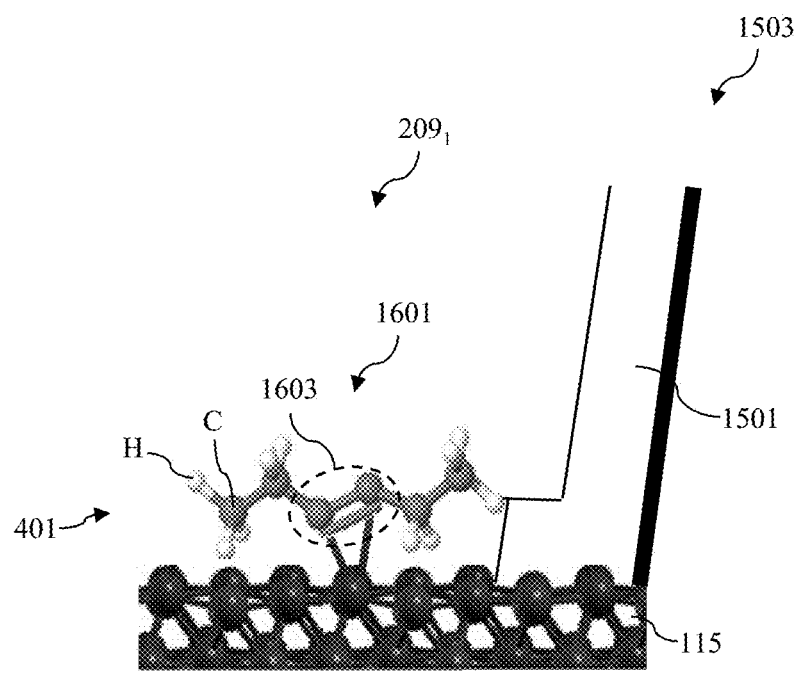

FIG. 16 illustrates a magnified view of a region 1503 of the structure shown in FIG. 15 in accordance with some embodiments. In some embodiments when the surfactant molecules are alkyne molecules 1601, the alkyne molecules 1601 are bonded to a conductive material of the contact plug 115 through alkyne moieties 1603. In some embodiments, the alkyne moieties 1603 of the alkyne molecules 1601 are bonded to conductive material of the contact plug 115 by coordinate covalent bonds. In some embodiments, the alkyne molecules 1601 are bonded to the exposed surface of the contact plug 115 such that no alkyne molecule is bonded at corners of the via opening $209_1$. In such embodiments, the barrier layer 1501 is deposited such that the barrier layer 1501 fully covers sidewalls of the via opening $209_1$ and physically contacts the top surface of the contact plug 115. In some embodiments, the barrier layer 1501 may partially extend along the top surface of the contact plug 115.

Figure 17:
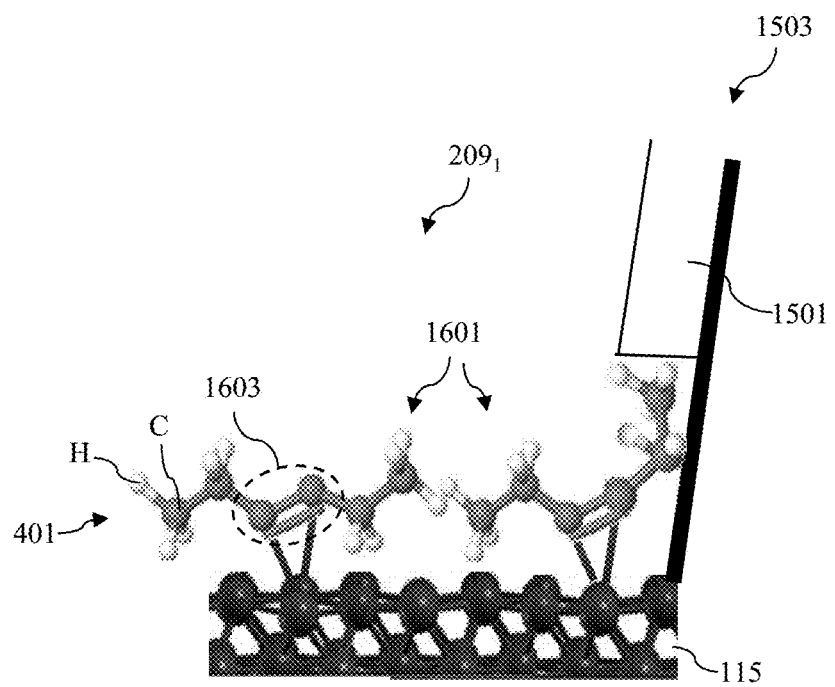

FIG. 17 illustrates a magnified view of the region 1503 of the structure shown in FIG. 15 in accordance with some embodiments. In some embodiments when the surfactant molecules are alkyne molecules 1601, the alkyne molecules 1601 are bonded to a conductive material of the contact plug 115 through alkyne moieties 1603. In some embodiments, the alkyne moieties 1603 of the alkyne molecules 1601 are bonded to conductive material of the contact plug 115 by coordinate covalent bonds. In some embodiments, the alkyne molecules 1601 are bonded to the exposed surface of the contact plug 115 such that the alkyne molecules 1601 cover corners of the via opening $209_1$. In such embodiments, the barrier layer 1501 is deposited such that the barrier layer 1501 partial covers the sidewalls of the via opening $209_1$ and does not cover the corners of the via opening $209_1$ due to the steric hindrance effect. In some embodiments, the barrier layer 1501 is not in physical contact with the top surface of the contact plug 115.

Figure 18:
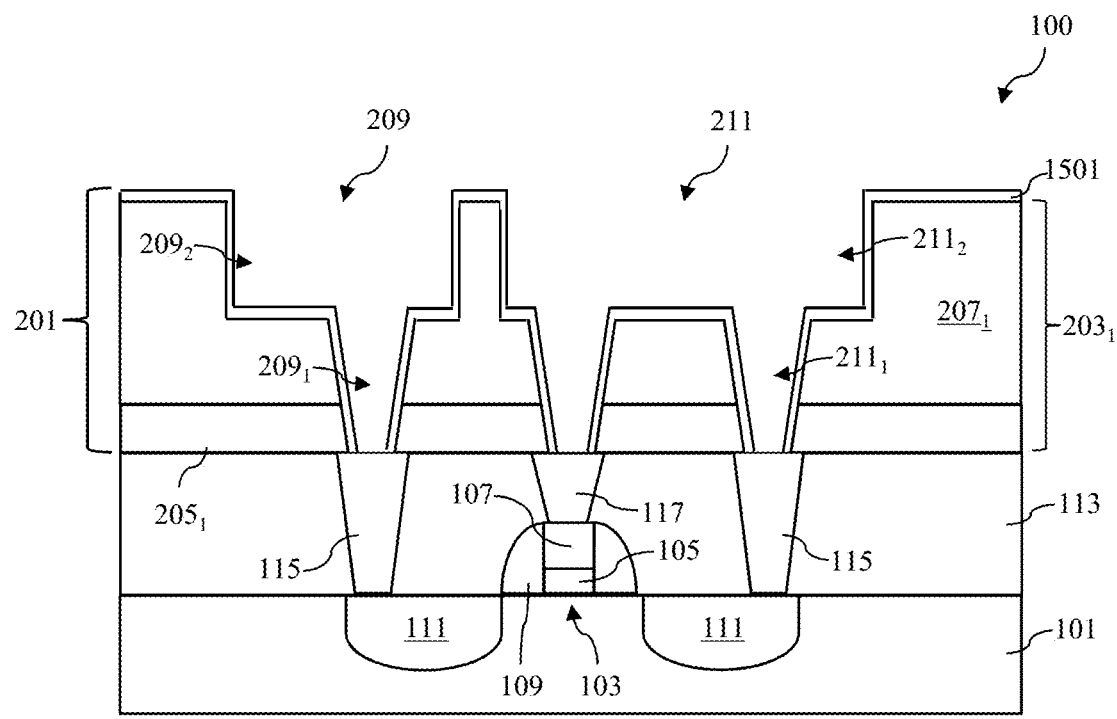

Referring to FIG. 18, in some embodiments, after forming the barrier layer 1501, a plasma process is performed on the barrier layer 1501 to densify the material of the barrier layer 1501. In some embodiments, the plasma process is an $H_2$ plasma process. In some embodiments, the $H_2$ plasma process further removes the surfactant layer 601 (see FIG. 15) and exposes the top surfaces of the contact plugs 115 and 117.

Figure 19:
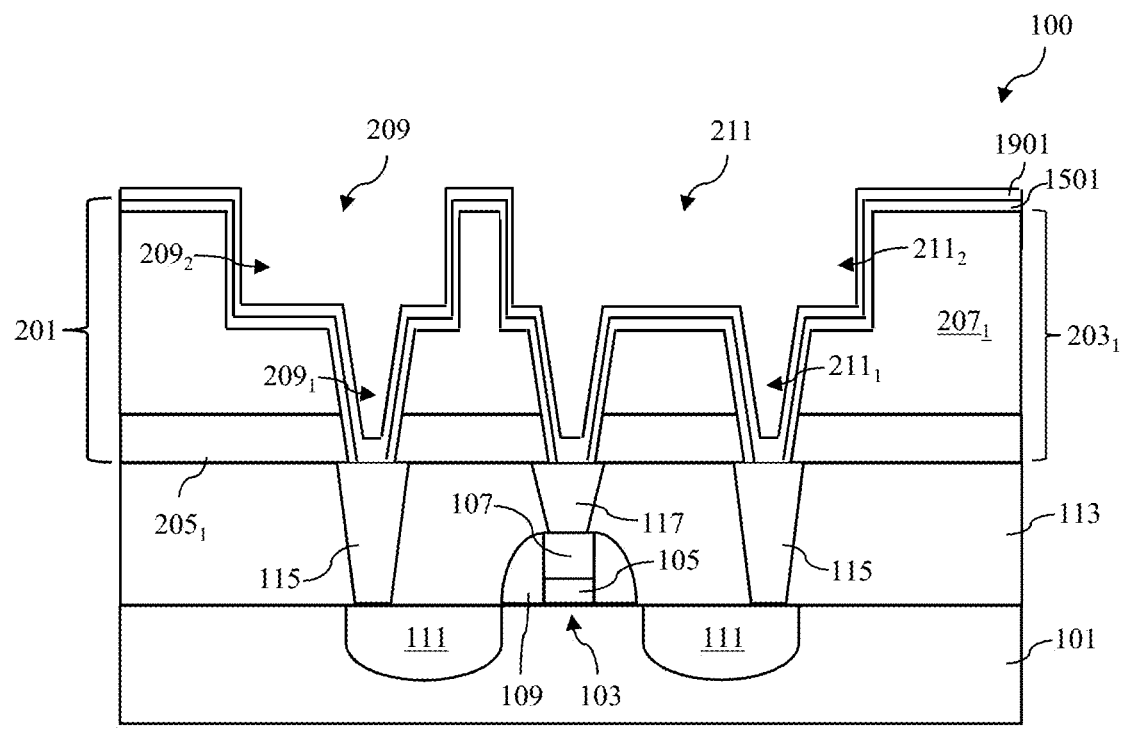

Referring to FIG. 19, an adhesion layer 1901 is formed over the barrier layer 1501 within the openings 209 and 211, and over the IMD layer $207_1$. The adhesion layer 1901 may comprise cobalt, ruthenium, an alloy thereof, a combination thereof, a multilayer thereof, or the like, and may be formed by ALD, CVD, PVD, sputtering, a combination thereof, or the like. In some embodiments, the adhesion layer 1901 may comprise a layer of cobalt, a layer of ruthenium, or a multi-layer comprising a layer of cobalt and a layer of ruthenium. The adhesion layer 1901 extends along the surfaces of the contact plugs 115 and 117. In some embodiments, the adhesion layer 1901 has a thickness between about 0 Å and about 40 Å.

Figure 20:
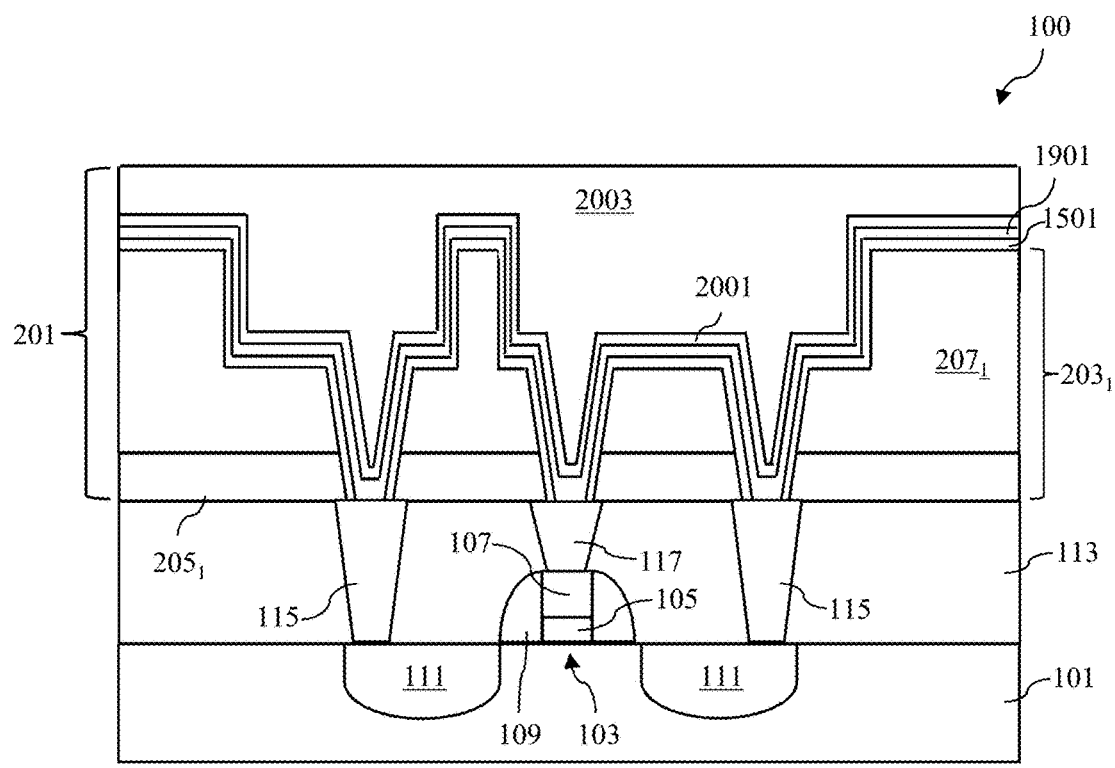

Referring to FIG. 20, a seed layer 2001 is formed over the adhesion layer 1901 within the openings 209 and 211, and over the IMD layers $207_1$. The seed layer 2001 may comprise copper, titanium, nickel, gold, manganese, a combination thereof, a multilayer thereof, or the like, and may be formed by ALD, CVD, PVD, sputtering, a combination thereof, or the like. Subsequently, a conductive layer 2003 is formed over the seed layer 2001 within the openings 209 and 211, and over the IMD layers $207_1$. In some embodiments, the conductive layer 2003 overfills the openings 209 and 211. The conductive layer 2003 may comprise copper, aluminum, tungsten, ruthenium, cobalt, combinations thereof, alloys thereof, multilayers thereof, or the like, and may be formed using, for example, plating, or other suitable methods. In some embodiments, the seed layer 2001 has a thickness between about 0 Å and about 200 Å.

Figure 21:
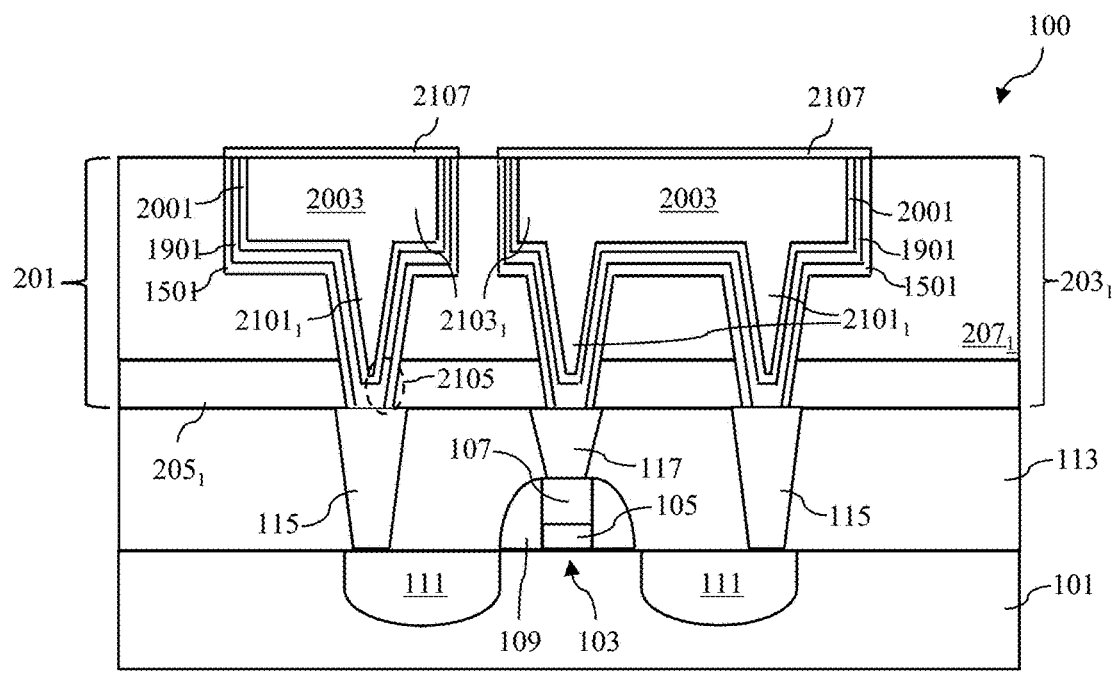

Referring to FIG. 21, portions of the barrier layer 1501, the adhesion layer 1901, the seed layer 2001, and the conductive layer 2003 overfilling the openings 209 and 211 (see, for example, FIG. 2) are removed to expose a top surface of the IMD layer $207_1$. In some embodiments, the removal process may be a planarization process comprising a CMP process, a grinding process, an etching process, a combination thereof, or the like. Remaining portions of the barrier layer 1501, the adhesion layer 1901, the seed layer 2001, and the conductive layer 2003 filling the via openings $209_1$ and $211_1$ (see, for example, FIG. 2) form conductive vias $2101_1$, and remaining portions of the barrier layer 1501, the adhesion layer 1901, the seed layer 2001, and the conductive layer 2003 filling the line openings $209_2$ and $211_2$ (see, for example, FIG. 2) form conductive lines $2103_1$. In some embodiments, topmost surfaces of the conductive lines $2103_1$ are substantially coplanar or level with a topmost surface of the IMD layer $207_1$ within process variations of the planarization process.

In some embodiments when the conductive layer 2003 comprises copper, capping layers 2107 may be selectively formed over the conductive lines $1103_1$. The capping layers 2107 may comprise cobalt, ruthenium, an alloy thereof, a combination thereof, a multilayer thereof, or the like, and may be formed by ALD, CVD, PVD, sputtering, a combination thereof, or the like. In some embodiments, each of the capping layers 2107 may comprise a layer of cobalt, a layer of ruthenium, or a multi-layer comprising a layer of cobalt and a layer of ruthenium. In some embodiments, the capping layers 2107 have a thickness between about 0 Å and about 50 Å.

Figure 22:
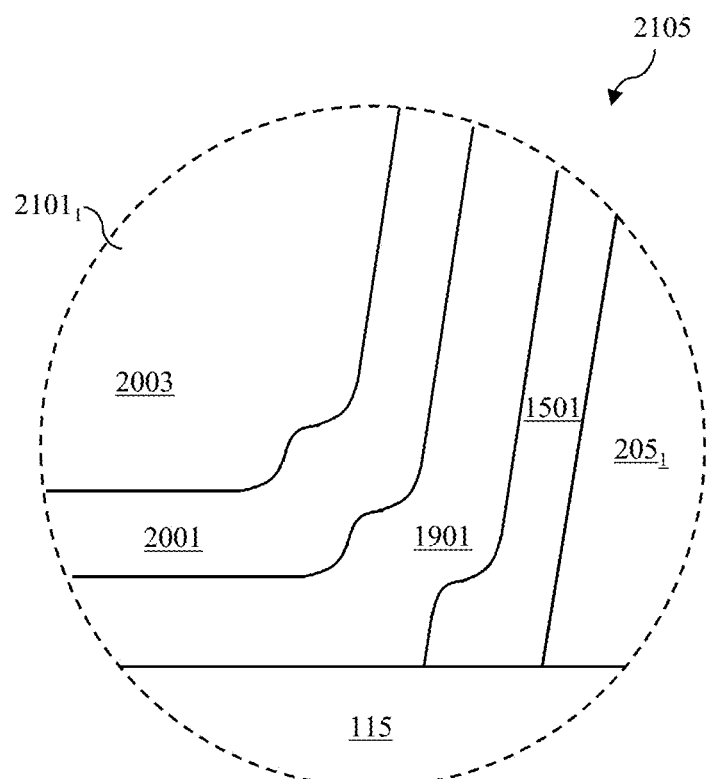

FIG. 22 illustrates a magnified view of a region 2105 of the structure shown in FIG. 21 in accordance with some embodiments. In the illustrated embodiment, the barrier layer 1501 is deposited such that the barrier layer 1501 fully covers and is in physical contact with sidewalls of the ESL $205_1$, and is in physically contact with the top surface of the contact plug 115. The barrier layer 1501 does not extend along the top surface of the contact plug 115, but covers corners formed by the sidewalls of the ESL $205_1$ and the top surface of the contact plug 115. In the illustrated embodiment, the adhesion layer 1901 extends along and is in physical contact with the top surface of the contact plug 115. By selectively depositing the barrier layer 1501 in the openings 209 and 211 (see, for example, FIG. 2), an amount (or volume) of the barrier layer 1501 within the openings 209 and 211 is reduced. As a result, a contact resistance between the conductive vias $2101_1$ and respective ones of the contact plugs 115 and 117 (see FIG. 21) is reduced.

Figure 23:
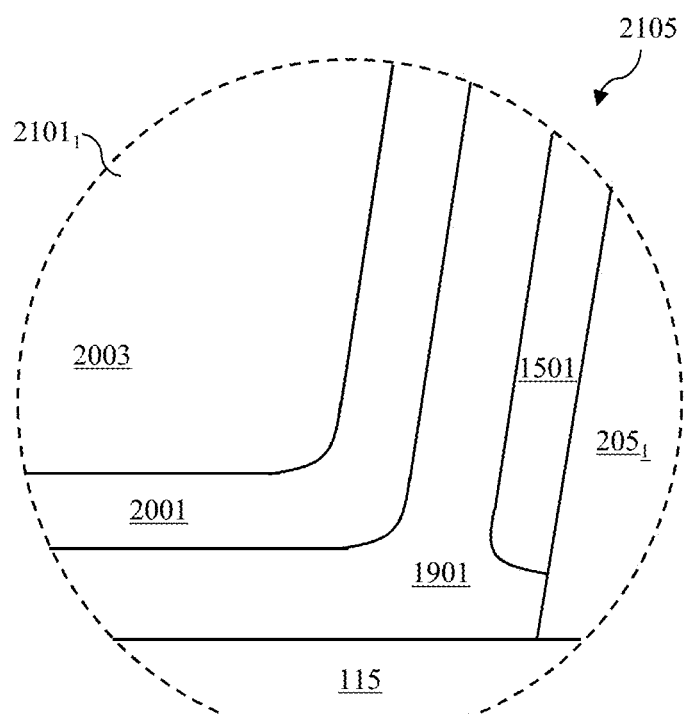

FIG. 23 illustrates a magnified view of the region 2105 of the structure shown in FIG. 21 in accordance with some embodiments. In the illustrated embodiment, the barrier layer 1501 is deposited such that the barrier layer 1501 partially covers and is in physical contact with sidewalls of the ESL $205_1$, does not extend along the top surface of the contact plug 115, and does not cover corners formed by the sidewalls of the ESL $205_1$ and the top surface of the contact plug 115. In some embodiments, the adhesion layer 1901 covers corners formed by the sidewalls of the ESL 205$_1$ and the top surface of the contact plug 115, is in physical contact with the sidewalls of the ESL 205$_1$, and extends along and is in physical contact with the top surface of the contact plug 115. By selectively depositing the barrier layer 1501 in the openings 209 and 211 (see, for example, FIG. 2), an amount (or volume) of the barrier layer 1501 within the openings 209 and 211 is reduced. As a result, a contact resistance between the conductive vias 2101$_1$ and respective ones of the contact plugs 115 and 117 (see FIG. 21) is reduced.

Figure 24:
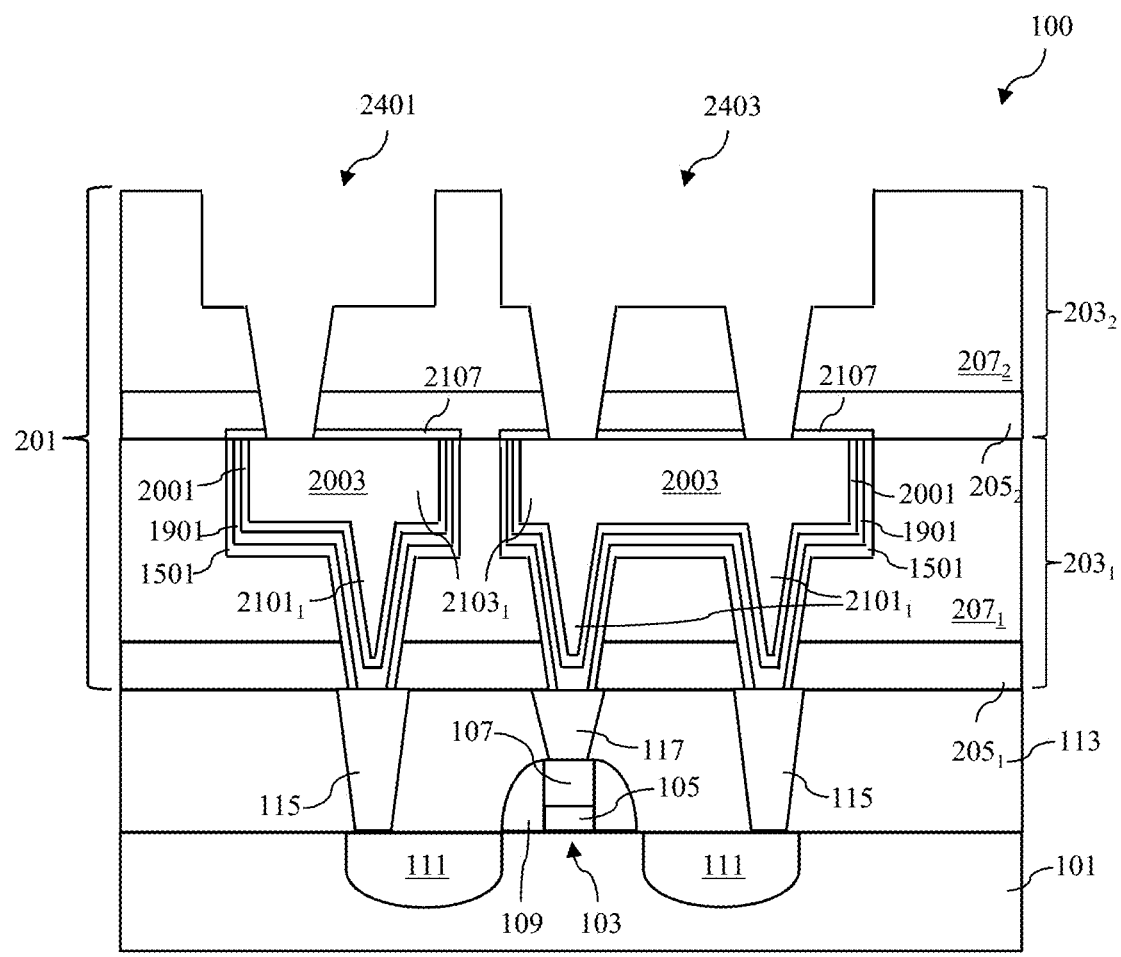
Figure 25:
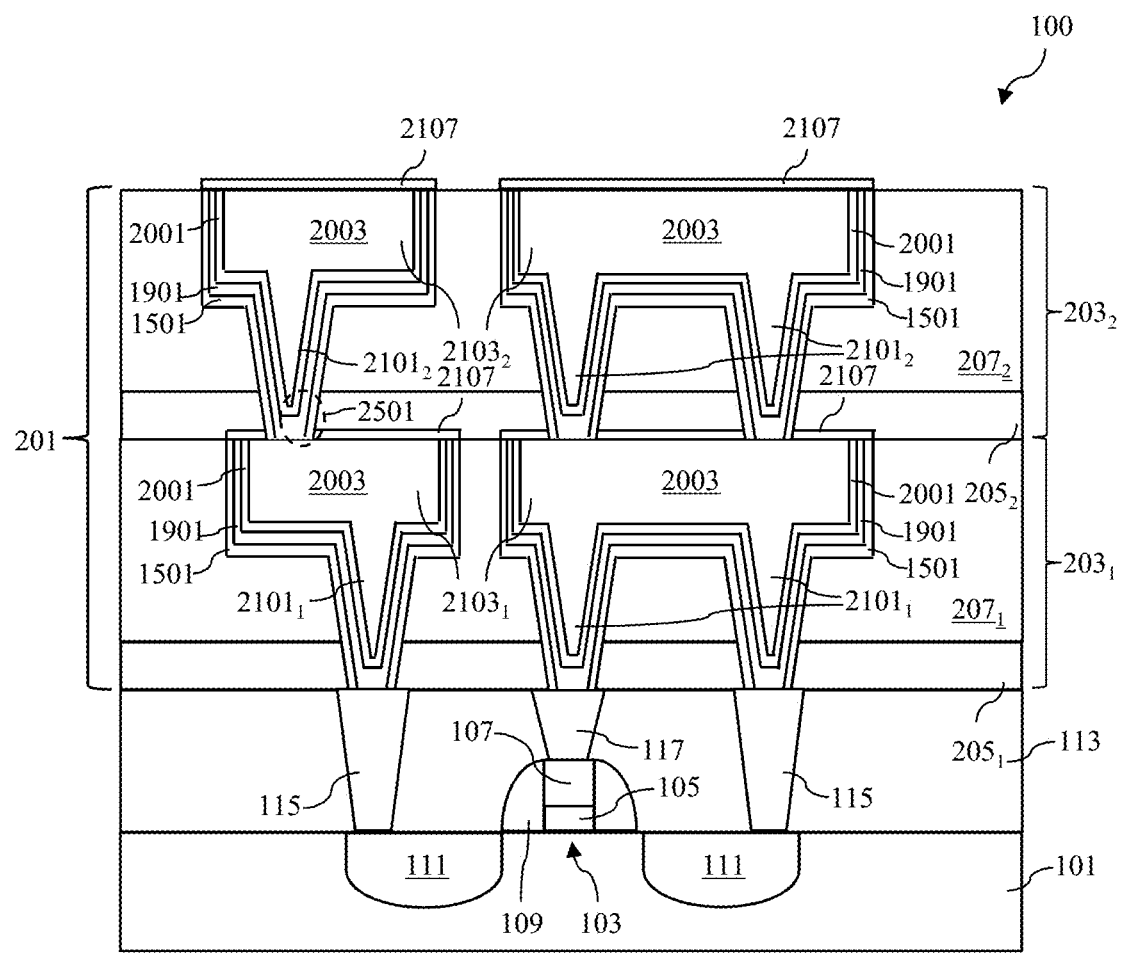

FIGS. 24 and 25 illustrate formation of a metallization layer 203$_2$ over the metallization layer 203$_1$. Referring to FIG. 24, in some embodiments, process steps for forming the metallization layer 203$_2$ start with forming an ESL 205$_2$ over the metallization layer 203$_1$. In some embodiments, the ESL 205$_2$ is formed using similar materials and methods as the ESL 205$_1$ described above with reference to FIG. 2, and the description is not repeated herein. Subsequently, an IMD layer 207$_2$ is formed over the ESL 205$_2$. In some embodiments, the IMD layer 207$_2$ is formed using similar materials and methods as the IMD layer 207$_1$ described above with reference to FIG. 2, and the description is not repeated herein.

In some embodiments, the IMD layer 207$_2$ and the ESL 205$_2$ are patterned to form opening 2401 and 2403 therein. In some embodiments, the opening 2401 and 2403 are formed in a similar manner as the openings 209 and 211 described above with reference to FIG. 2, and the description is not repeated herein. In some embodiments, the pattering process also removes portions of the capping layers 2107 exposed by the openings 2401 and 2403. In some embodiments, the portions of the capping layers 2107 exposed by the openings 2401 and 2403 are fully removed, such that the openings 2401 and 2403 expose the material of the conductive layer 2003. In other embodiments, the portions of the capping layers 2107 exposed by the opening 2401 and 2403 are partially removed, such that the openings 2401 and 2403 expose the material of the conductive layer 2003 and the material of the capping layers 2107. In some embodiments, exposed top portion of the conductive line 2103$_1$ comprises two or more metallic materials and has a structure similar to the metallic layer 1101 illustrated in FIGS. 11A, 11B, 12A, 12B, 13, and 14.

Referring to FIG. 25, interconnects, such as conductive vias 2101$_2$ and conductive lines 2103$_2$, are formed in the openings 2401 and 2402 (see FIG. 24). In some embodiments, the conductive vias 2101$_2$ and the conductive lines 2103$_2$ may have similar structures as the conductive vias 2101$_1$ and the conductive lines 2103$_1$, with similar features being labeled by similar numerical references.

In some embodiments when the portions of the capping layers 2107 exposed by the openings 2401 and 2403 are fully removed, the conductive vias 2101$_2$ and the conductive lines 2103$_2$ may be formed by: performing an oxide reduction process according to step 303 of the method 300 (see FIGS. 3A and 5), performing a surfactant soaking process according the method 305 (see FIGS. 3B and 6), with step 311 being omitted, forming the barrier layer 1501 according to process steps described above with reference to FIG. 15, and forming adhesion layer 1901, the seed layer 2001, the conductive layer 2003, and the capping layers 2107 according to process steps described above with reference to FIGS. 18-21, and the description is not repeated herein.

In some embodiments when the portions of the capping layers 2107 exposed by the openings 2401 and 2403 are partially removed, the conductive vias 1101$_2$ and the conductive lines 1103$_2$ may be formed by: performing an oxide reduction process according to step 303 of the method 300 (see FIGS. 3A and 5), performing a surfactant soaking process, forming the barrier layer 1501 according to process steps described above with reference to FIG. 15, and forming adhesion layer 1901, the seed layer 2001, the conductive layer 2003, and the capping layers 2107 according to process steps described above with reference to FIGS. 18-21, and the description is not repeated herein. In some embodiments, the surfactant soaking process is performed according to the method 305 as described above with reference to FIGS. 3B, 4, 11A, and 11B, and the description is not repeated herein. In some embodiments, the surfactant soaking process is performed according to the method 305 as described above with reference to FIGS. 3B, 4, 12A, and 12B, and the description is not repeated herein. In some embodiments, the surfactant soaking process is performed according to the method 305 as described above with reference to FIGS. 3C, 4, and 13, and the description is not repeated herein. In some embodiments, the surfactant soaking process is performed according to the method 305 as described above with reference to FIGS. 3B, 4, and 14, and the description is not repeated herein.

Figure 26:
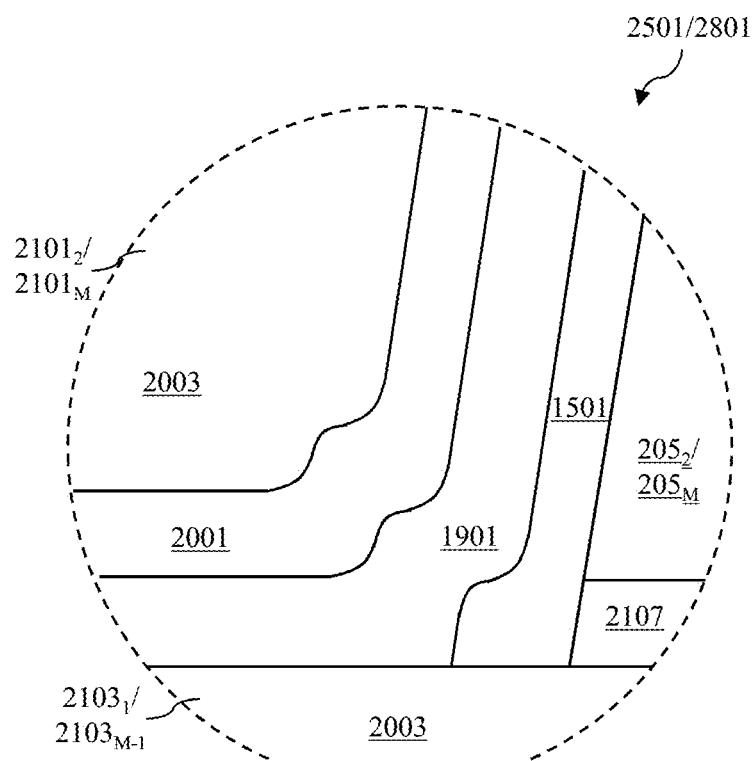

FIG. 26 illustrates a magnified view of a region 2501 of the structure shown in FIG. 25 in accordance with some embodiments. In the illustrated embodiment, the barrier layer 1501 is deposited such that the barrier layer 1501 fully covers and is in physical contact with sidewalls of the ESL 205$_2$ and the capping layer 2107, and is in physically contact with the top surface of the conductive layer 2003 of the conductive line 2103$_1$. The barrier layer 1501 does not extend along the top surface of the conductive layer 2003 of the conductive line 2103$_1$, but covers corners formed by the sidewalls of the capping layer 2107 and the top surface of the conductive layer 2003 of the conductive line 2103$_1$. In the illustrated embodiment, the adhesion layer 1901 extends along and is in physical contact with the top surface of the conductive layer 2003 of the conductive line 2103$_1$. By selectively depositing the barrier layer 1501 in the openings within the ESL 205$_2$ and the IMD layer 207$_2$, an amount (or volume) of the barrier layer 1501 within the openings is reduced. As a result, a contact resistance between the conductive vias 2101$_2$ and respective conductive lines 2103$_1$ is reduced.

Figure 27:
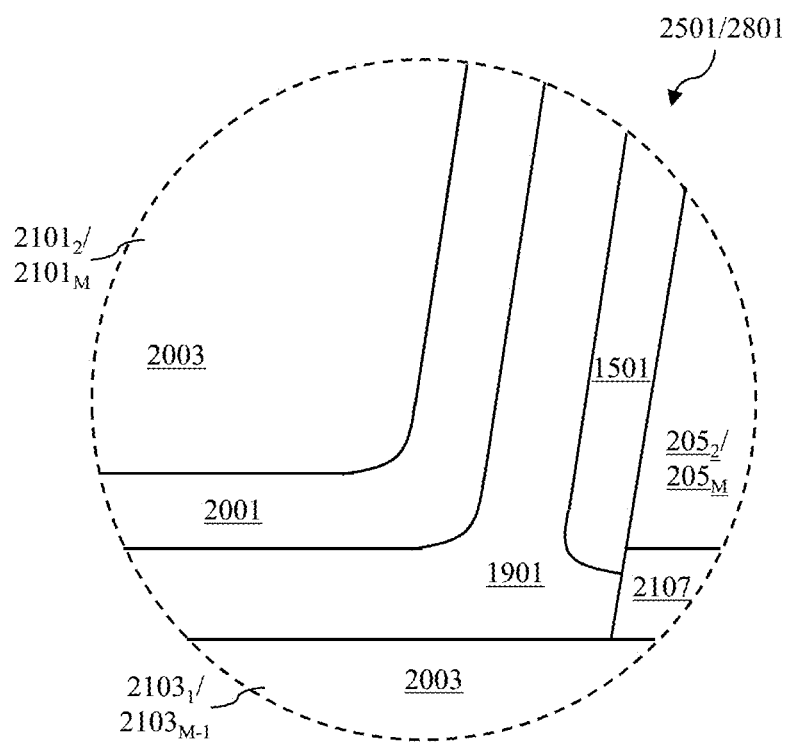

FIG. 27 illustrates a magnified view of the region 2501 of the structure shown in FIG. 25 in accordance with some embodiments. In the illustrated embodiment, the barrier layer 1501 is deposited such that the barrier layer 1501 does not extend along the top surface of the conductive layer 2003 of the conductive line 2103$_1$, fully covers and is in physical contact with sidewalls of the ESL 205$_2$, partially covers and is in physical contact with sidewalls of the capping layer 2107, and does not cover corners formed by the sidewalls of the capping layer 2107 and the top surface of the conductive layer 2003 of the conductive line 2103$_1$. In some embodiments, the adhesion layer 1901 covers corners formed by the sidewalls of the capping layer 2107 and the top surface of the conductive layer 2003 of the conductive line 2103$_1$, is in physical contact with the sidewalls of the capping layer 2107, and extends along and is in physical contact with the top surface of the conductive layer 2003 of the conductive line 2103$_1$. By selectively depositing the barrier layer 1501 in the openings within the ESL 205$_2$ and the IMD layer 207$_2$, an amount (or volume) of the barrier layer 1501 within the openings is reduced. As a result, a contact resistance between the conductive vias 2101$_2$ and respective conductive lines 2103$_1$ is reduced.

Figure 28:
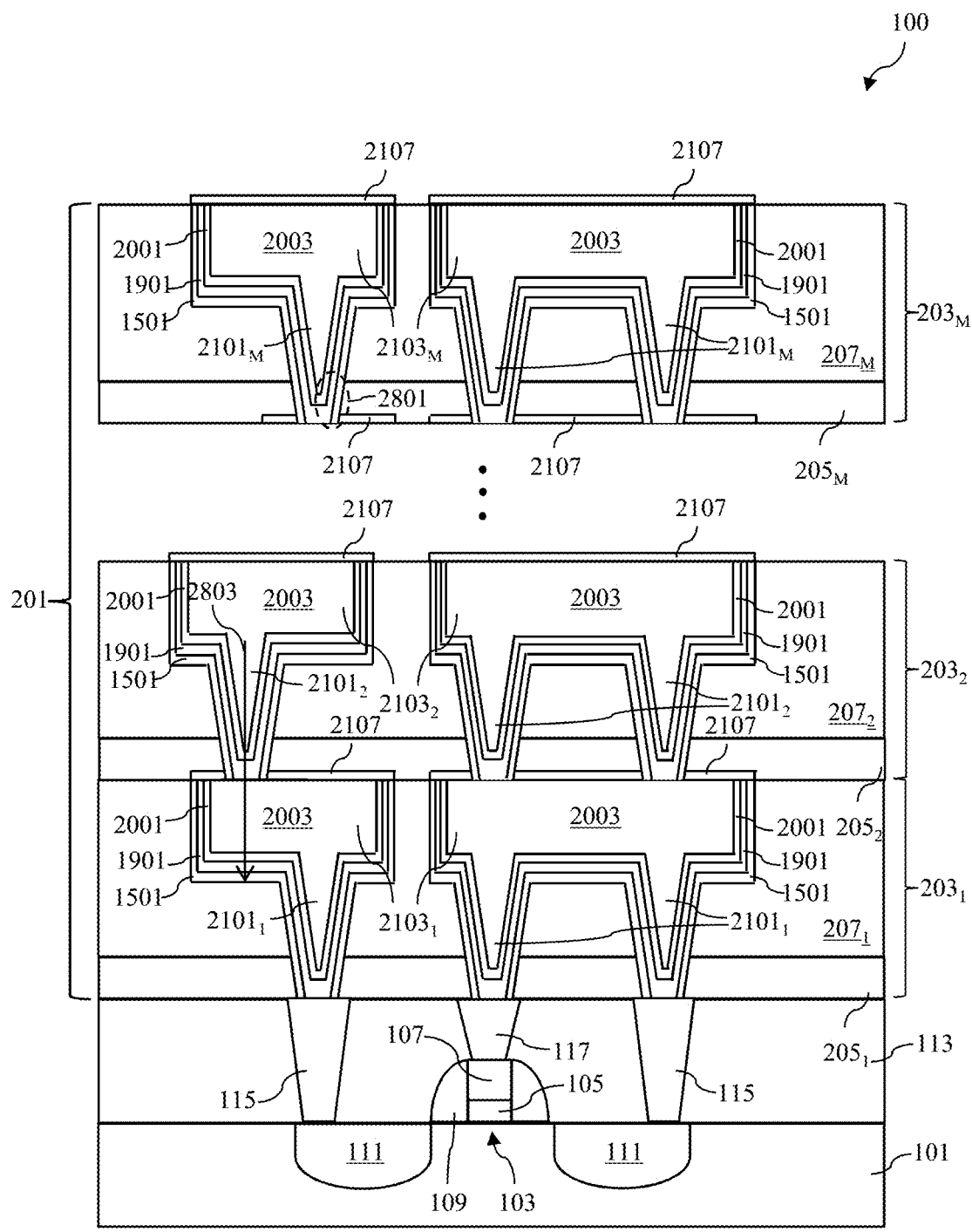

Referring to FIG. 28, one or more metallization layers are formed over the metallization layer $203_2$, until a metallization layer $203_M$ is formed. In some embodiments, the metallization layer $203_M$ is the final metallization layer of the interconnect structure 201. In some embodiments, M may be between 1 and 5. In some embodiments, the intermediated metallization layers between the metallization layer $203_2$ and the metallization layer $203_M$ are formed in a similar manner as the metallization layer $203_1$ and the description is not repeated herein. In other embodiments, the metallization layer $203_M$ is not the final metallization layer of the interconnect structure 201 and additional metallization layers are formed over the metallization layer $203_M$.

In some embodiments, process steps for forming the metallization layer $203_M$ start with forming an ESL $205_M$ over a previous metallization layer. In some embodiments, the ESL $205_M$ is formed using similar materials and methods as the ESL $205_1$ described above with reference to FIG. 2, and the description is not repeated herein. Subsequently, an IMD layer $207_M$ is formed over the ESL $205_M$. In some embodiments, the IMD layer $207_M$ is formed using similar materials and methods as the IMD layer $207_1$ described above with reference to FIG. 2, and the description is not repeated herein.

In some embodiments, interconnects, such as conductive vias $1101_M$ and conductive lines $1103_M$, are formed in the IMD layer $207_M$ and the ESL $205_M$. In some embodiments, the conductive vias $1101_M$ and the conductive lines $1103_M$ may have similar structures as the conductive vias $1101_2$ and the conductive lines $1103_2$, with similar features being labeled by similar numerical references. In some embodiments, the conductive vias $1101_M$ and the conductive lines $1103_M$ may be formed using process steps as described above with reference to FIGS. 24 and 25, and the description is not repeated herein.

Referring back to FIG. 26, a magnified view of a region 2801 of the structure shown in FIG. 28 is illustrated in accordance with some embodiments. In the illustrated embodiment, the barrier layer 1501 is deposited such that the barrier layer 1501 fully covers and is in physical contact with sidewalls of the ESL $205_M$ and the capping layer 2107, and is in physically contact with the top surface of the conductive layer 2003 of the conductive line $2103_{M-1}$. The barrier layer 1501 does not extend along the top surface of the conductive layer 2003 of the conductive line $2103_{M-1}$, but covers corners formed by the sidewalls of the capping layer 2107 and the top surface of the conductive layer 2003 of the conductive line $2103_{M-1}$. In the illustrated embodiment, the adhesion layer 1901 extends along and is in physical contact with the top surface of the conductive layer 2003 of the conductive line $2103_{M-1}$. By selectively depositing the barrier layer 1501 in the openings within the ESL $205_M$ and the IMD layer $207_M$, an amount (or volume) of the barrier layer 1501 within the openings is reduced. As a result, a contact resistance between the conductive vias $2101_M$ and respective conductive lines $2103_{M-1}$ is reduced.

Referring back to FIG. 27, a magnified view of the region 2801 of the structure shown in FIG. 28 is illustrated in accordance with some embodiments. In the illustrated embodiment, the barrier layer 1501 is deposited such that the barrier layer 1501 does not extend along the top surface of the conductive layer 2003 of the conductive line $2103_{M-1}$, fully covers and is in physical contact with sidewalls of the ESL $205_M$, partially covers and is in physical contact with sidewalls of the capping layer 2107, and does not cover corners formed by the sidewalls of the capping layer 2107 and the top surface of the conductive layer 2003 of the conductive line $2103_{M-1}$. In some embodiments, the adhesion layer 1901 covers corners formed by the sidewalls of the capping layer 2107 and the top surface of the conductive layer 2003 of the conductive line $2103_{M-1}$, is in physical contact with the sidewalls of the capping layer 2107, and extends along and is in physical contact with the top surface of the conductive layer 2003 of the conductive line $2103_{M-1}$. By selectively depositing the barrier layer 1501 in the openings within the ESL $205_M$ and the IMD layer $207_M$, an amount (or volume) of the barrier layer 1501 within the openings is reduced. As a result, a contact resistance between the conductive vias $2101_M$ and respective conductive lines $2103_{M-1}$ is reduced.

Figure 29:
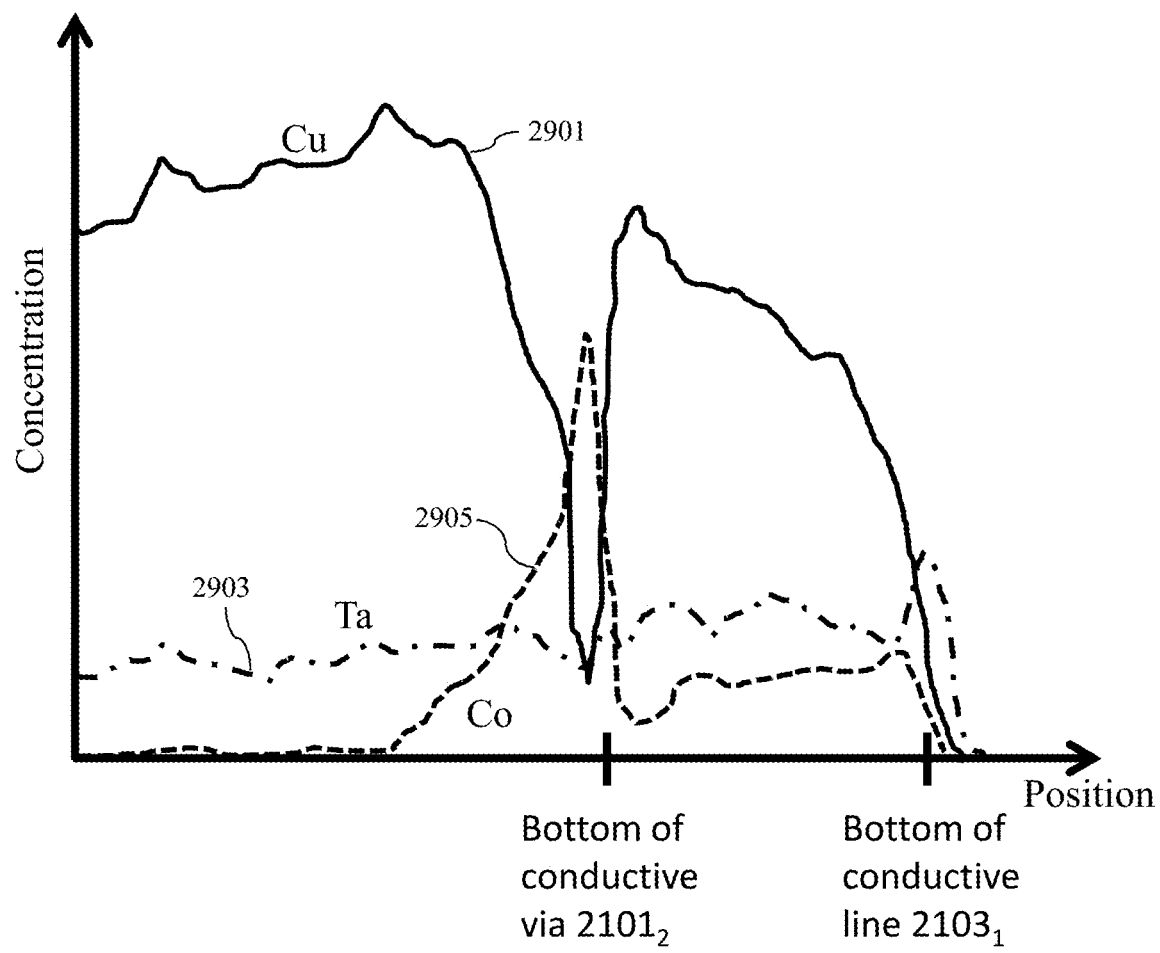
FIG. 29 illustrates concentration profiles of various elements within conductive features in accordance with some embodiments.

FIG. 29 illustrates concentration profiles of various elements within conductive via $2101_2$ and the conductive line $2103_1$ in accordance with some embodiments. In the illustrated embodiment, the concentration profiles of various elements are illustrated along a line 2803 illustrated in FIG. 28. In some embodiments, the concentration profiles may be determined by energy-dispersive X-ray spectroscopy (EDX), electron energy loss spectroscopy (EELS), secondary ion mass spectrometry (SIMS), or the like. In some embodiments when the barrier layer 1501 comprises tantalum nitride, the adhesion layer 1901 comprises cobalt, the seed layer 2001 comprises copper, and the conductive layer 2003 comprises copper, the solid curve 2901 illustrates the concentration profile of copper, the dash-dotted curve 2903 illustrates the concentration profile of tantalum, and the dashed curve 2905 illustrates the concentration profile of cobalt. In some embodiments, the concentration of copper dips at a bottom of the conductive via $2101_2$ and at a bottom of the conductive line $2103_1$. In some embodiments, the concentration of cobalt reaches a maximal value at the bottom of the conductive via $2101_2$. In some embodiments, the concentration of tantalum reaches a maximal value at the bottom of the conductive line $2103_1$. In some embodiments, the concentration of tantalum at the bottom of the conductive via $2101_2$ is less than the concentration of tantalum at the bottom of the conductive line $2103_1$.

Figure 30:
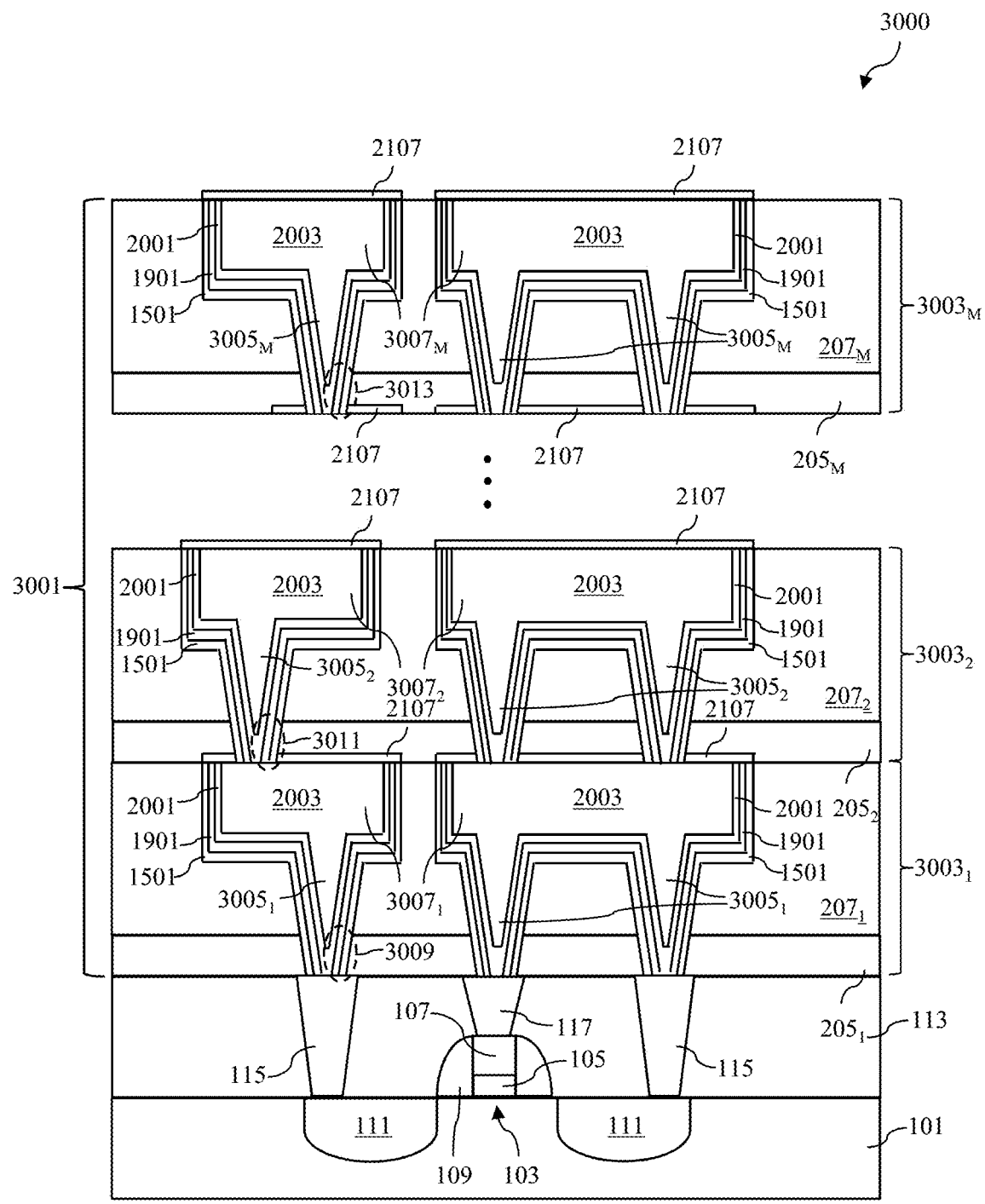
FIGS. 30-34 illustrate cross-sectional views of a semiconductor device in accordance with some embodiments.

FIG. 30 illustrates a cross-sectional view of a semiconductor device 3000 in accordance with some embodiments. In some embodiments, the semiconductor device 3000 comprises the interconnect structure 3001 having metallization layers $3003_1$ to $3003_M$, such that the metallization layers $3003_1$ to $3003_M$ comprise conductive vias $3005_1$ to $3005_M$ and conductive lines $3307_1$ to $3007_M$, respectively. The semiconductor device 3000 may be formed in a similar manner as the semiconductor device 100 (see FIG. 28), with similar features being labeled by similar numerical references. In particular, the metallization layers $3003_1$ to $3003_M$ including conductive vias $3005_1$ to $3005_M$ and conductive lines $3307_1$ to $3007_M$ may formed using process steps similar to process steps described above with reference to FIGS. 2, 3A-3C, 4-6, 7A-7C, 8-10, 11A, 11B, 12A, 12B, 13-28. In the illustrated embodiment, the process for removing the surfactant layers 601 (see FIG. 15) as described above with reference to FIG. 18 is performed after forming the adhesion layers 1901. In such embodiments, the surfactant layers 601 suppress the deposition rate of the adhesion layers 1901 over underlying conductive features (such as contact plugs 115 and 117, and conductive lines $3007_1$ to $3007_M$), such that the adhesion layers 1901 are not deposited over the underlying conductive features.

Figure 31:
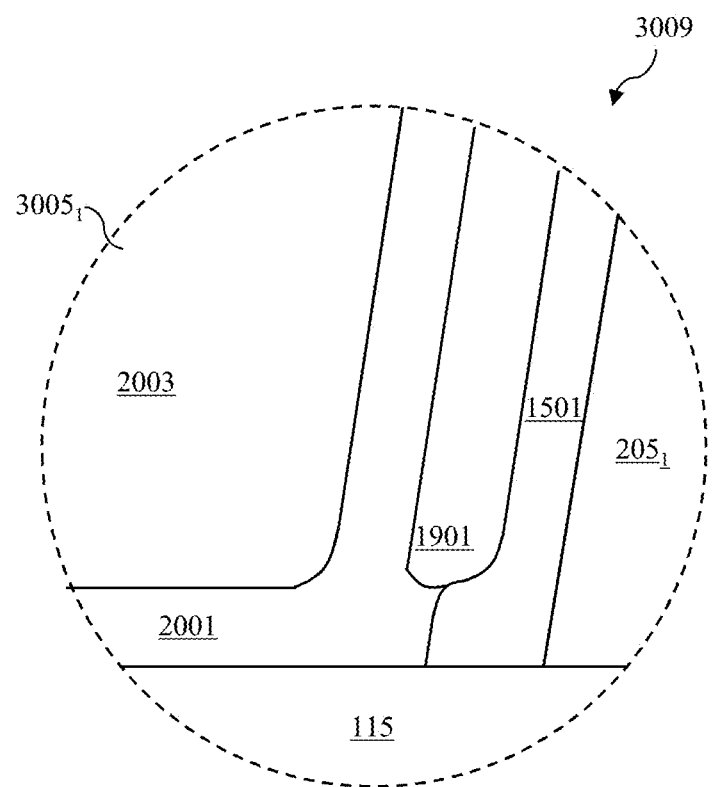

FIG. 31 illustrates a magnified view of a region 3009 of the semiconductor device 3000 (see FIG. 30) in accordance with some embodiments. The region 3009 has a similar structure as the region 2105 illustrated in FIG. 22, with the distinction that the adhesion layer 1901 does not extend along the top surface of the contact plug 115 and is not in physical contact with the top surface of the contact plug 115. In the illustrated embodiment, the seed layer 2001 extends along and is in physical contact with the top surface of the contact plug 115.

Figure 32:
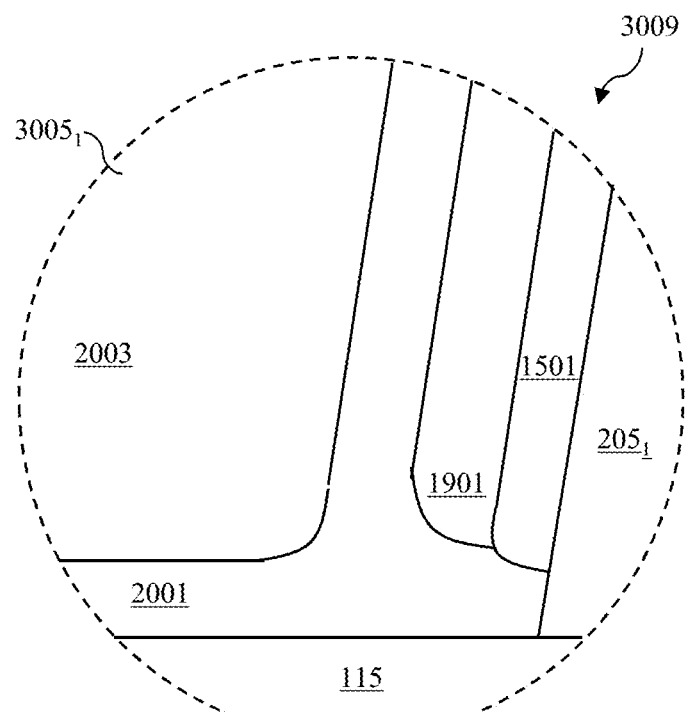

FIG. 32 illustrates a magnified view of a region 3009 of the semiconductor device 3000 (see FIG. 30) in accordance with some embodiments. The region 3009 has a similar structure as the region 2105 illustrated in FIG. 23, with the distinction that the adhesion layer 1901 does not extend along the top surface of the contact plug 115, does not cover corners formed by the sidewalls of the ESL $205_1$ and the top surface of the contact plug 115, and is not in physical contact with the sidewalls of the ESL $205_1$. In the illustrated embodiment, the seed layer 2001 covers corners formed by the sidewalls of the ESL $205_1$ and the top surface of the contact plug 115, is in physical contact with the sidewalls of the ESL $205_1$, and extends along and is in physical contact with the top surface of the contact plug 115.

Figure 33:
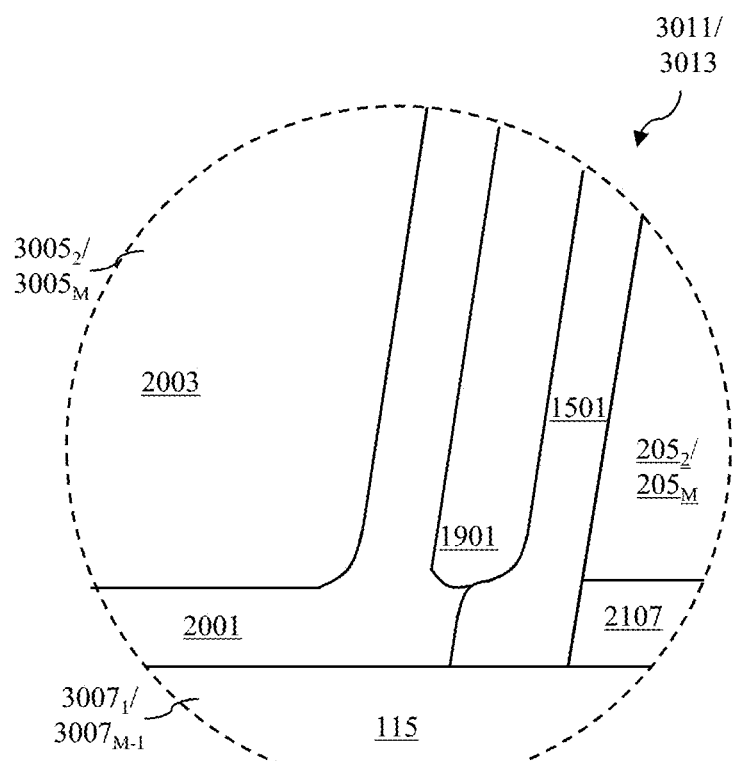

FIG. 33 illustrates magnified views of regions 3011 and 3013 of the semiconductor device 3000 (see FIG. 30) in accordance with some embodiments. The region 3011 has a similar structure as the region 2501 illustrated in FIG. 26, with the distinction that the adhesion layer 1901 does not extend along the top surface of the conductive layer 2003 of the conductive line $3007_1$ and is not in physical contact with the top surface of the conductive layer 2003 of the conductive line $3007_1$. In the illustrated embodiment, the seed layer 2001 extends along and is in physical contact with the top surface of the conductive layer 2003 of the conductive line $3007_1$.

The region 3013 has a similar structure as the region 2801 illustrated in FIG. 26, with the distinction that the adhesion layer 1901 does not extend along the top surface of the conductive layer 2003 of the conductive line $3007_{M-1}$ and is not in physical contact with the top surface of the conductive layer 2003 of the conductive line $3007_{M-1}$. In the illustrated embodiment, the seed layer 2001 extends along and is in physical contact with the top surface of the conductive layer 2003 of the conductive line $3007_{M-1}$.

Figure 34:
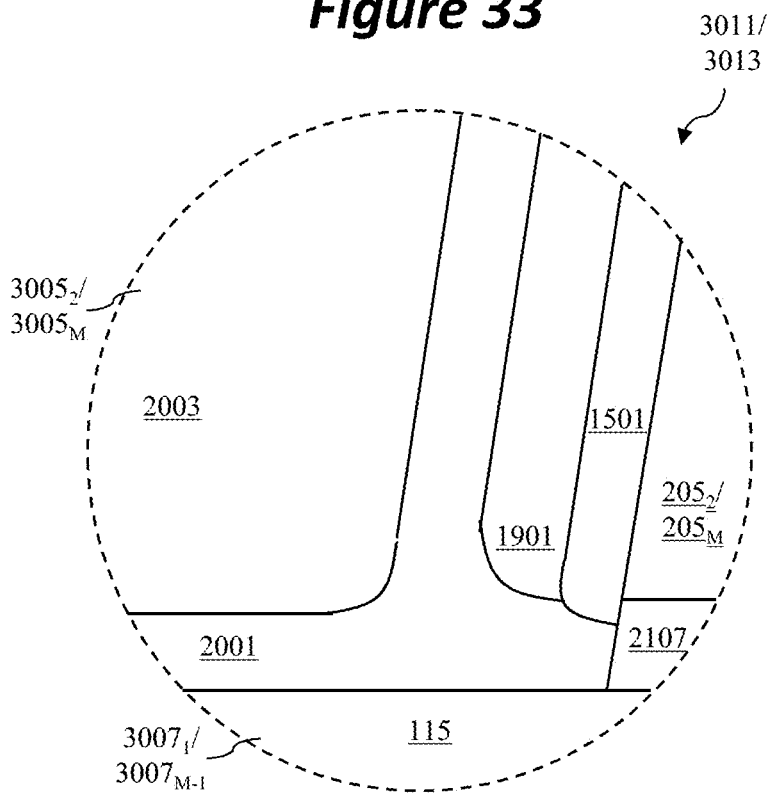

FIG. 34 illustrates magnified views of regions 3011 and 3013 of the semiconductor device 3000 (see FIG. 30) in accordance with some embodiments. The region 3011 has a similar structure as the region 2501 illustrated in FIG. 27, with the distinction that the adhesion layer 1901 does not extend along the top surface of the conductive layer 2003 of the conductive line $3007_1$, does not cover corners formed by the sidewalls of the capping layer 2107 and the top surface of the conductive layer 2003 of the conductive line $3007_1$, and is not in physical contact with the sidewalls of the capping layer 2107. In the illustrated embodiment, the seed layer 2001 covers corners formed by the sidewalls of the capping layer 2107 and the top surface of the conductive layer 2003 of the conductive line $3007_1$, is in physical contact with the sidewalls of the capping layer 2107, and extends along and is in physical contact with the top surface of the conductive layer 2003 of the conductive line $3007_1$.

The region 3013 has a similar structure as the region 2801 illustrated in FIG. 27, with the distinction that the adhesion layer 1901 does not extend along the top surface of the conductive layer 2003 of the conductive line $3007_{M-1}$, does not cover corners formed by the sidewalls of the capping layer 2107 and the top surface of the conductive layer 2003 of the conductive line $3007_{M-1}$, and is not in physical contact with the sidewalls of the capping layer 2107. In the illustrated embodiment, the seed layer 2001 covers corners formed by the sidewalls of the capping layer 2107 and the top surface of the conductive layer 2003 of the conductive line $3007_{M-1}$, is in physical contact with the sidewalls of the capping layer 2107, and extends along and is in physical contact with the top surface of the conductive layer 2003 of the conductive line $3007_{M-1}$.

Figure 35:
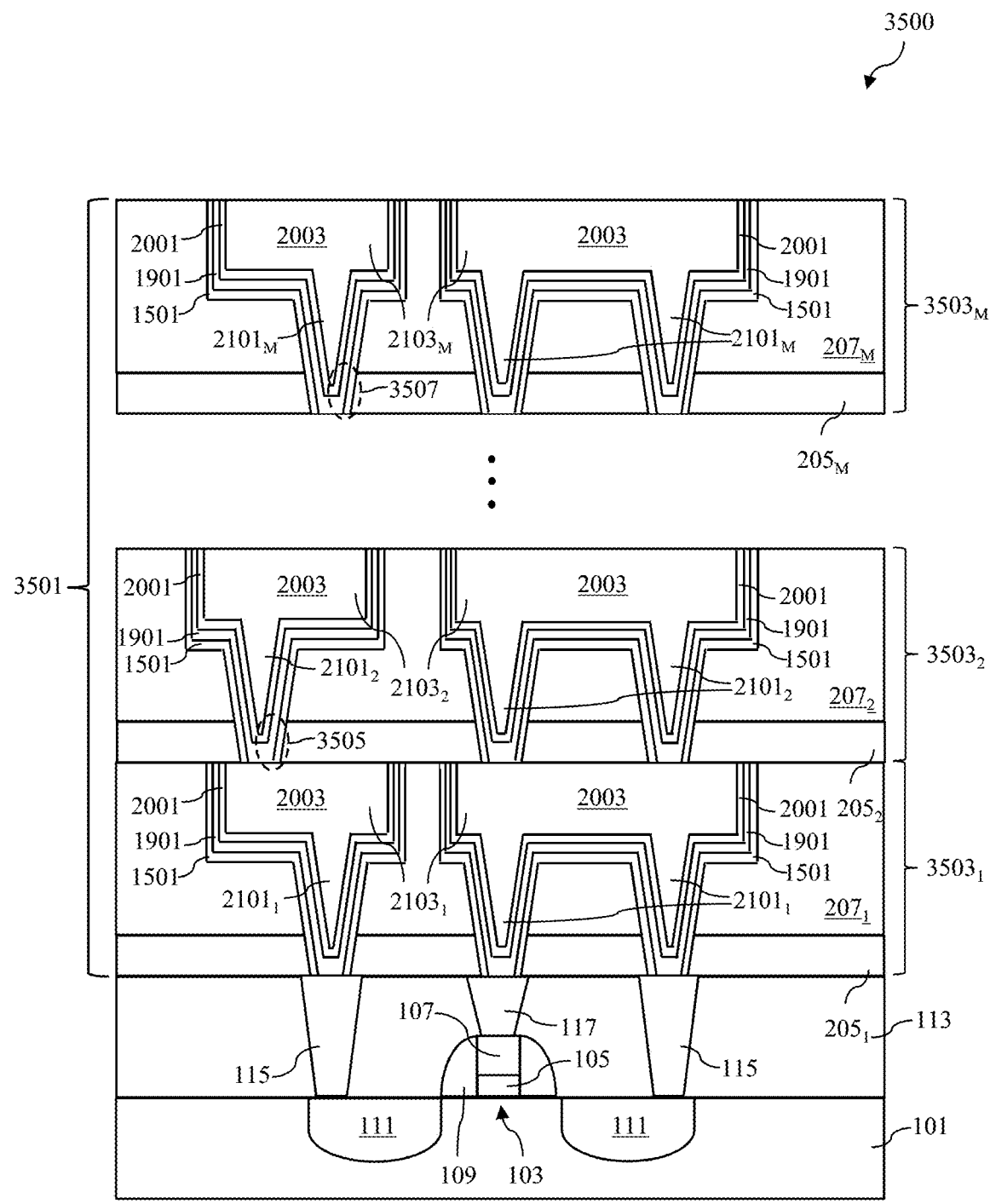
FIGS. 35-37 illustrate cross-sectional views of a semiconductor device in accordance with some embodiments.

FIG. 35 illustrates a cross-sectional view of a semiconductor device 3500 in accordance with some embodiments. In some embodiments, the semiconductor device 3500 comprises the interconnect structure 3501 having metallization layers $3503_1$ to $3503_M$, such that the metallization layers $3503_1$ to $3503_M$ comprise conductive vias $2101_1$ to $2101_M$ and conductive lines $2103_1$ to $2103_M$, respectively. The semiconductor device 3500 may be formed in a similar manner as the semiconductor device 100 (see FIG. 28), with similar features being labeled by similar numerical references. In particular, the metallization layers $3503_1$ to $3503_M$ including conductive vias $2101_1$ to $2101_M$ and conductive lines $2103_1$ to $2103_M$ may be formed using process steps similar to process steps described above with reference to FIGS. 2, 3A-3C, 4-6, 7A-7C, 8-10, 11A, 11B, 12A, 12B, 13-28, with the distinction that the formation of the capping layers 2107 has been omitted.

Figure 36:
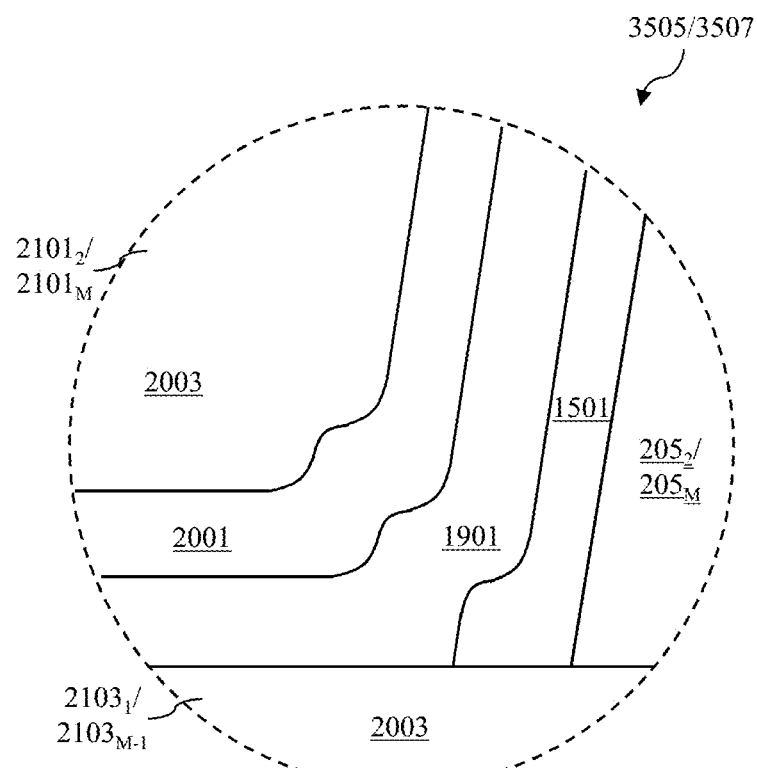

FIG. 36 illustrates magnified views of regions 3505 and 3507 of the semiconductor device 3500 (see FIG. 35) in accordance with some embodiments. The regions 3505 and 3507 have similar structures as the regions 2501 and 2801, respectively (see FIG. 26), with the distinction that the capping layer 2107 has been omitted.

Figure 37:
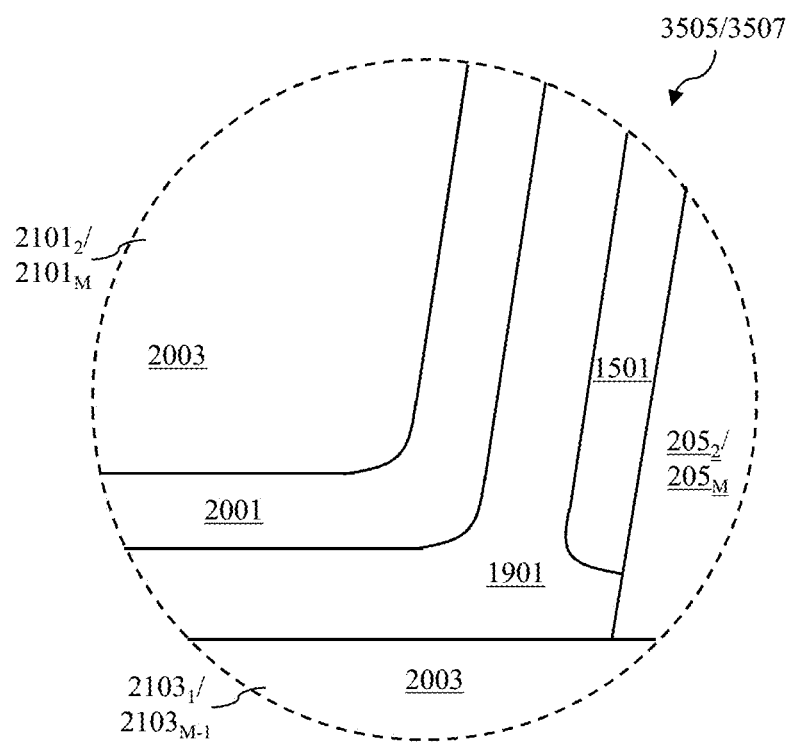

FIG. 37 illustrates magnified views of regions 3505 and 3507 of the semiconductor device 3500 (see FIG. 35) in accordance with some embodiments. The regions 3505 and 3507 have similar structures as the regions 2501 and 2801, respectively (see FIG. 27), with the distinction that the capping layer 2107 has been omitted.

Figure 38:
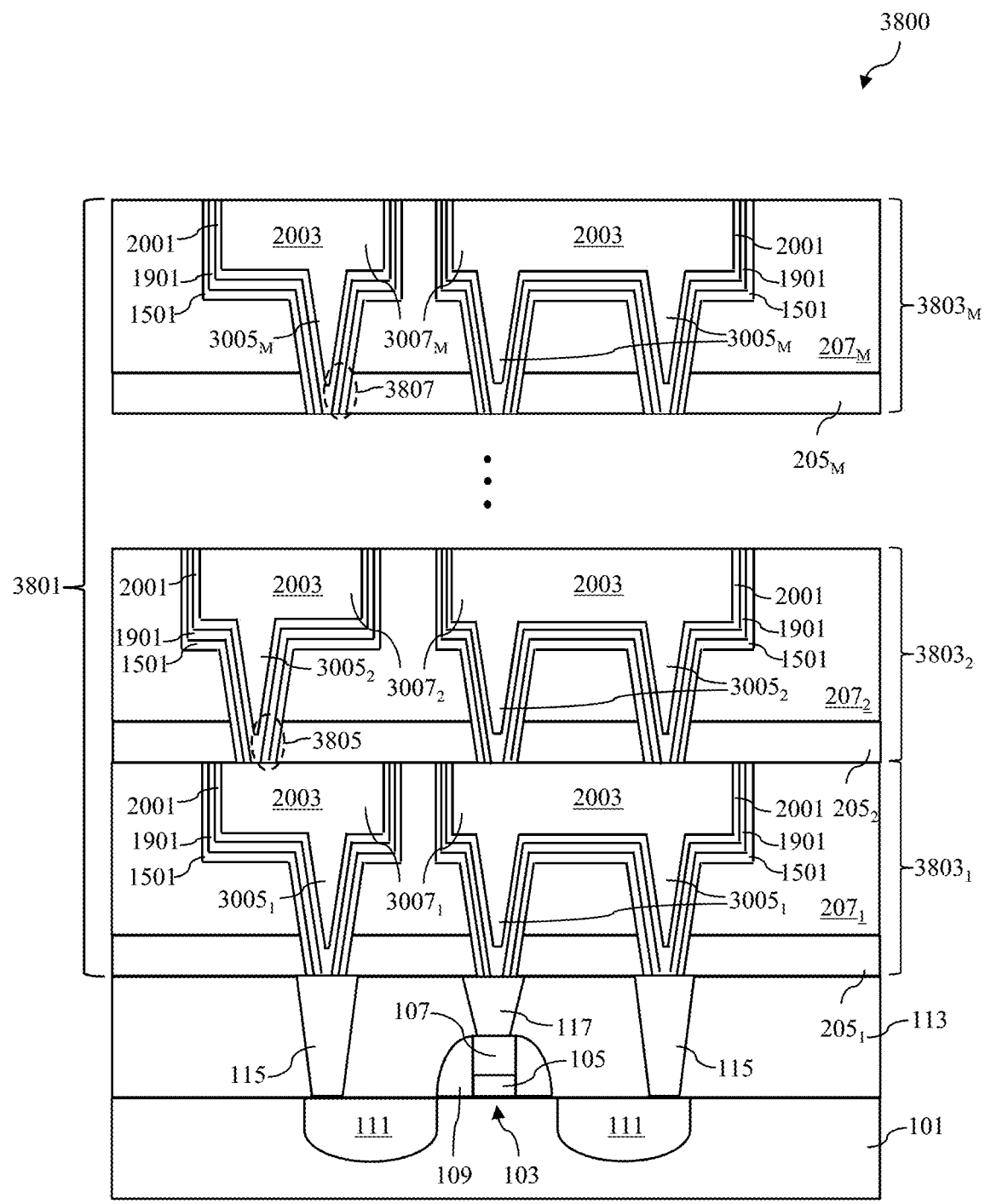
FIGS. 38-40 illustrate cross-sectional views of a semiconductor device in accordance with some embodiments.

FIG. 38 illustrates a cross-sectional view of a semiconductor device 3800 in accordance with some embodiments. In some embodiments, the semiconductor device 3800 comprises the interconnect structure 3801 having metallization layers $3803_1$ to $3803_M$, such that the metallization layers $3803_1$ to $3803_M$ comprise conductive vias $3005_1$ to $3005_M$ and conductive lines $3007_1$ to $3007_M$, respectively. The semiconductor device 3800 has a similar structure as the semiconductor device 3000 (see FIG. 30), with similar features being labeled by similar numerical references. In some embodiments, the semiconductor device 3800 may be formed using process steps similar to the process steps for forming the semiconductor device 3000 described above with reference to FIG. 30, with the distinction that the formation of the capping layers 2107 has been omitted.

Figure 39:
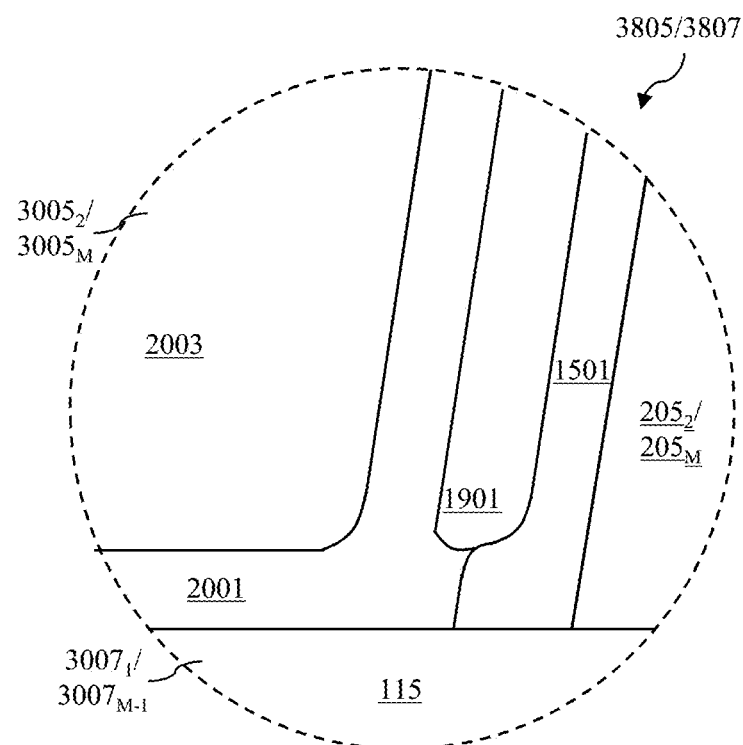

FIG. 39 illustrates magnified views of regions 3805 and 3807 of the semiconductor device 3800 (see FIG. 38) in accordance with some embodiments. The regions 3805 and 3807 have similar structures as the regions 3011 and 3013, respectively (see FIG. 33), with the distinction that the capping layer 2107 has been omitted.

Figure 40:
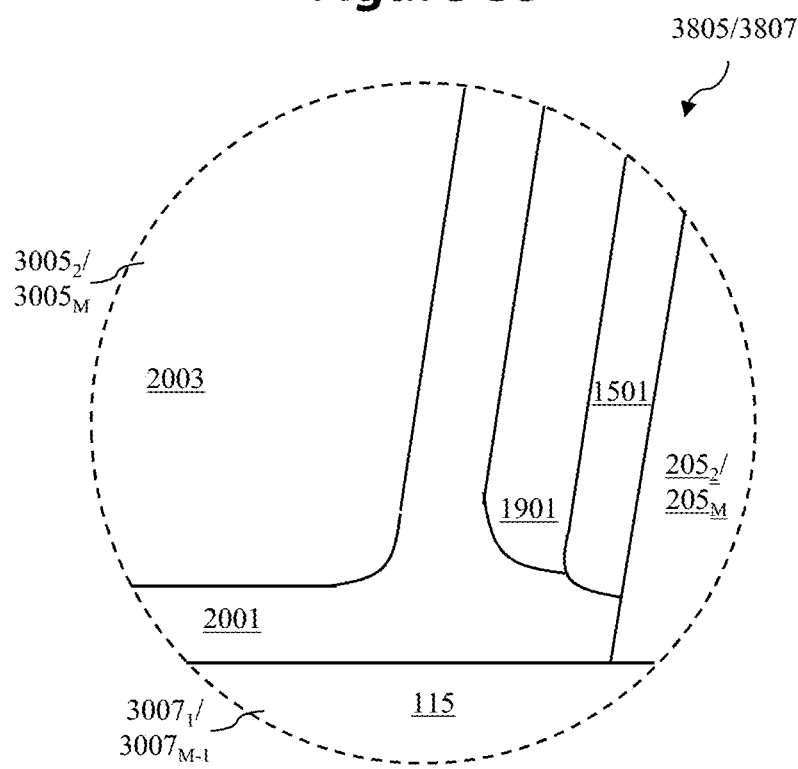

FIG. 40 illustrates magnified views of regions 3805 and 3807 of the semiconductor device 3800 (see FIG. 38) in accordance with some embodiments. The regions 3805 and 3807 have similar structures as the regions 3011 and 3013, respectively (see FIG. 34), with the distinction that the capping layer 2107 has been omitted.

Figure 41:
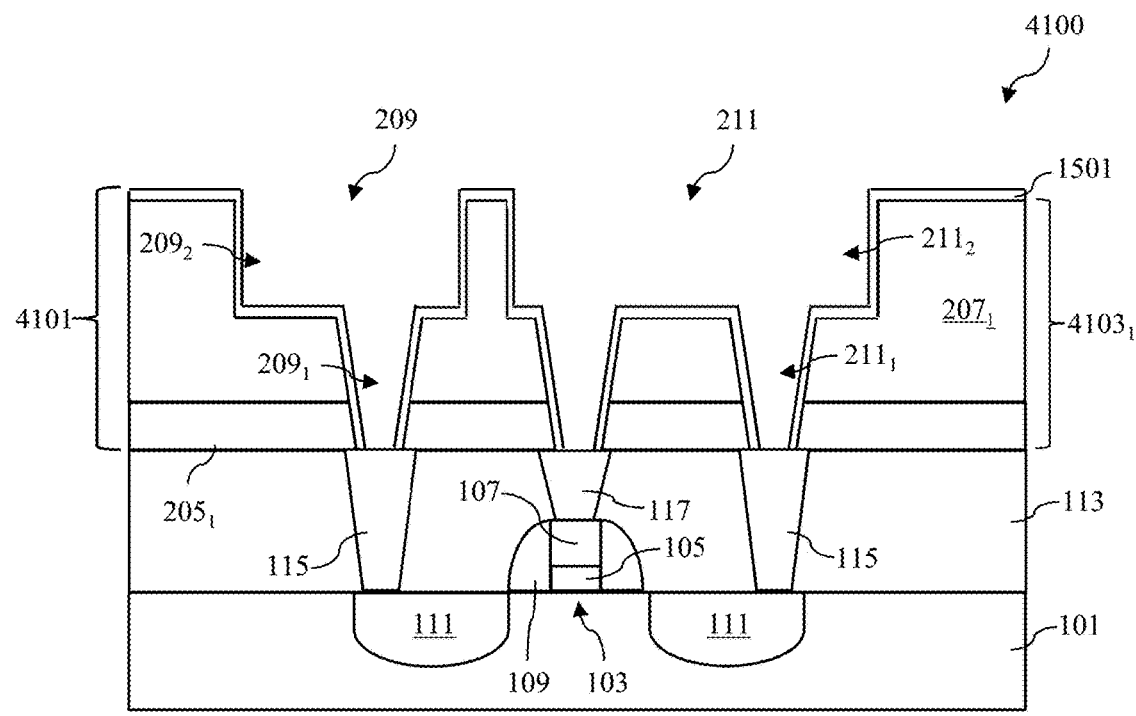
FIGS. 41-49 illustrate cross-sectional views of various intermediate stages of fabrication of a semiconductor device in accordance with some embodiments.

FIGS. 41-49 illustrate cross-sectional views of various intermediate stages of fabrication of a semiconductor device 4100 in accordance with some embodiments. In particular, FIGS. 41-49 illustrate cross-sectional views of various intermediate stages of fabrication of an interconnect structure 4101 over the structure of FIG. 1. Referring to FIG. 41, in some embodiments, the steps for forming the interconnect structure 4101 starts with forming a metallization layer $4103_1$ over the one or more ILD layers 113 and the contact plugs 115 and 117. In some embodiments, the formation of the metallization layer $4103_1$ starts with forming an ESL $205_1$ over the one or more ILD layers 113 and the contact plugs 115 and 117, and forming an IMD layer $207_1$ over the ESL $205_1$ as described above with reference to FIG. 2, and the description is not repeated herein.

In some embodiments, after forming the IMD layer $207_1$, openings 209 and 211 are formed within the IMD layer $207_1$ and the ESL $205_1$ as described above with reference to FIG. 2, and the description is not repeated herein. Subsequently, a barrier layer 1501 is formed in the openings 209 and 211 as described above with reference to FIGS. 3A-3C, 4-6, 7A-7C, 8-10, 11A, 11B, 12A, 12B, and 13-18, and the description is not repeated herein.

Figure 42:
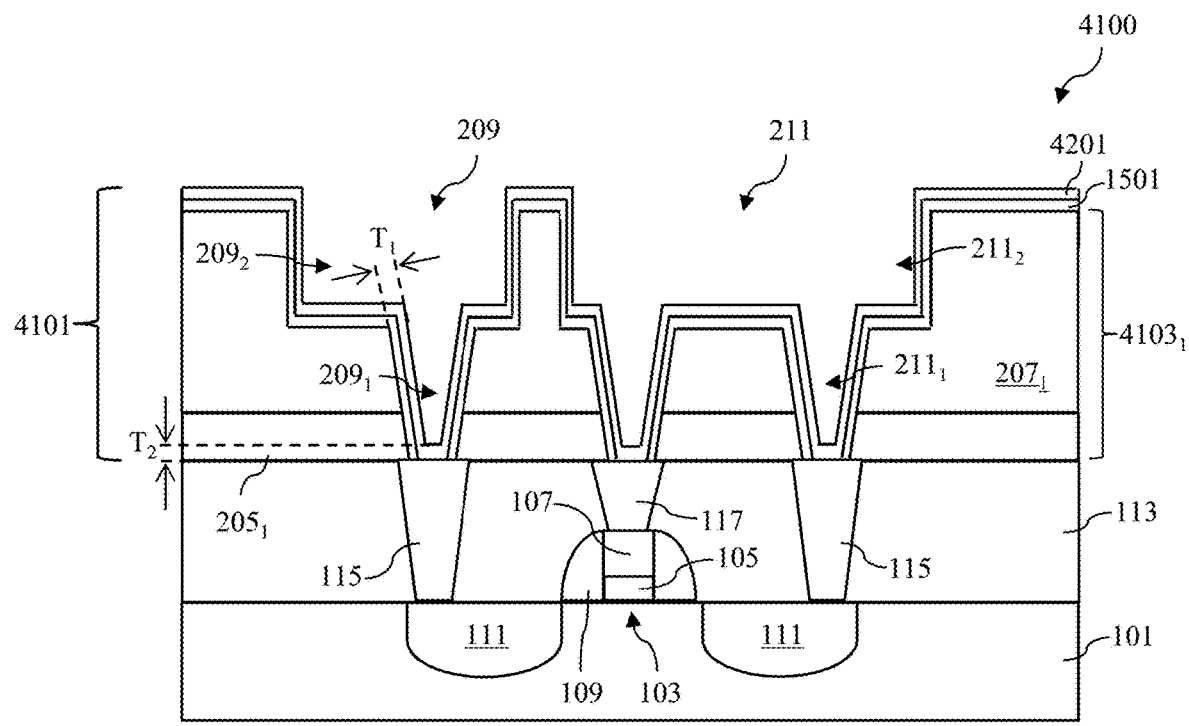

Referring to FIG. 42, a barrier layer 4201 is formed in the openings 209 and 211, and over the barrier layer 1501. The barrier layer 4201 may comprise titanium, titanium nitride, tantalum, tantalum nitride, a combination thereof, a multi-layer thereof, or the like. In some embodiments, the barrier layer 1501 and the barrier layer 4201 may comprise a same material. In other embodiments, the barrier layer 1501 and the barrier layer 4201 may comprise different materials. In some embodiments, the barrier layer 4201 has a thickness between about 0 Å and about 20 Å.

In some embodiments, the barrier layer 4201 is deposited along bottoms and sidewalls of the openings 209 and 211 using a deposition method that is unaffected by the surface modification process, which is performed before forming the barrier layer 1501 as described above with reference to FIGS. 3A-3C, 4-6, 7A-3C, 8-10, 11A, 11B, 12A, 12B, 13, and 14. In other embodiments, the barrier layer 4201 is deposited after removing the surfactant layer 601 (see FIG. 15) as described above with reference to FIG. 18. In such embodiments, the barrier layer 4201 is formed over and in physical contact with the exposed top surfaces of the contact plugs 115 and 117. In some embodiments, the barrier layer 4201 may be deposited using PVD, or the like. The barrier layers 1501 and 4201 together may be also referred to as a combined barrier layer. In some embodiments, the combined barrier layer has a thickness $T_1$ along the sidewalls of the via openings $209_1$ and $211_1$ and a thickness $T_2$ along the bottoms of the via openings $209_1$ and $211_1$. In some embodiments, the thickness $T_1$ is greater than the thickness $T_2$. In some embodiments, the thickness $T_1$ is between about 10 Å and about 30 Å. In some embodiments, the thickness $T_2$ is between about 1 Å and about 10 Å. In some embodiments, a ratio of the thickness $T_1$ to the thickness $T_2$ ($T_1/T_2$) is between about 1 and about 30.

Figure 43:
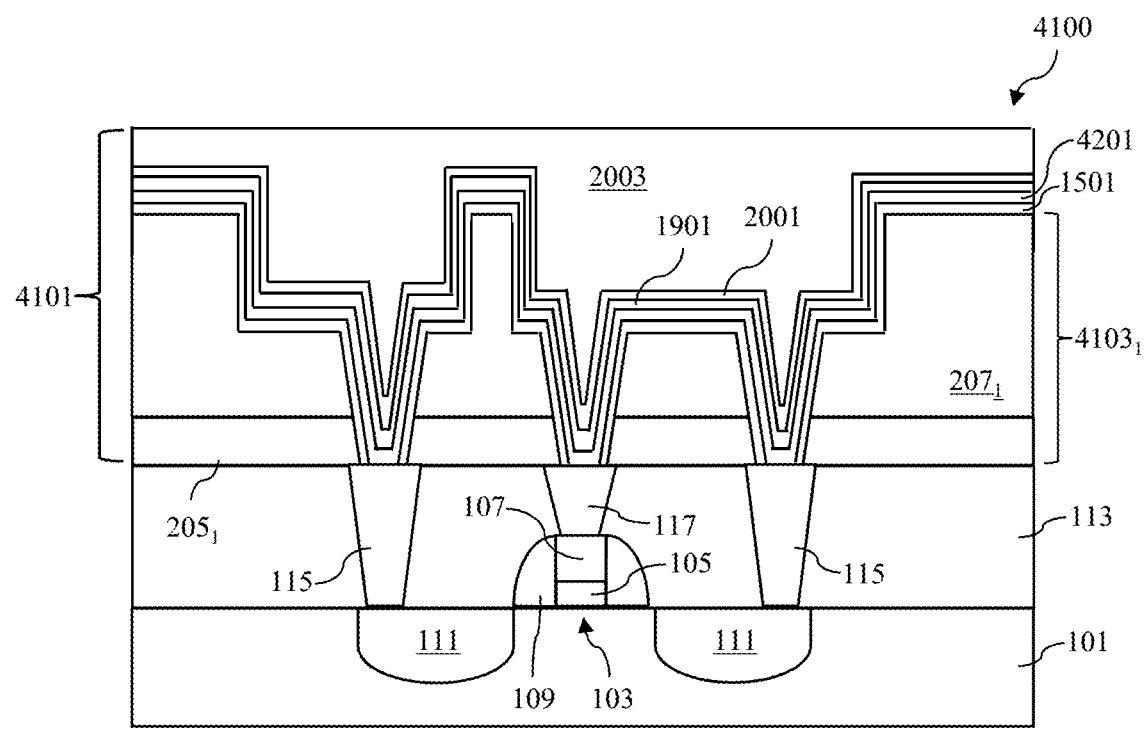

Referring to FIG. 43, after forming the barrier layer 4201, an adhesion layer 1901 is formed in the openings 209 and 211 (see FIG. 41) and over the barrier layer 4201 as described above with reference to FIG. 19, and the description is not repeated herein. Subsequently, a seed layer 2001 is formed in the openings 209 and 211 and over the adhesion layer 1901 as described above with reference to FIG. 20, and the description is not repeated herein. After forming the seed layer 2001, a conductive layer 2003 is formed in the openings 209 and 211 as described above with reference to FIG. 20, and the description is not repeated herein. In some embodiments, the conductive layer 2003 overfills the openings 209 and 211.

Figure 44:
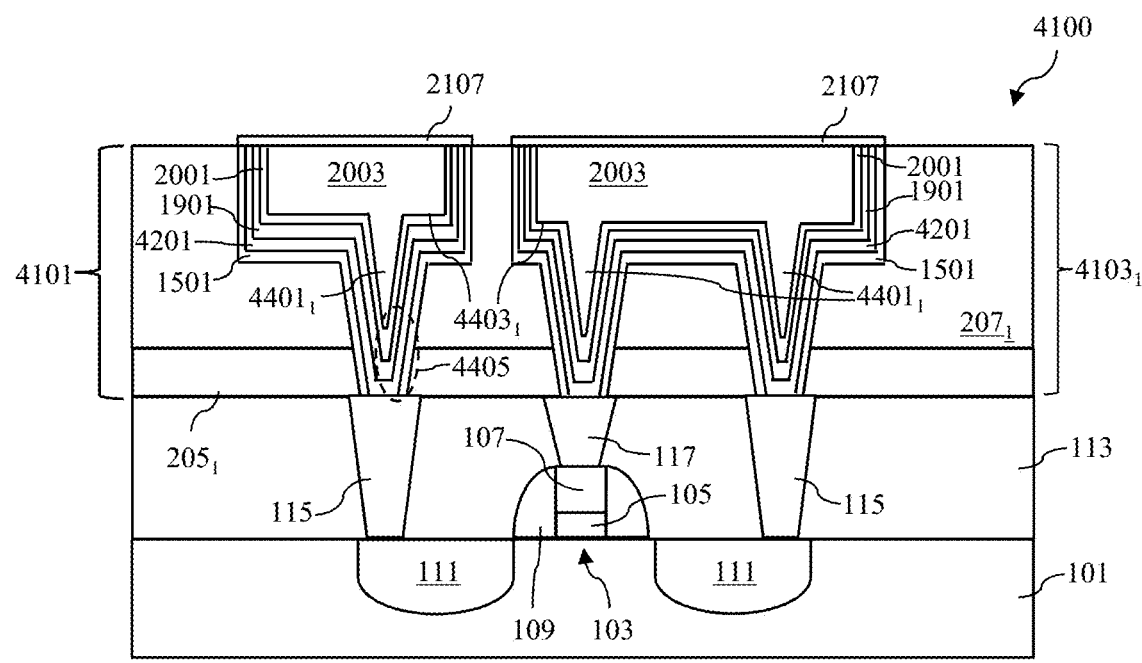

Referring to FIG. 44, portions of the barrier layers 1501 and 4201, the adhesion layer 1901, the seed layer 2001, and the conductive layer 2003 overfilling the openings 209 and 211 (see FIG. 41) are removed to expose a top surface of the IMD layer $207_1$. In some embodiments, the removal process may be a planarization process comprising a CMP process, a grinding process, an etching process, a combination thereof, or the like. Remaining portions of the barrier layers 1501 and 4201, the adhesion layer 1901, the seed layer 2001, and the conductive layer 2003 filling the via openings $209_1$ and $211_1$ (see FIG. 41) form conductive vias $4401_1$, and remaining portions of the barrier layers 1501 and 4201, the adhesion layer 1901, the seed layer 2001, and the conductive layer 2003 filling the line openings $209_2$ and $211_2$ (see FIG. 41) form conductive lines $4403_1$. In some embodiments, topmost surfaces of the conductive lines $4403_1$ are substantially coplanar or level with a topmost surface of the IMD layer $207_1$ within process variations of the planarization process. In some embodiments, after performing the planarization process, capping layers 2107 are formed over the conductive lines $4403_1$ of the metallization layer $4103_1$ as described above with reference to FIG. 21, and the description is not repeated herein.

Figure 45:
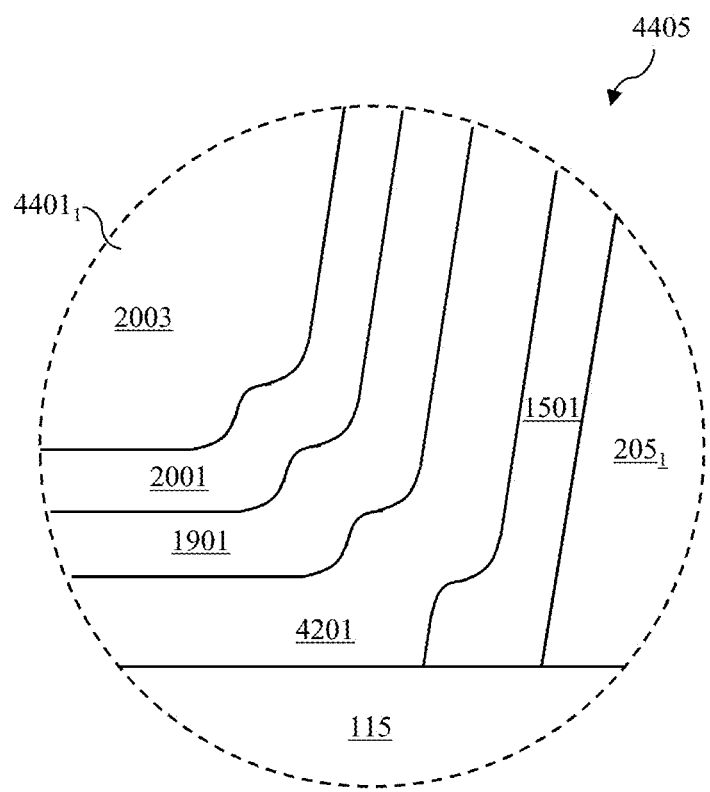

FIG. 45 illustrates a magnified view of a region 4405 of the structure shown in FIG. 44 in accordance with some embodiments. In the illustrated embodiment, the barrier layer 1501 is deposited such that the barrier layer 1501 fully covers and is in physical contact with sidewalls of the ESL $205_1$, and is in physically contact with the top surface of the contact plug 115. The barrier layer 1501 does not extend along the top surface of the contact plug 115, but covers corners formed by the sidewalls of the ESL $205_1$ and the top surface of the contact plug 115. In the illustrated embodiment, the barrier layer 4201 extends along and is in physical contact with the top surface of the contact plug 115.

Figure 46:
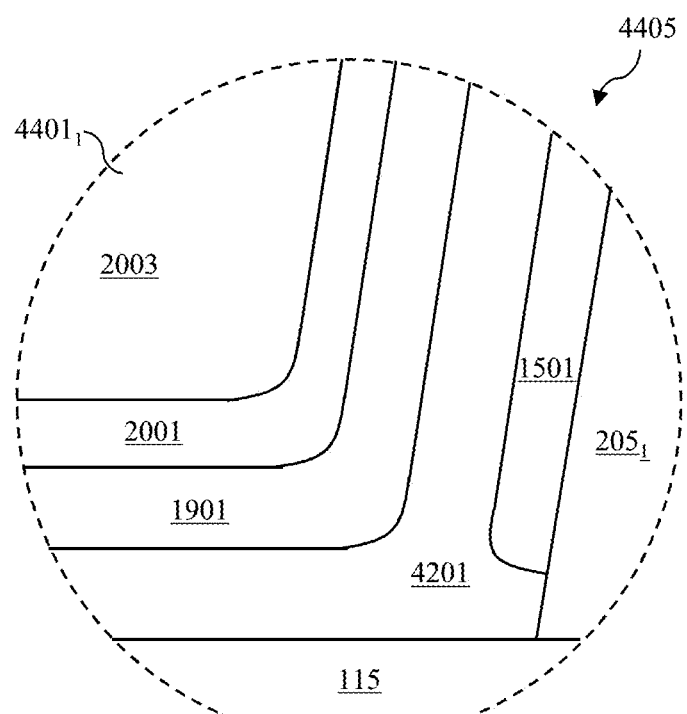

FIG. 46 illustrates a magnified view of the region 4405 of the structure shown in FIG. 44 in accordance with some embodiments. In the illustrated embodiment, the barrier layer 1501 is deposited such that the barrier layer 1501 does not extend along the top surface of the contact plug 115, partially covers and is in physical contact with sidewalls of the ESL $205_1$, and does not cover corners formed by the sidewalls of the ESL $205_1$ and the top surface of the contact plug 115. In some embodiments, the barrier layer 4201 covers corners formed by the sidewalls of the ESL $205_1$ and the top surface of the contact plug 115, is in physical contact with the sidewalls of the ESL $205_1$, and extends along and is in physical contact with the top surface of the contact plug 115.

Referring further to FIGS. 45 and 46, by depositing the barrier layers 1501 and 4201 in the openings within the ESL $205_1$ and the IMD layer $207_1$, such that a thickness of the combined barrier layer on the bottoms of the openings is reduced compared to the sidewalls of the openings, an amount (or volume) of the combined barrier layer within the openings is reduced. As a result, a contact resistance between the conductive vias $4401_1$ and respective one of the contact plugs 115 and 117 is reduced.

Figure 47:
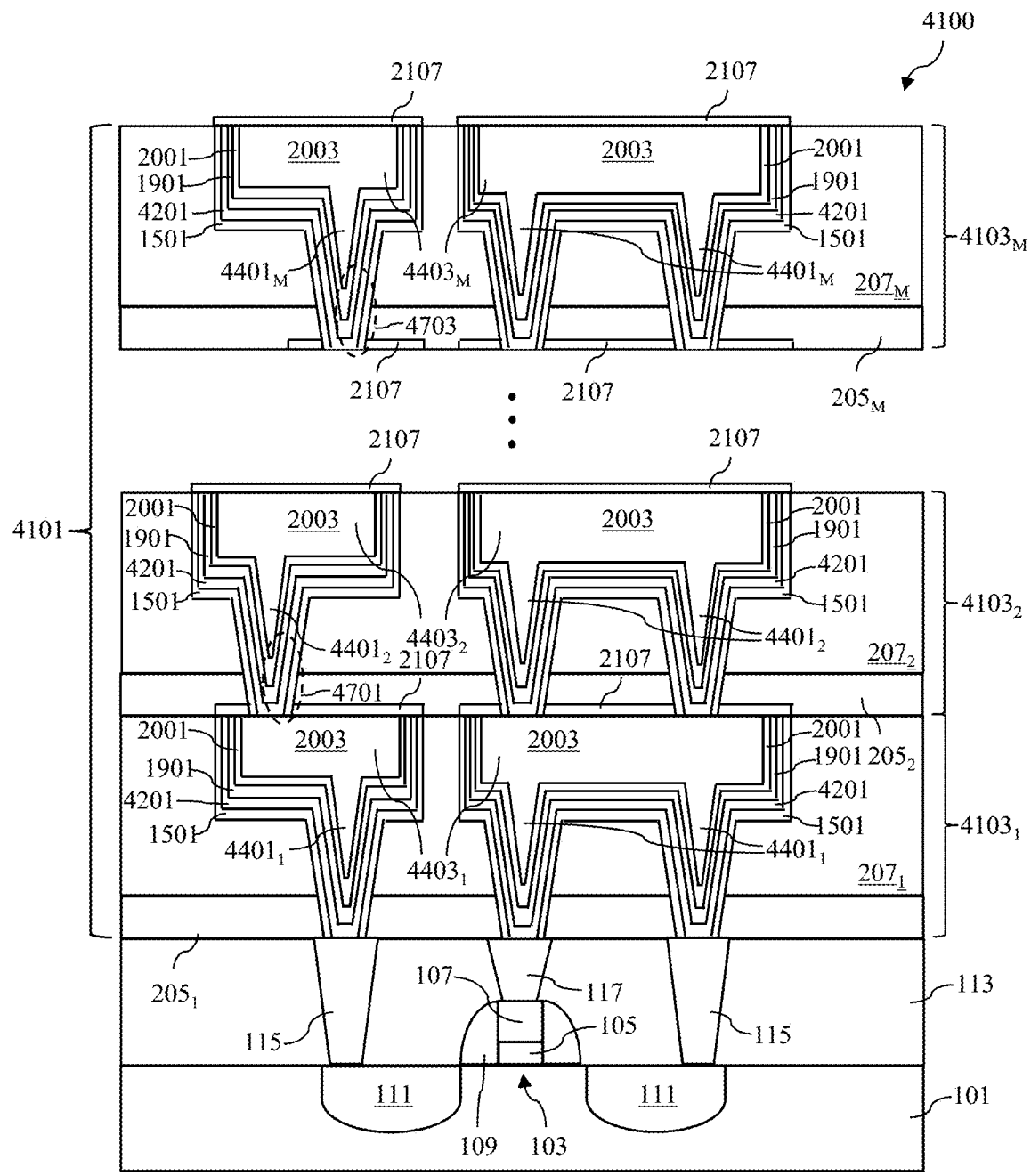

Referring to FIG. 47, a metallization layer $4103_2$ is formed over the metallization layer $4103_1$. In some embodiments, process steps for forming the metallization layer $4103_2$ start with forming an ESL $205_2$ over the metallization layer $4103_1$ and the capping layers 2107 as described above with reference to FIG. 24, and the description is not repeated herein. Subsequently, an IMD layer $207_2$ is formed over the ESL $205_2$ as described above with reference to FIG. 24, and the description is not repeated herein.

In some embodiments, interconnects, such as conductive vias $4401_2$ and conductive lines $4403_2$, are formed in the IMD layer $207_2$ and the ESL $205_2$. In some embodiments, the conductive vias $4401_2$ and the conductive lines $4403_2$ may have similar structures as the conductive vias $4401_1$ and the conductive lines $4403_1$, with similar features being labeled by similar numerical references. In some embodiments, the conductive vias $4401_2$ and the conductive lines $4403_2$ may be formed using process steps as described above with reference to FIGS. 41-44, and the description is not repeated herein. In some embodiments, the barrier layers 1501 of the metallization layer $4103_2$ are formed in a similar manner as the barrier layers 1501 of the metallization layer $203_2$ described above with reference to FIG. 25, and the description is not repeated herein.

In some embodiments, after forming the metallization layer $4103_2$, one or more metallization layers are formed over the metallization layer $4103_2$, until a metallization layer $4103_M$ is formed. In some embodiments, the metallization layer $4103_M$ is the final metallization layer of the interconnect structure 4101. In some embodiments, M may be between 1 and 5. In some embodiments, the intermediated metallization layers between the metallization layer $4103_2$ and the metallization layer $4103_M$ are formed in a similar manner as the metallization layer $4103_2$ and the description is not repeated herein. In other embodiments, the metallization layer $4103_M$ is not the final metallization layer of the interconnect structure 4101 and additional metallization layers are formed over the metallization layer $4103_M$.

In some embodiments, process steps for forming the metallization layer $4103_M$ start with an ESL $205_M$ over the previous metallization layer and the capping layers 2107 as described above with reference to FIG. 28, and the description is not repeated herein. Subsequently, an IMD layer $207_M$ is formed over the ESL $205_M$ as described above with reference to FIG. 28, and the description is not repeated herein.

In some embodiments, interconnects, such as conductive vias $4401_M$ and conductive lines $4403_M$, are formed in the IMD layer $207_M$ and the ESL $205_M$. In some embodiments, the conductive vias $4401_M$ and the conductive lines $4403_M$ may have similar structures as the conductive vias $4401_1$ and the conductive lines $4403_1$, with similar features being labeled by similar numerical references. In some embodiments, the conductive vias $4401_M$ and the conductive lines $2203_M$ may be formed using process steps as described above with reference to FIGS. 41-44, and the description is not repeated herein. In some embodiments, the barrier layers 1501 of the metallization layer $4103_M$ are formed in a similar manner as the barrier layers 1501 of the metallization layer $203_M$ described above with reference to FIG. 28, and the description is not repeated herein.

Figure 48:
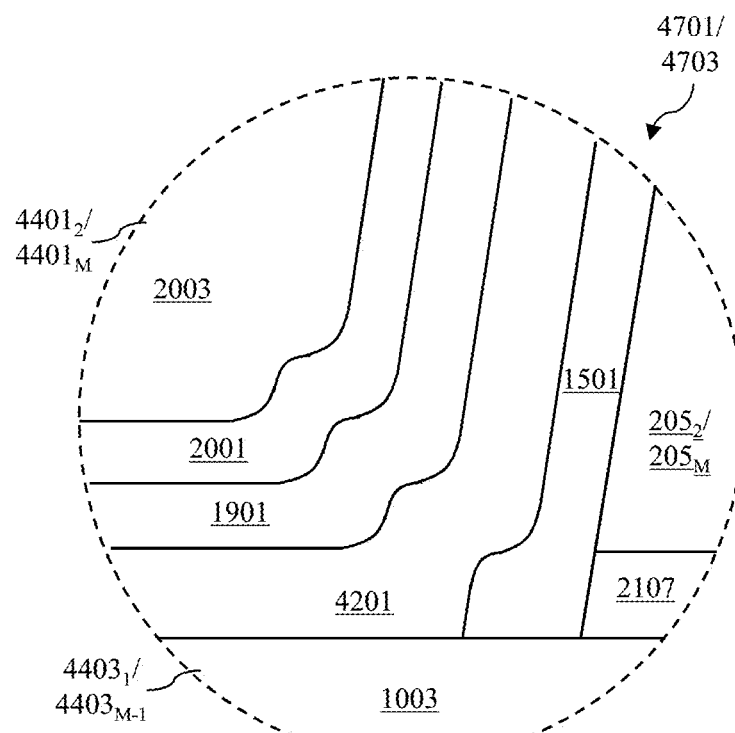

FIG. 48 illustrates magnified views of regions 4701 and 4703 of the semiconductor device 4100 (see FIG. 47) in accordance with some embodiments. Referring first to the region 4701, in the illustrated embodiment, the barrier layer 1501 is deposited such that the barrier layer 1501 does not extend along the top surface of the conductive layer 2003 of the conductive line $4403_1$, fully covers and is in physical contact with sidewalls of the ESL $205_2$, and partially covers and is in physical contact with sidewalls of the capping layer 2107, and is in physically contact with the top surface of the conductive layer 2003 of the conductive line $4403_1$. The barrier layer 1501 covers corners formed by the sidewalls of the capping layer 2107 and the top surface of the conductive layer 2003 of the conductive line $4403_1$. In the illustrated embodiment, the barrier layer 4201 extends along and is in physical contact with the top surface of the conductive layer 2003 of the conductive line $4403_1$.

By depositing the barrier layers 1501 and 4201 in the openings within the ESL $205_2$ and the IMD layer $207_2$, such that a thickness of the combined barrier layer on the bottoms of the openings is reduced compared to the sidewalls of the openings, an amount (or volume) of the combined barrier layer within the openings is reduced. As a result, a contact resistance between the conductive vias $4401_2$ and the respective conductive lines $4403_1$ is reduced.

Referring next to the region 4703, in the illustrated embodiment, the barrier layer 1501 is deposited such that the barrier layer 1501 does not extend along the top surface of the conductive layer 2003 of the conductive line $4403_{M-1}$, fully covers and is in physical contact with sidewalls of the ESL $205_M$, and partially covers and is in physical contact with sidewalls of the capping layer 2107, and is in physically contact with the top surface of the conductive layer 2003 of the conductive line $4403_{M-1}$. The barrier layer 1501 covers corners formed by the sidewalls of the capping layer 2107 and the top surface of the conductive layer 2003 of the conductive line $4403_{M-1}$. In the illustrated embodiment, the barrier layer 4201 extends along and is in physical contact with the top surface of the conductive layer 2003 of the conductive line $4403_{M-1}$.

By depositing the barrier layers 1501 and 4201 in the openings within the ESL $205_M$ and the IMD layer $207_M$, such that a thickness of the combined barrier layer on the bottoms of the openings is reduced compared to the sidewalls of the openings, an amount (or volume) of the combined barrier layer within the openings is reduced. As a result, a contact resistance between the conductive vias $4401_M$ and the respective conductive lines $4403_{M-1}$ is reduced.

Figure 49:
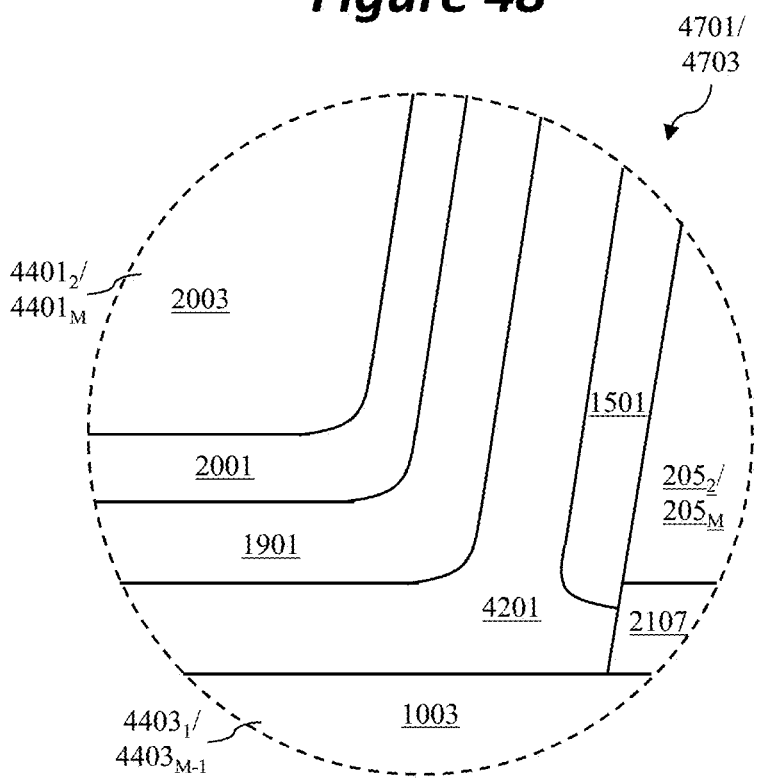

FIG. 49 illustrates magnified views of regions 4701 and 4703 of the semiconductor device 4100 (see FIG. 47) in accordance with some embodiments. Referring first to the region 4701, in the illustrated embodiment, the barrier layer 1501 is deposited such the barrier layer 1501 does not extend along the top surface of the conductive layer 2003 of the conductive line $4403_1$, covers and is in physical contact with sidewalls of the ESL $205_2$, partially covers and is in physical contact with sidewalls of the capping layer 2107, and does not cover corners formed by the sidewalls of the capping layer 2107 and the top surface of the conductive layer 2003 of the conductive line $4403_1$. In some embodiments, the barrier layer 4201 covers corners formed by the sidewalls of the capping layer 2107 and the top surface of the conductive layer 2003 of the conductive line $4403_1$, is in physical contact with the sidewalls of the capping layer 2107, and extends along and is in physical contact with the top surface of the conductive layer 2003 of the conductive line $4403_1$.

By depositing the barrier layers 1501 and 4201 in the openings within the ESL $205_2$ and the IMD layer $207_2$, such that a thickness of the combined barrier layer on the bottoms of the openings is reduced compared to the sidewalls of the openings, an amount (or volume) of the combined barrier layer within the openings is reduced. As a result, a contact resistance between the conductive vias $4401_2$ and the respective conductive lines $4403_1$ is reduced.

Referring next to the region 2503, in the illustrated embodiment, the barrier layer 1501 is deposited such the barrier layer 1501 does not extend along a top surface of the conductive layer 2003 of the conductive line $4403_{M-1}$, covers and is in physical contact with sidewalls of the ESL $205_M$, partially covers and is in physical contact with sidewalls of the capping layer 2107, and does not cover corners formed by the sidewalls of the capping layer 2107 and the top surface of the conductive layer 2003 of the conductive line $4403_{M-1}$. In some embodiments, the barrier layer 4201 covers corners formed by the sidewalls of the capping layer 2107 and the top surface of the conductive layer 2003 of the conductive line $4403_{M-1}$, is in physical contact with the sidewalls of the capping layer 2107, and extends along and is in physical contact with the top surface of the conductive layer 2003 of the conductive line $4403_{M-1}$.

By depositing the barrier layers 1501 and 4201 in the openings within the ESL $205_M$ and the IMD layer $207_M$, such that a thickness of the combined barrier layer on the bottoms of the openings is reduced compared to the sidewalls of the openings, an amount (or volume) of the combined barrier layer within the openings is reduced. As a result, a contact resistance between the conductive vias $4401_M$ and the respective conductive lines $4403_{M-1}$ is reduced.

Figure 50:
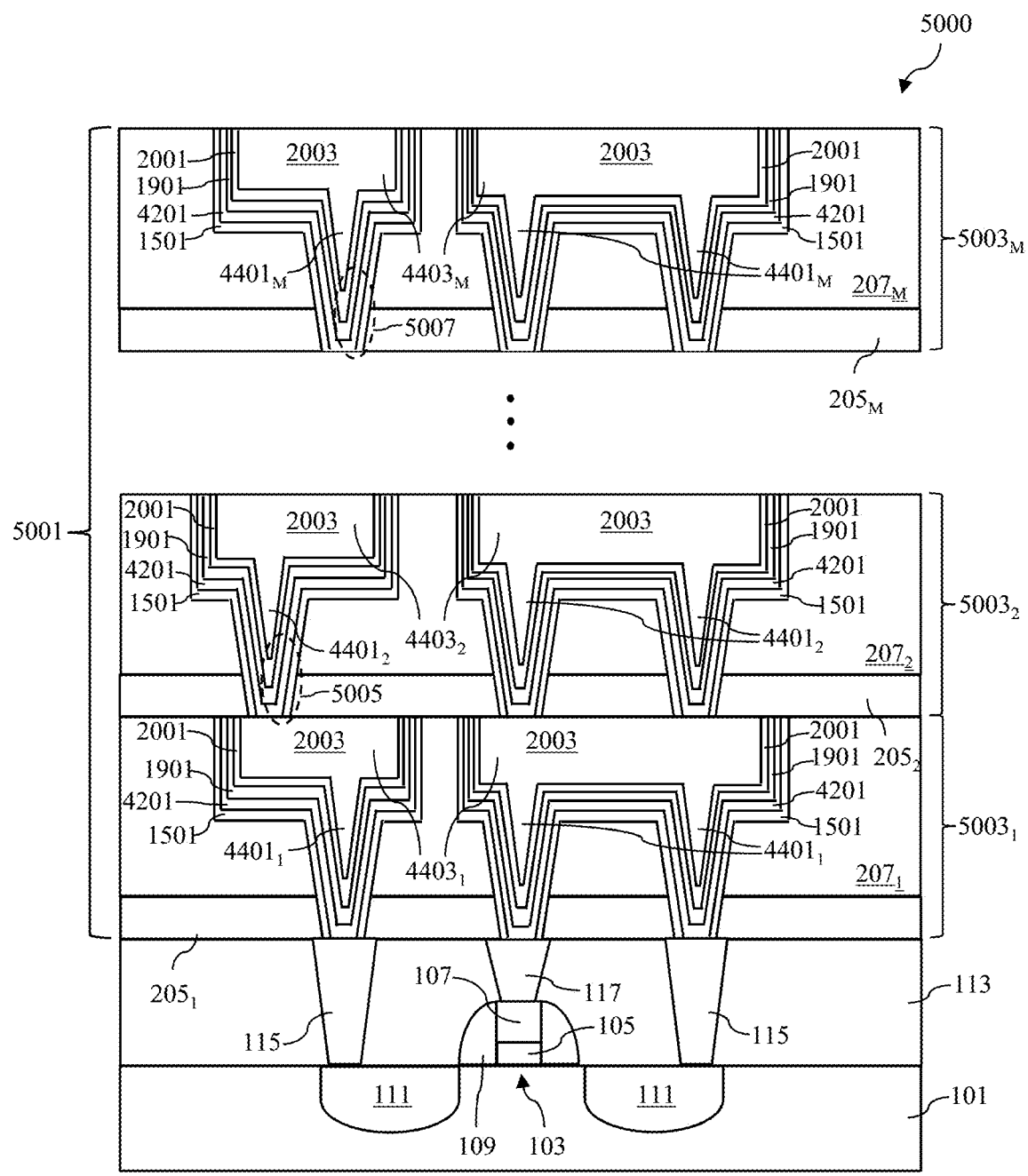
FIGS. 50-52 illustrate cross-sectional views of a semiconductor device in accordance with some embodiments.

FIG. 50 illustrates a cross-sectional view of a semiconductor device 5000 in accordance with some embodiments. In some embodiments, the semiconductor device 5000 comprises the interconnect structure 5001 having metallization layers $5003_1$ to $5003_M$, such that the metallization layers $5003_1$ to $5003_M$ comprise conductive vias $4401_1$ to $4401_M$ and conductive lines $4403_1$ to $4403_M$, respectively. The semiconductor device 5000 has a similar structure as the semiconductor device 4100 (see FIG. 47), with similar features being labeled by similar numerical references. In some embodiments, the semiconductor device 5000 may be formed using process steps similar to the process steps for forming the semiconductor device 4100 described above with reference to FIGS. 41-47, with the distinction that the formation of the capping layers 2107 has been omitted.

Figure 51:
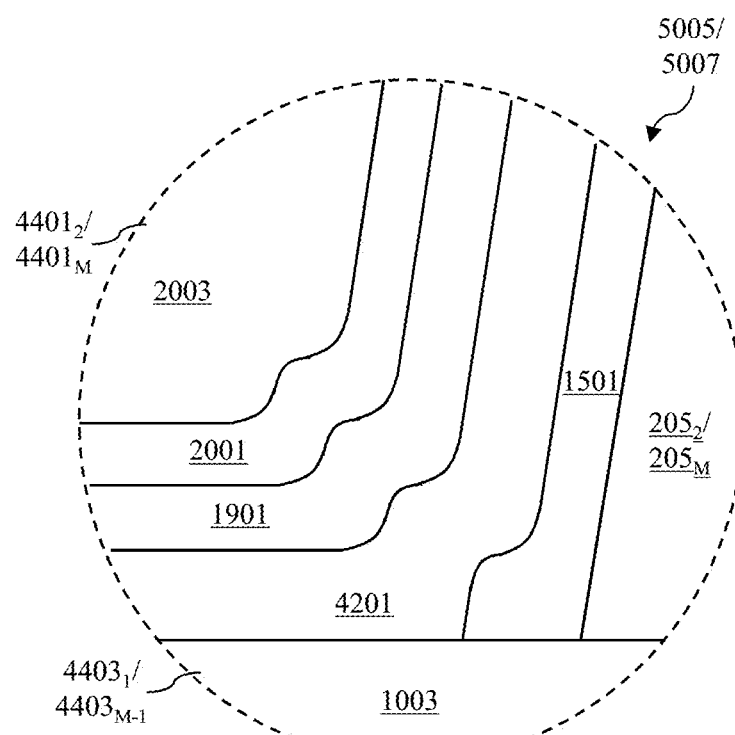

FIG. 51 illustrates magnified views of regions 5005 and 5007 of the semiconductor device 5000 (see FIG. 50) in accordance with some embodiments. The regions 5005 and 5007 have similar structures as the regions 4701 and 4703, respectively (see FIG. 48), with the distinction that the capping layer 2107 has been omitted. In the illustrated embodiment, the barrier layers 1501 fully covers the sidewalls of the ESL $205_2$ in the region 5005 and the sidewalls of the ESL $205_M$ in the region 5007.

Figure 52:
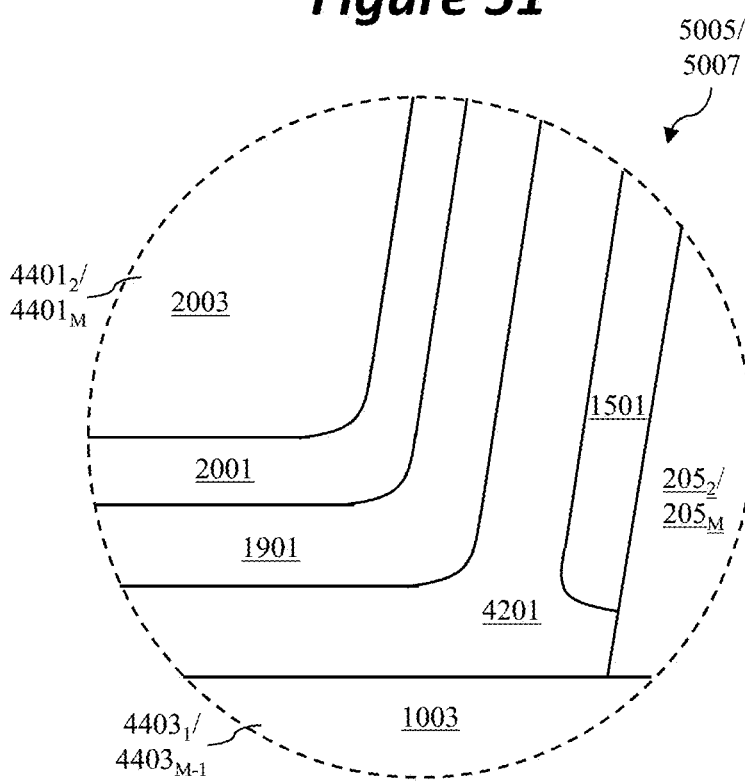

FIG. 52 illustrates magnified view of regions 5005 and 5007 of the semiconductor device 5000 (see FIG. 50) in accordance with some embodiments. The regions 5005 and 5007 have similar structures as the regions 4701 and 4703, respectively (see FIG. 49), with the distinction that the capping layer 2107 has been omitted. In the illustrated embodiment, the barrier layer 4201 is in physical contact with the sidewalls of the ESL $205_2$ in the region 5005 and the sidewalls of the ESL $205_M$ in the region 5007.

Referring further to FIGS. 28, 30, 35, 38, 47 and 50, the interconnect structures 201, 3001, 3501, 3801, 4101, and 5001, respectively, are formed such that all of the interconnects (such as conductive vias and conductive lines) within each of the interconnect structures have similar structures and are formed using similar process steps. In other embodiments, different interconnects within the interconnect structure may have different structures and may be formed using different process steps. Such embodiments are described below with reference to FIGS. 53-56.

Figure 53:
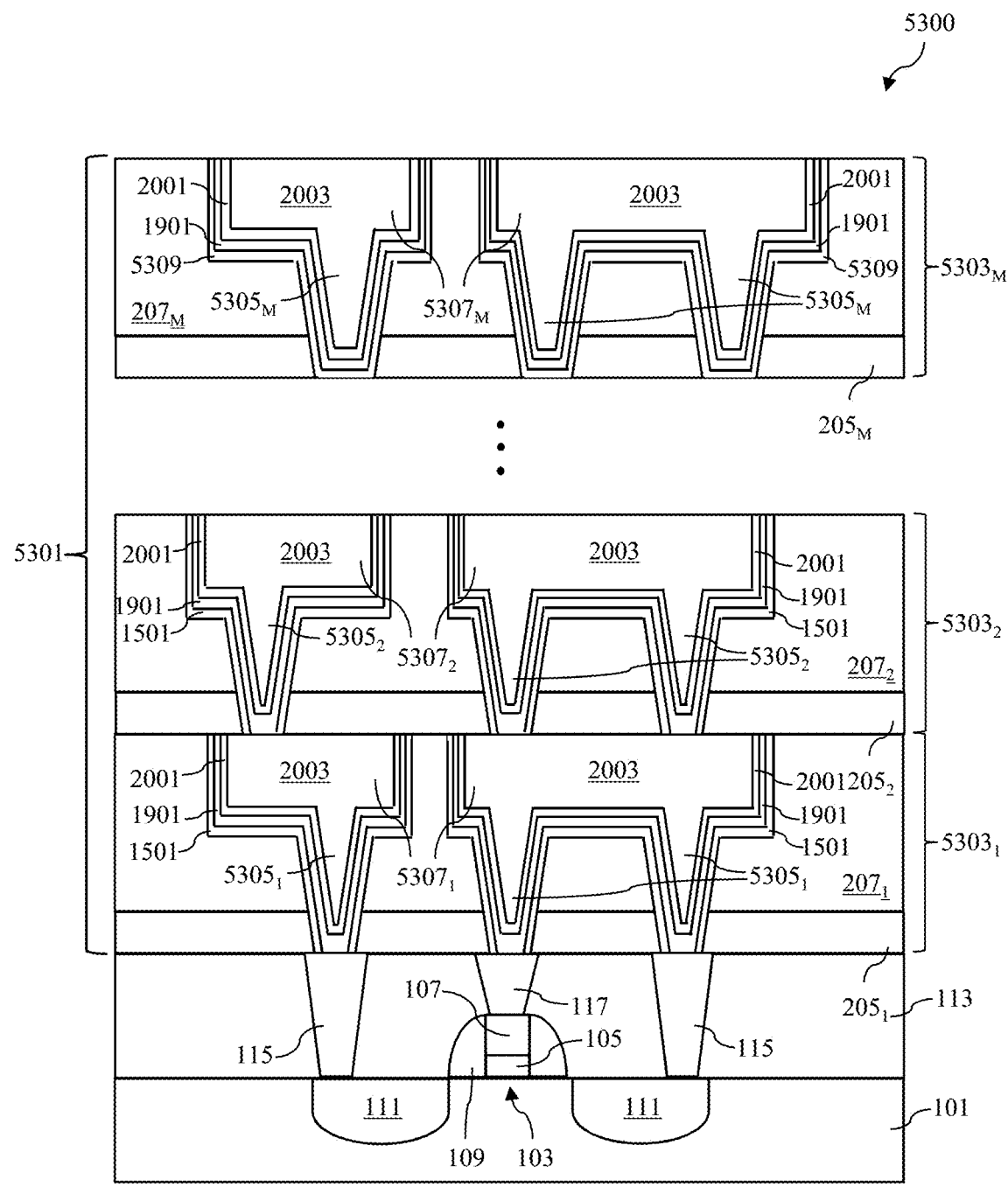
FIG. 53 illustrates a cross-sectional view of a semiconductor device in accordance with some embodiments.

FIG. 53 illustrates a cross-sectional view of a semiconductor device 5300 in accordance with some embodiments. In some embodiments, the semiconductor device 5300 is similar to the semiconductor device 3500 illustrated in FIG. 35, with similar features being labeled with similar numerical references, and the descriptions of the similar features are not repeated herein. In some embodiments, the interconnect structure 5301 of the semiconductor device 5300 is similar to the interconnect structure 3501 of the semiconductor device 3500 (see FIG. 35), with similar features being labeled with similar numerical references, and the descriptions of the similar features are not repeated herein. The interconnect structure 5301 comprises a plurality of metallization layer $5303_1$ to $5303_M$. In some embodiments, the metallization layer $5303_M$ is the final metallization layer of the interconnect structure 5301. In some embodiments, M may be between 1 and 5. In other embodiments, the metallization layer $5303_M$ is not the final metallization layer of the interconnect structure 5301 and additional metallization layers are formed over the metallization layer $5303_M$.

In the illustrated embodiment, interconnects within different metallization layers of the interconnect structure 5301 have different structures. In particular, interconnects with different sizes may have different structures and may be formed using different process steps. In some embodiments, the metallization layer $5303_1$ of the interconnect structure 5301 comprises conductive vias $5305_1$ and conductive lines $5307_1$. In some embodiments when a width of the conductive vias $5305_1$ at the bottom of the conductive vias $5305_1$ is between about 5 nm and about 10 nm, the conductive vias $5305_1$ and conductive lines $5307_1$ may be formed using process steps similar to process steps for forming the conductive vias $2101_1$ and conductive lines $2103_1$ described above with reference to FIGS. 2, 3A-3C, 4-6, 7A-7C, 8-10, 11A, 11B, 12A, 12B, 13-21, and the description is not repeated herein. In such embodiments, the metallization layer $5303_1$ is similar to the metallization layer $3501_1$ (see FIG. 35).

In some embodiments, the metallization layer $5303_2$ of the interconnect structure 5301 comprises conductive vias $5305_2$ and conductive lines $5307_2$. In some embodiments when a width of the conductive vias $5305_2$ at the bottom of the conductive vias $5305_2$ is between about 8 nm and about 14 nm, the conductive vias $5305_2$ and conductive lines $5307_2$ may be formed using process steps similar to process steps for forming the conductive vias $2101_2$ and conductive lines $2103_2$ described above with reference to FIGS. 24 and 25, and the description is not repeated herein. In such embodiments, the metallization layer $5303_2$ is similar to the metallization layer $3503_2$ (see FIG. 35). Furthermore, the metallization layer $5303_1$ and the metallization layer $5303_2$ have interconnects with similar structures.

In some embodiments, the metallization layer $5303_M$ of the interconnect structure 5301 comprises conductive vias $5305_M$ and conductive lines $5307_M$. In the illustrated embodiment, a width of the conductive vias $5305_M$ is greater than the width of the conductive vias $5305_1$ and the width of the conductive vias $5305_2$. In some embodiments when a width of the conductive vias $5305_M$ at the bottom of the conductive vias $5305_M$ is between about 15 nm and about 30 nm, the conductive vias $5305_M$ and conductive lines $5307_M$ may be formed using process steps similar to process steps for forming the conductive vias $2101_M$ and conductive lines $2103_M$ described above with reference to FIG. 28, with the distinction that the surface modification process steps described above with reference to FIGS. 3A-3C, 4-6, 7A-7C, 8-10, 11A, 11B, 12A, 12B, 13, and 14 are omitted. In such embodiments, instead of forming the barrier layer 1501, the barrier layer 5309 is formed over and in physical contact with the conductive line of the underlying metallization layer. Accordingly, the metallization layer $5303_M$ and the metallization layer $5303_1$ have interconnects with different structures. Furthermore, the metallization layer $5303_M$ and the metallization layer $5303_2$ have interconnects with different structures. In some embodiments, the barrier layer 5309 may comprise titanium, titanium nitride, tantalum, tantalum nitride, a combination thereof, a multilayer thereof, or the like, and may be deposited using ALD, CVD, PVD, a combination thereof, or the like.

In some embodiments, interconnects of the metallization layers interposed between the metallization layer $5303_2$ and the metallization layer $5303_M$, may have different structures depending on the size of the interconnects. In some embodiments when widths of vias are between about 5 nm and about 14 nm, interconnects are formed to have structures similar to interconnects (such as the conductive vias $5305_1$ and the conductive lines $5307_1$) of the metallization layer $5303_1$. In some embodiments when widths of vias are between about 15 nm and about 30 nm, interconnects are formed to have structures similar to interconnects (such as the conductive vias $5305_M$ and the conductive lines $5307_M$) of the metallization layer $5303_M$.

Figure 54:
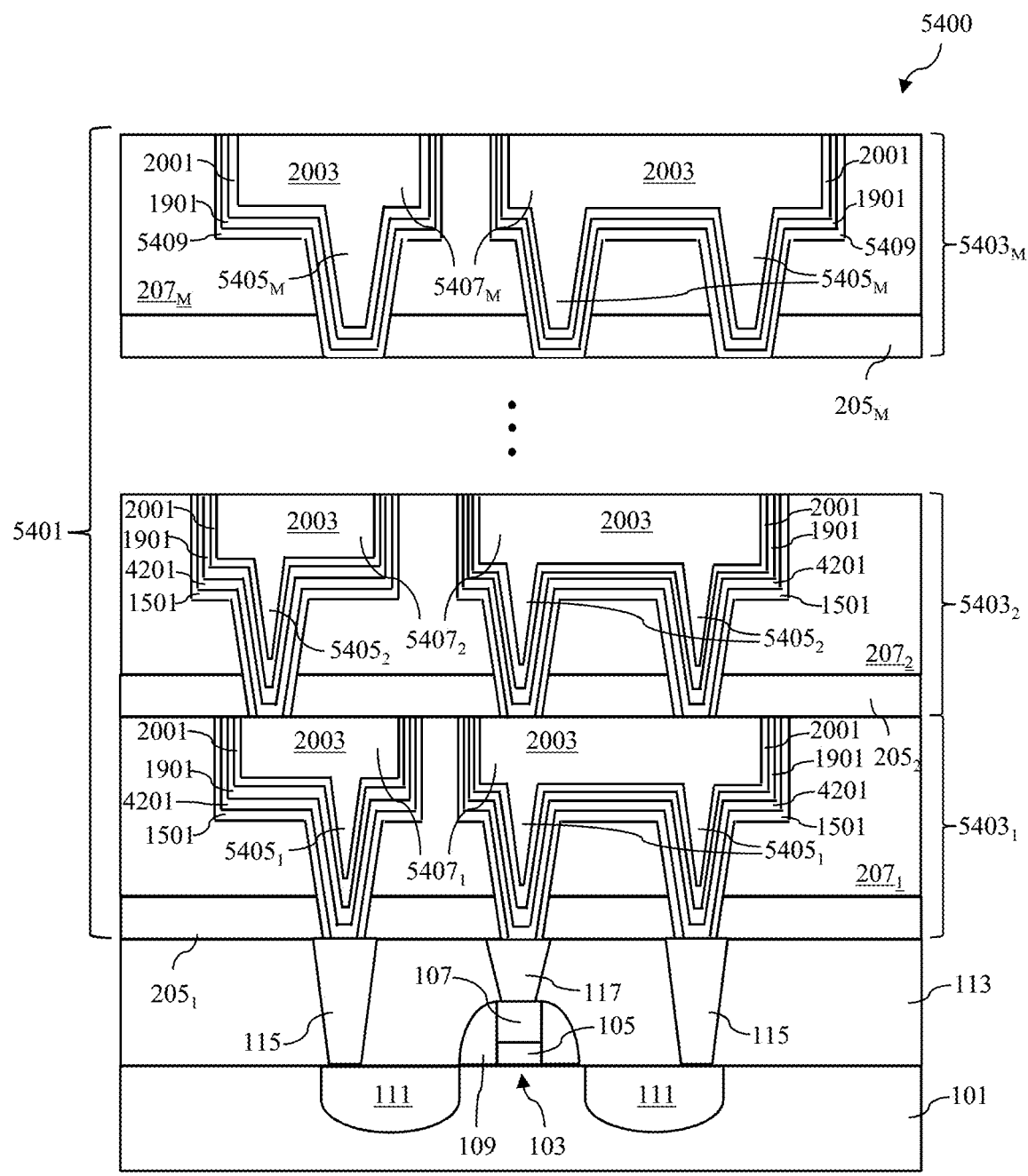
FIG. 54 illustrates a cross-sectional view of a semiconductor device in accordance with some embodiments.

FIG. 54 illustrates a cross-sectional view of a semiconductor device 5400 in accordance with some embodiments. In some embodiments, the semiconductor device 5400 is similar to the semiconductor device 5000 illustrated in FIG. 50, with similar features being labeled with similar numerical references, and the descriptions of the similar features are not repeated herein. In some embodiments, the interconnect structure 5401 of the semiconductor device 5400 is similar to the interconnect structure 5001 of the semiconductor device 5000 (see FIG. 50), with similar features being labeled with similar numerical references, and the descriptions of the similar features are not repeated herein. The interconnect structure 5401 comprises a plurality of metallization layer $5403_1$ to $5403_M$. In some embodiments, the metallization layer $5403_M$ is the final metallization layer of the interconnect structure 5401. In some embodiments, M may be between 1 and 5. In other embodiments, the metallization layer $5403_M$ is not the final metallization layer of the interconnect structure 5401 and additional metallization layers are formed over the metallization layer $5403_M$.

In the illustrated embodiment, interconnects within different metallization layers of the interconnect structure 5401 have different structures. In particular, interconnects with different sizes may have different structures and may be formed using different process steps. In some embodiments, the metallization layer $5403_1$ of the interconnect structure 5401 comprises conductive vias $5405_1$ and conductive lines $5407_1$. In some embodiments when a width of the conductive vias $5405_1$ at the bottom of the conductive vias $5405_1$ is between about 6 nm and about 10 nm, the conductive vias $5405_1$ and conductive lines $5407_1$ may be formed using process steps similar to process steps for forming the conductive vias $4401_1$ and conductive lines $4403_1$ described above with reference to FIGS. 41-44, and the description is not repeated herein. In such embodiments, the metallization layer $5403_1$ is similar to the metallization layer $5003_1$ (see FIG. 50).

In some embodiments, the metallization layer $5403_2$ of the interconnect structure 5401 comprises conductive vias $5405_2$ and conductive lines $5407_2$. In some embodiments when a width of the conductive vias $5405_2$ at the bottom of the conductive vias $5405_2$ is between about 8 nm and about 14 nm, the conductive vias $5405_2$ and conductive lines $5407_2$ may be formed using process steps similar to process steps for forming the conductive vias $4401_2$ and conductive lines $4403_2$ described above with reference to FIG. 47, and the description is not repeated herein. In such embodiments, the metallization layer $5403_2$ is similar to the metallization layer $5003_2$ (see FIG. 50). Furthermore, the metallization layer $5403_1$ and the metallization layer $5403_2$ have interconnects with similar structures.

In some embodiments, the metallization layer $5403_M$ of the interconnect structure 5401 comprises conductive vias $5405_M$ and conductive lines $5407_M$. In the illustrated embodiment, a width of the conductive vias $5405_M$ is greater than the width of the conductive vias $5405_1$ and the width of the conductive vias $5405_2$. In some embodiments when a width of the conductive vias $5405_M$ at the bottom of the conductive vias $5405_M$ is between about 15 nm and about 30 nm, the conductive vias $5405_M$ and conductive lines $5407_M$ may be formed using process steps similar to the process steps for forming the conductive vias $2101_M$ and conductive lines $2103_M$ described above with reference to FIG. 28, with the distinction that the surface modification process steps described above with reference to FIGS. 3A-3C, 4-6, 7A-7C, 8-10, 11A, 11B, 12A, 12B, 13, and 14 are omitted. In such embodiments, instead of forming the barrier layer 1501, the barrier layer 5409 is formed over and in physical contact with the conductive line of the underlying metallization layer. Accordingly, the metallization layer $5403_M$ and the metallization layer $5403_1$ have interconnects with different structures. Furthermore, the metallization layer $5403_M$ and the metallization layer $5403_2$ have interconnects with different structures. In some embodiments, the barrier layer 5409 may comprise titanium, titanium nitride, tantalum, tantalum nitride, a combination thereof, a multilayer thereof, or the like, and may be deposited using ALD, CVD, PVD, a combination thereof, or the like.

In some embodiments, interconnects of the metallization layers interposed between the metallization layer $5403_2$ and the metallization layer $5403_M$, may have different structures depending on the size of the interconnects. In some embodiments when widths of vias are between about 6 nm and about 14 nm, interconnects are formed to have structures similar to interconnects (such as the conductive vias $5405_1$ and the conductive lines $5407_1$) of the metallization layer $5403_1$. In some embodiments when widths of vias are between about 15 nm and about 30 nm, interconnects are formed to have structures similar to interconnects (the conductive vias $5405_M$ and the conductive lines $5407_M$) of the metallization layer $5403_M$.

Figure 55:
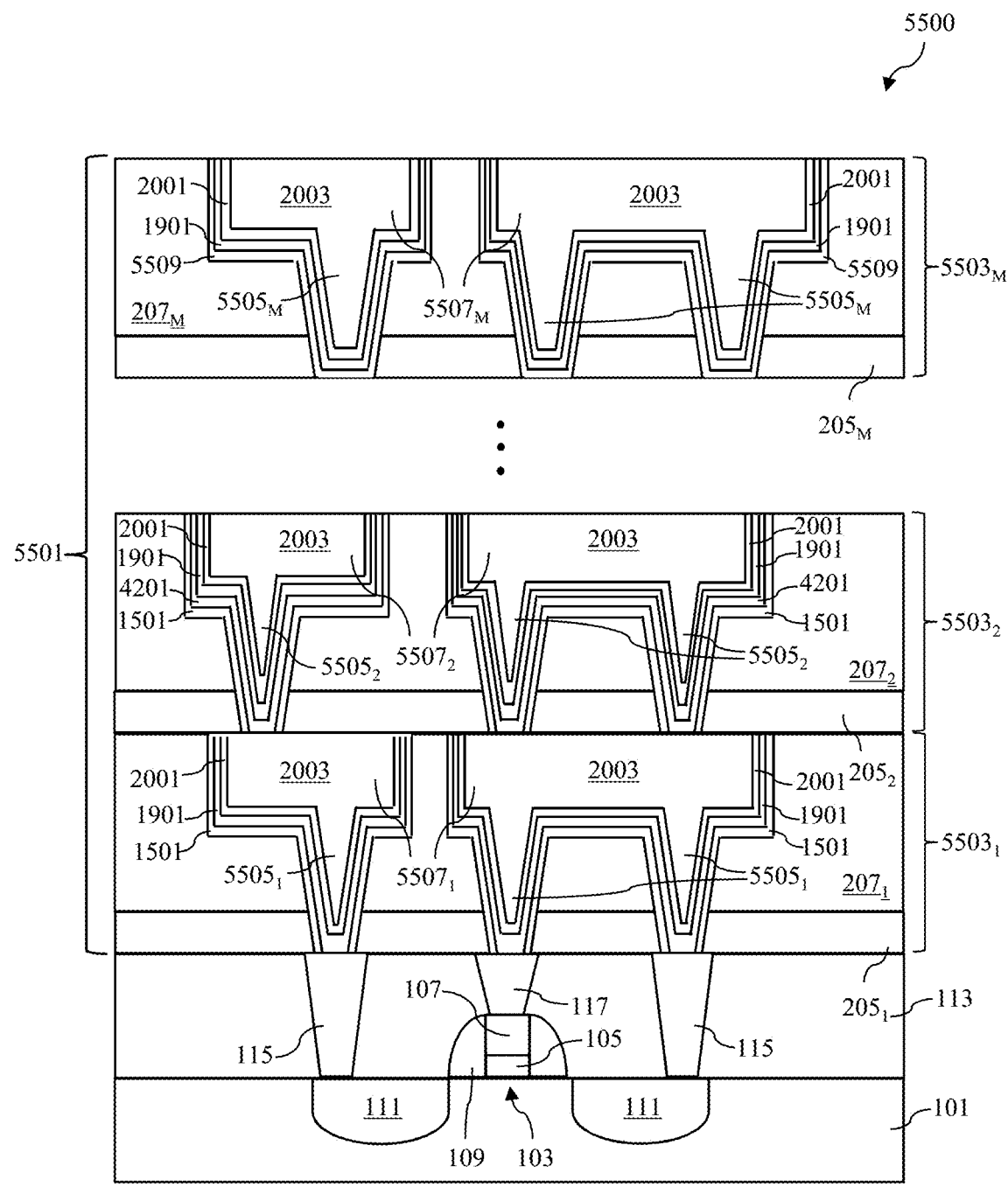
FIG. 55 illustrates a cross-sectional view of a semiconductor device in accordance with some embodiments.

FIG. 55 illustrates a cross-sectional view of a semiconductor device 5500 in accordance with some embodiments. In some embodiments, the semiconductor device 5500 is similar to the semiconductor devices 3500 and 5000 illustrated in FIGS. 35 and 50, respectively, with similar features being labeled with similar numerical references, and the descriptions of the similar features are not repeated herein. In some embodiments, the interconnect structure 5501 of the semiconductor device 5500 is similar to the interconnect structures 3501 and 5001 of the semiconductor device 3500 and 5000, respectively (see FIGS. 35 and 50), with similar features being labeled with similar numerical references, and the descriptions of the similar features are not repeated herein. The interconnect structure 5501 comprises a plurality of metallization layer $5503_1$ to $5503_M$. In some embodiments, the metallization layer $5503_M$ is the final metallization layer of the interconnect structure 5501. In some embodiments, M may be between 1 and 5. In other embodiments, the metallization layer $5503_M$ is not the final metallization layer of the interconnect structure 5501 and additional metallization layers are formed over the metallization layer $5503_M$.

In the illustrated embodiment, interconnects within different metallization layers of the interconnect structure 5501 have different structures. In particular, interconnects with different sizes may have different structures and may be formed using different process steps. In some embodiments, the metallization layer $5503_1$ of the interconnect structure 5501 comprises conductive vias $5505_1$ and conductive lines $5507_1$. In some embodiments when a width of the conductive vias $5505_1$ at the bottom of the conductive vias $5505_1$ is between about 5 nm and about 10 nm, the conductive vias $5505_1$ and conductive lines $5507_1$ may be formed using process steps similar to process steps for forming the conductive vias $2101_1$ and conductive lines $2103_1$ described above with reference to FIGS. 2, 3A-3C, 4-6, 7A-7C, 8-10, 11A, 11B, 12A, 12B, 13-21, and the description is not repeated herein. In such embodiments, the metallization layer $5503_1$ is similar to the metallization layer $3503_1$ (see FIG. 35).

In some embodiments, the metallization layer $5503_2$ of the interconnect structure 5501 comprises conductive vias $5505_2$ and conductive lines $5507_2$. In some embodiments when a width of the conductive vias $5505_2$ at the bottom of the conductive vias $5505_2$ is between about 8 nm and about 14 nm, the conductive vias $5505_2$ and conductive lines $5507_2$ may be formed using process steps similar to process steps for forming the conductive vias $4401_2$ and conductive lines $4403_2$ described above with reference to FIG. 47, and the description is not repeated herein. In such embodiments, the metallization layer $5503_2$ is similar to the metallization layer $5003_2$ (see FIG. 50). Furthermore, the metallization layer $5503_1$ and the metallization layer $5503_2$ have interconnects with different structures.

In some embodiments, the metallization layer $5503_M$ of the interconnect structure 5501 comprises conductive vias $5505_M$ and conductive lines $5507_M$. In the illustrated embodiment, a width of the conductive vias $5505_M$ is greater than the width of the conductive vias $5505_1$ and the width of the conductive vias $5505_2$. In some embodiments when the width of the conductive vias $5505_M$ at the bottom of the conductive vias $5505_M$ is between about 15 nm and about 30 nm, the conductive vias $5505_M$ and conductive lines $5507_M$ may be formed using process steps similar to the process steps for forming the conductive vias $2101_M$ and conductive lines $2103_M$ described above with reference to FIG. 28, with the distinction that the surface modification process steps described above with reference to FIGS. 3A-3C, 4-6, 7A-7C, 8-10, 11A, 11B, 12A, 11B, 13, and 14 are omitted. In such embodiments, instead of forming the barrier layer 1501, the barrier layer 5509 is formed over and in physical contact with the conductive line of the underlying metallization layer. Accordingly, the metallization layer $5503_M$ and the metallization layer $5503_1$ have interconnects with different structures. Furthermore, the metallization layer $5503_M$ and the metallization layer $5503_2$ have interconnects with different structures. In some embodiments, the barrier layer 5509 may comprise titanium, titanium nitride, tantalum, tantalum nitride, a combination thereof, a multilayer thereof, or the like, and may be deposited using ALD, CVD, PVD, a combination thereof, or the like.

In some embodiments, interconnects of the metallization layers interposed between the metallization layer $5503_2$ and the metallization layer $5503_M$, may have different structures depending on the size of the interconnects. In some embodiments when widths of vias are between about 5 nm and about 10 nm, interconnects are formed to have structures similar to interconnects (such as the conductive vias $5505_1$ and the conductive lines $5507_1$) of the metallization layer $5503_1$. In some embodiments when widths of vias are between about 8 nm and about 14 nm, interconnects are formed to have structures similar to interconnects (such as the conductive vias $5505_2$ and the conductive lines $5507_2$) of the metallization layer $5503_2$. In some embodiments when widths of vias are between about 15 nm and about 30 nm, interconnects are formed to have structures similar to interconnects (the conductive vias $5505_M$ and the conductive lines $5507_M$) of the metallization layer $5503_M$.

Figure 56:
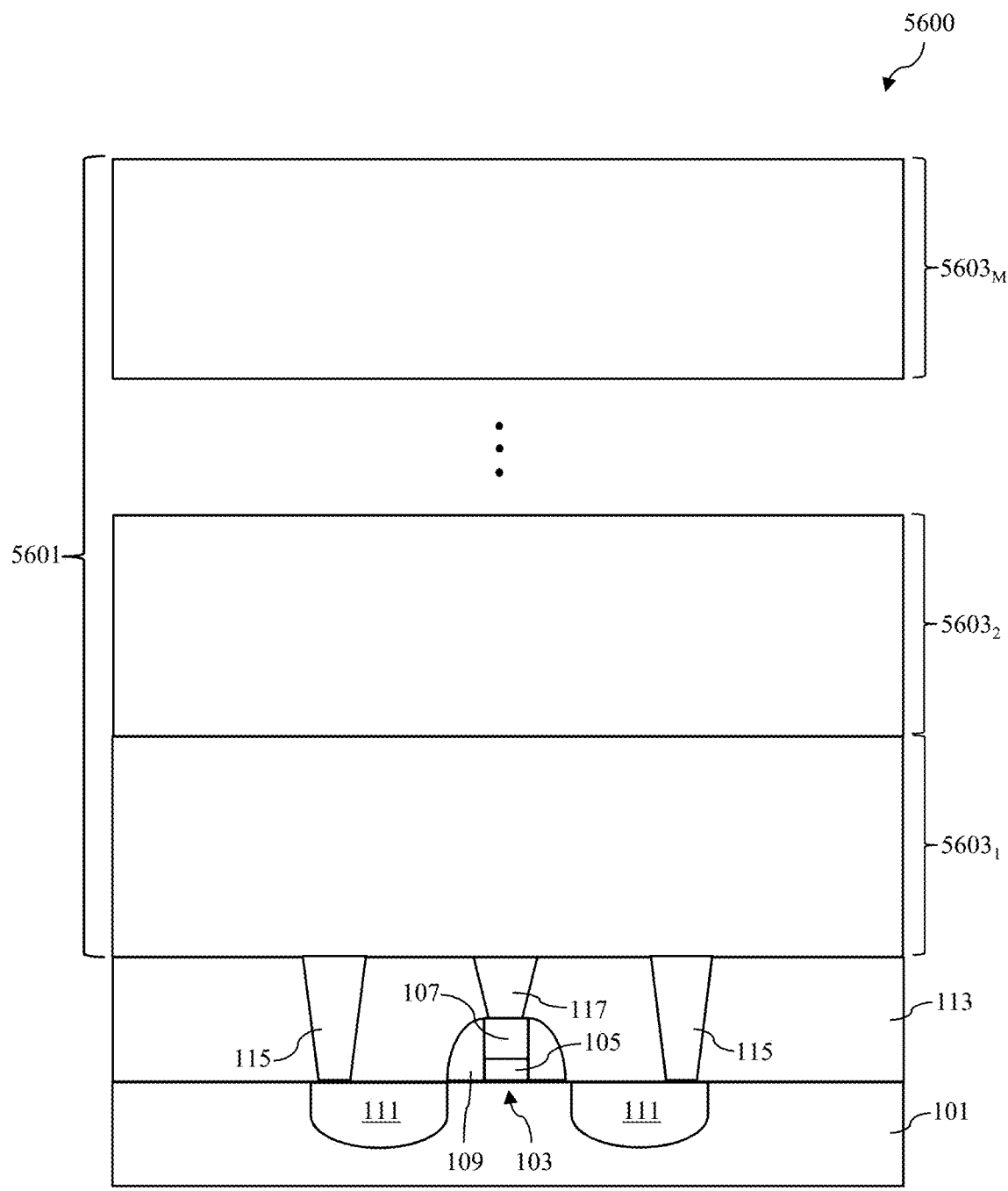
FIG. 56 illustrates a cross-sectional view of a semiconductor device in accordance with some embodiments.

FIG. 56 illustrates a cross-sectional view of a semiconductor device 5600 in accordance with some embodiments. In some embodiments, some features of the semiconductor device 5600 are similar to features of the semiconductor device 100 (see FIG. 28), with similar features being labeled by similar numerical references. In some embodiments, the semiconductor device 5600 further includes an interconnect structure 5601 formed over the one or more ILD layers 113 and the contact plugs 115 and 117. In some embodiments, the interconnect structure 5601 comprises metallization layers $5603_1$ to $5603_M$. In some embodiments, M may be between 1 and 5. In some embodiments, each of the metallization layers $5603_1$ to $5603_M$ may be similar to any of metallization layers $203_2$, $3003_2$, $3503_2$, $3803_2$, $4103_2$, and $5003_2$ (see FIGS. 28, 30, 35, 38, 47, and 50, respectively). In some embodiments, each or some of the metallization layers $5603_1$ to $5603_M$ may have a similar structure.

Figure 57:
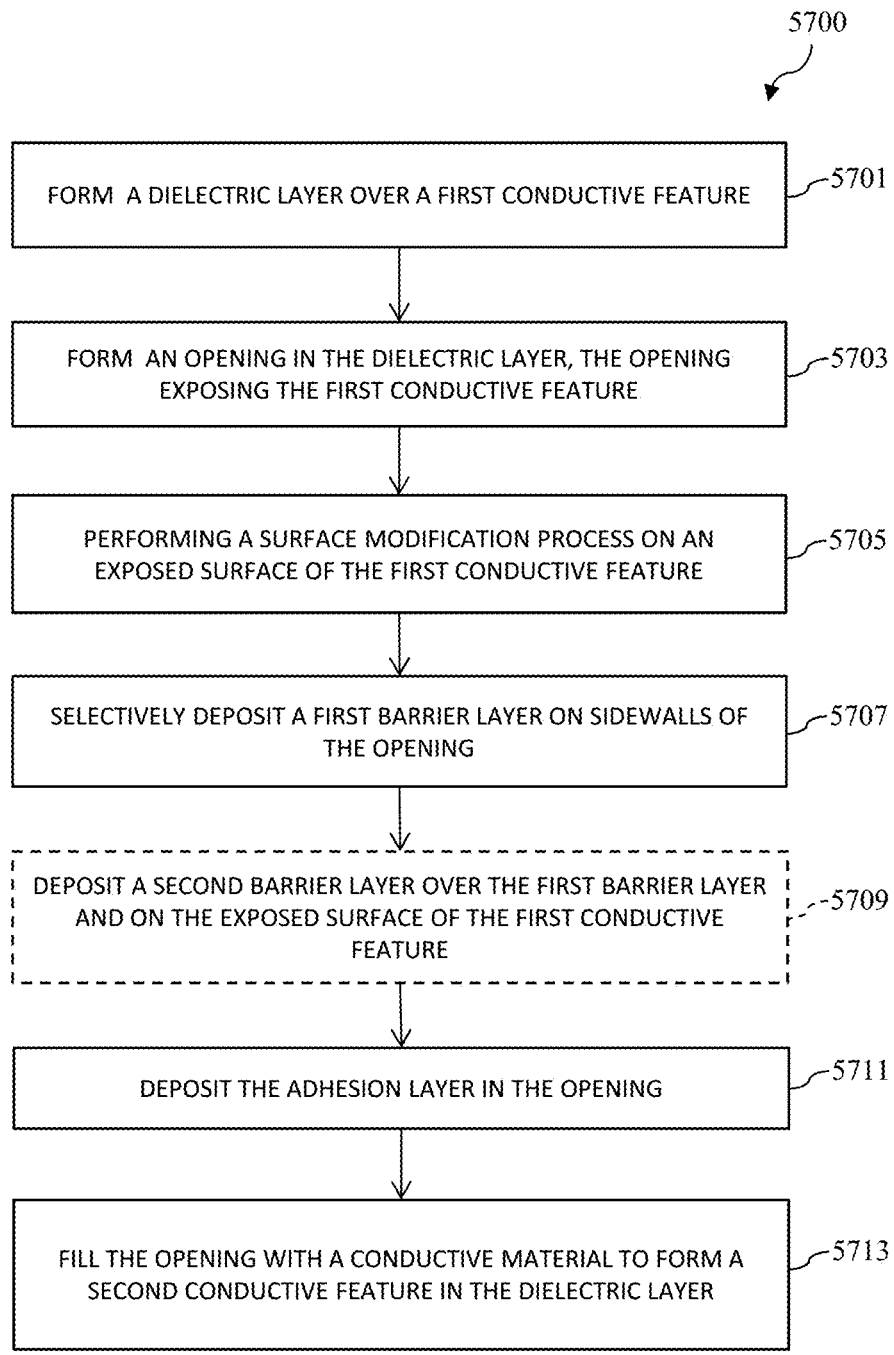
FIG. 57 is a flow diagram illustrating a method of forming an interconnect structure in accordance with some embodiments.

FIG. 57 is a flow diagram illustrating a method 5700 of forming an interconnect structure in accordance with some embodiments. The method 5700 starts with step 5701, where a dielectric layer is formed over a first conductive feature as described above with reference to FIG. 2. In step 5703, an opening is formed in the dielectric layer, such that the opening exposes the first conductive feature as described above with reference to FIG. 2. In step 5705, a surface modification process is performed on an exposed surface of the first conductive feature as described above with reference to FIGS. 5 and 6. In step 5707, a first barrier layer is selectively deposited on sidewalls of the opening as described above with reference to FIG. 15. In step 5709, a second barrier layer is deposited over the first barrier layer and on the exposed surface of the first conductive feature as described above with reference to FIG. 42. In some embodiments, step 5709 is omitted. In step 5711, an adhesion layer is deposited in the opening as described above with reference to FIG. 19. In step 5713, the opening is filled with a conductive material to form a second conductive feature in the dielectric layer as described above with reference to FIGS. 20 and 21.

Figure 58:
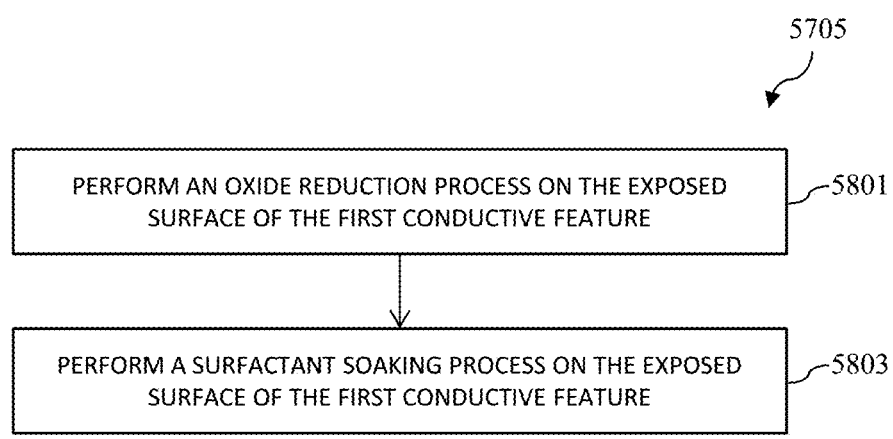
FIG. 58 is a flow diagram illustrating a surface modification process in accordance with some embodiments.

FIG. 58 is a flow diagram illustrating the surface modification process 5705 of the method 5700 (see FIG. 57) in accordance with some embodiments. The surface modification process 5705 starts with step 5801, where an oxide reduction process is performed on the exposed surface of the first conductive feature as described above with reference to FIG. 5. In step 5803, a surfactant soaking process is performed on the exposed surface of the first conductive feature as described above with reference to FIG. 6.

Embodiments may achieve advantages. Various embodiments discussed herein allow for reducing an amount (or volume) of a barrier layer within an interconnect (such as, for example, a conductive via) and, as a result, reducing a contact resistance between interconnects.

In accordance with an embodiment, a method includes depositing a dielectric layer over a conductive feature. The dielectric layer is patterned to form an opening therein. The opening exposes a first portion of the conductive feature. A first barrier layer is deposited on a sidewall of the opening. The first portion of the conductive feature remains exposed at the end of depositing the first barrier layer. In an embodiment, the method further includes depositing a second barrier layer over the first barrier layer in the opening, the second barrier layer being in physical contact with the first portion of the conductive feature. In an embodiment, the first barrier layer is separated from the first portion of the conductive feature by the second barrier layer. In an embodiment, the method further includes: before depositing the first barrier layer, removing a native oxide layer from the first portion of the conductive feature; and before depositing the first barrier layer, performing a surfactant soaking process on the first portion of the conductive feature, the surfactant soaking process suppressing a deposition rate of a first barrier material of the first barrier layer over the first portion of the conductive feature. In an embodiment, the surfactant soaking process forms a surfactant layer over the first portion of the conductive feature. In an embodiment, the surfactant layer comprises a monolayer of alkene molecules or a monolayer of alkyne molecules. In an embodiment, the method further includes: depositing an adhesion layer over the first barrier layer in the opening, the adhesion layer being in physical contact with the first portion of the conductive feature; and filling the opening with a conductive material.

In accordance with another embodiment, a method includes forming a dielectric layer over a first conductive feature. An opening is formed in the dielectric layer. The opening exposes a first portion of the first conductive feature. A second conductive feature is formed in the opening. Forming the second conductive feature includes performing a surface modification process on a top surface of the first portion of the first conductive feature. The surface modification process suppresses a deposition rate of a first barrier material over the top surface of the first portion of the first conductive feature. A first barrier layer including the first barrier material is selectively deposited on a sidewall of the opening. In an embodiment, performing the surface modification process includes: performing an oxide reduction process on the top surface of the first portion of the first conductive feature, the oxide reduction process removing a native oxide layer from the first portion of the first conductive feature; and performing a surfactant soaking process on the top surface of the first portion of the first conductive feature, the surfactant soaking process forming a surfactant layer over the top surface of the first portion of the first conductive feature. In an embodiment, the surfactant layer includes alkene molecules or alkyne molecules. In an embodiment, performing the oxide reduction process includes performing a plasma process on the top surface of the first portion of the first conductive feature. In an embodiment, the method further includes depositing an adhesion layer over the first barrier layer and on a bottom of the opening, the adhesion layer being in physical contact with the top surface of the first portion of the first conductive feature. In an embodiment, the method further includes depositing a second barrier layer including a second barrier material over the first barrier layer and on a bottom of the opening, the second barrier layer being in physical contact with the top surface of the first portion of the first conductive feature.

In accordance with yet another embodiment, a semiconductor structure includes a first conductive feature, a dielectric layer over the first conductive feature, and a second conductive feature within the dielectric layer and in electrical contact with the first conductive feature. A top surface of the first conductive feature has a first region and a second region different from the first region. The dielectric layer covers the first region of the top surface of the first conductive feature. The dielectric layer does not cover the second region of the top surface of the first conductive feature. The second conductive feature includes a conductive material and a first barrier layer interposed between a sidewall of the conductive material and a sidewall of the dielectric layer. The first barrier layer does not cover the second region of the top surface of the first conductive feature. In an embodiment, the semiconductor structure further includes an adhesion layer interposed between the sidewall of the conductive material and the first barrier layer, where the adhesion layer covers the second region of the top surface of the first conductive feature. In an embodiment, the adhesion layer is in physical contact with the sidewall of the dielectric layer. In an embodiment, the adhesion layer is separated from the sidewall of the dielectric layer by the first barrier layer. In an embodiment, the semiconductor structure further includes a second barrier layer interposed between the sidewall of the conductive material and the first barrier layer, where the second barrier layer covers the second region of the top surface of the first conductive feature. In an embodiment, an interface between the first barrier layer and the second barrier layer is in physical contact with the sidewall of the dielectric layer. In an embodiment, an interface between the first barrier layer and the second barrier layer is in physical contact with the second region of the top surface of the first conductive feature.

In accordance with yet another embodiment, a method includes forming a first conductive feature in a first dielectric layer. A second dielectric layer is formed over the first conductive feature and the first dielectric layer. An opening is formed in the second dielectric layer. The opening exposes a top surface of the first conductive feature. The top surface of the first conductive feature includes a first metallic material and a second metallic material different from the first metallic material. A native oxide layer is removed from the top surface of the first conductive feature. A surfactant soaking process is performed on the top surface of the first conductive feature. The surfactant soaking process forms a surfactant layer over the top surface of the first conductive feature. A first barrier layer is deposited on a sidewall of the opening. The surfactant layer remains exposed at the end of depositing the first barrier layer.

In an embodiment, the surfactant soaking process includes: soaking the top surface of the first conductive feature in a first gas including first surfactant molecules, the first surfactant molecules including unsaturated carbon functional groups; and soaking the top surface of the first conductive feature in a second gas including second surfactant molecules, the second surfactant molecules including nitrogen-based functional groups, where the surfactant layer includes the first surfactant molecules and the second surfactant molecules. In an embodiment, the first surfactant molecules are adsorbed on the first metallic material through the unsaturated carbon functional groups. In an embodiment, the second surfactant molecules are adsorbed on the second metallic material through the nitrogen-based functional groups. In an embodiment, the surfactant soaking process includes soaking the top surface of the first conductive feature in a gas including a mixture of first surfactant molecules and second surfactant molecules, the first surfactant molecules including unsaturated carbon functional groups, and the second surfactant molecules including nitrogen-based functional groups, where the surfactant layer includes the first surfactant molecules and the second surfactant molecules. In an embodiment, the surfactant soaking process includes soaking the top surface of the first conductive feature in a gas including surfactant molecules, the surfactant molecules including unsaturated carbon functional groups and nitrogen-based functional groups, wherein the surfactant layer includes the surfactant molecules. In an embodiment, the method further includes: depositing an adhesion layer over the first barrier layer in the opening, where the surfactant layer remains exposed at the end of depositing the adhesion layer; and removing the surfactant layer to expose the top surface of the first conductive feature.

In accordance with yet another embodiment, a method includes depositing a capping layer over a first conductive feature. The first conductive feature includes a first metallic material. The capping layer includes a second metallic material. The second metallic material is more electropositive than the first metallic material. A dielectric layer is deposited over the capping layer. A patterning process is performed on the dielectric layer to form an opening extending through the dielectric layer. The patterning process partially removes an exposed portion the capping layer such that a bottom of the opening exposes a first metallic surface including the first metallic material of the capping layer and the second metallic material of the first conductive feature. A surfactant soaking process is performed on the first metallic surface. The surfactant soaking process suppresses a first deposition rate of a barrier material and a second deposition rate of an adhesion material over the first metallic surface. A barrier layer including the barrier material is selectively deposited on a sidewall of the opening. An adhesion layer including the adhesion material is selectively deposited over the barrier layer in the opening. In an embodiment, the method further includes, before performing the surfactant soaking process, performing a plasma process to remove a native oxide layer from the first metallic surface. In an embodiment, the surfactant soaking process includes: soaking the first metallic surface in a first gas including first surfactant molecules, the first surfactant molecules including unsaturated carbon functional groups, where the first surfactant molecules are adsorbed on the first metallic material of the first metallic surface through the unsaturated carbon functional groups; and soaking the first metallic surface in a second gas including second surfactant molecules, the second surfactant molecules including nitrogen-based functional groups, where the second surfactant molecules are adsorbed on the second metallic material of the first metallic surface through the nitrogen-based functional groups. In an embodiment, soaking the first metallic surface in the first gas including the first surfactant molecules is performed in a first process chamber, and soaking the first metallic surface in the second gas including the second surfactant molecules is performed in a second process chamber different from the first process chamber. In an embodiment, soaking the first metallic surface in the first gas including the first surfactant molecules and soaking the first metallic surface in the second gas including the second surfactant molecules are performed in a same process chamber. In an embodiment, the surfactant soaking process includes soaking the first metallic surface in a gas including a mixture of first surfactant molecules and second surfactant molecules, the first surfactant molecules including unsaturated carbon functional groups, and the second surfactant molecules including nitrogen-based functional groups, where the first surfactant molecules are adsorbed on the first metallic material of the first metallic surface through the unsaturated carbon functional groups, and where the second surfactant molecules are adsorbed on the second metallic material of the first metallic surface through the nitrogen-based functional groups. In an embodiment, the surfactant soaking process includes soaking the first metallic surface in a gas including surfactant molecules, the surfactant molecules including unsaturated carbon functional groups and nitrogen-based functional groups, where a first group of the surfactant molecules is adsorbed on the first metallic material of the first metallic surface through the unsaturated carbon functional groups, and where a second group of the surfactant molecules is adsorbed on the second metallic material of the first metallic surface through the nitrogen-based functional groups.

In accordance with yet another embodiment, a semiconductor structure includes a first conductive feature, a dielectric layer over the first conductive feature, and a second conductive feature within the dielectric layer and in electrical contact with the first conductive feature. The second conductive feature includes a conductive layer, a barrier layer interposed between a sidewall of the conductive layer and a sidewall of the dielectric layer, and an adhesion layer interposed between the sidewall of the conductive layer and the barrier layer. The barrier layer does not extend between a bottom surface of the conductive layer and a top surface of the first conductive feature. The adhesion layer does not extend between the bottom surface of the conductive layer and the top surface of the first conductive feature. In an embodiment, the conductive layer is in physical contact with the sidewall of the dielectric layer. In an embodiment, the semiconductor structure further includes a capping layer between the first conductive feature and the dielectric layer. In an embodiment, the conductive layer is in physical contact with a sidewall of the capping layer. In an embodiment, the barrier layer is in physical contact with a sidewall of the capping layer. In an embodiment, a portion of the conductive layer is interposed between a bottom surface of the adhesion layer and the top surface of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first conductive feature in a first dielectric layer;
   forming a second dielectric layer over the first conductive feature and the first dielectric layer;
   forming an opening in the second dielectric layer, the opening exposing a top surface of the first conductive feature, the top surface of the first conductive feature comprising a first metallic material and a second metallic material different from the first metallic material;
   removing a native oxide layer from the top surface of the first conductive feature;
   performing a surfactant soaking process on the top surface of the first conductive feature, the surfactant soaking process forming a surfactant layer over the top surface of the first conductive feature; and
   depositing a first barrier layer on a sidewall of the opening, wherein the surfactant layer remains exposed at the end of depositing the first barrier layer.

2. The method of claim 1, wherein the surfactant soaking process comprises:
  soaking the top surface of the first conductive feature in a first gas comprising first surfactant molecules, the first surfactant molecules comprising unsaturated carbon functional groups; and
  soaking the top surface of the first conductive feature in a second gas comprising second surfactant molecules, the second surfactant molecules comprising nitrogen-based functional groups, wherein the surfactant layer comprises the first surfactant molecules and the second surfactant molecules.

3. The method of claim 2, wherein the first surfactant molecules are adsorbed on the first metallic material through the unsaturated carbon functional groups.

4. The method of claim 3, wherein the second surfactant molecules are adsorbed on the second metallic material through the nitrogen-based functional groups.

5. The method of claim 1, wherein the surfactant soaking process comprises:
  soaking the top surface of the first conductive feature in a gas comprising a mixture of first surfactant molecules and second surfactant molecules, the first surfactant molecules comprising unsaturated carbon functional groups, and the second surfactant molecules comprising nitrogen-based functional groups, wherein the surfactant layer comprises the first surfactant molecules and the second surfactant molecules.

6. The method of claim 1, wherein the surfactant soaking process comprises:
  soaking the top surface of the first conductive feature in a gas comprising surfactant molecules, the surfactant molecules comprising unsaturated carbon functional groups and nitrogen-based functional groups, wherein the surfactant layer comprises the surfactant molecules.

7. The method of claim 1, further comprising:
  depositing an adhesion layer over the first barrier layer in the opening, wherein the surfactant layer remains exposed at the end of depositing the adhesion layer; and
  removing the surfactant layer to expose the top surface of the first conductive feature.

8. A method comprising:
  depositing a capping layer over a first conductive feature, the first conductive feature comprising a first metallic material, the capping layer comprising a second metallic material, the second metallic material being more electropositive than the first metallic material;
  depositing a dielectric layer over the capping layer;
  performing a patterning process on the dielectric layer to form an opening extending through the dielectric layer, the patterning process partially removing an exposed portion of the capping layer such that a bottom of the opening exposes a first metallic surface comprising the second metallic material of the capping layer and the first metallic material of the first conductive feature;
  performing a surfactant soaking process on the first metallic surface, the surfactant soaking process suppressing a first deposition rate of a barrier material and a second deposition rate of an adhesion material over the first metallic surface;
  selectively depositing a barrier layer comprising the barrier material on a sidewall of the opening; and
  selectively depositing an adhesion layer comprising the adhesion material over the barrier layer in the opening.

9. The method of claim 8, further comprising, before performing the surfactant soaking process, performing a plasma process to remove a native oxide layer from the first metallic surface.

10. The method of claim 8, wherein the surfactant soaking process comprises:
  soaking the first metallic surface in a first gas comprising first surfactant molecules, the first surfactant molecules comprising unsaturated carbon functional groups, wherein the first surfactant molecules are adsorbed on the first metallic material of the first metallic surface through the unsaturated carbon functional groups; and
  soaking the first metallic surface in a second gas comprising second surfactant molecules, the second surfactant molecules comprising nitrogen-based functional groups, wherein the second surfactant molecules are adsorbed on the second metallic material of the first metallic surface through the nitrogen-based functional groups.

11. The method of claim 10, wherein soaking the first metallic surface in the first gas comprising the first surfactant molecules is performed in a first process chamber, and wherein soaking the first metallic surface in the second gas comprising the second surfactant molecules is performed in a second process chamber different from the first process chamber.

12. The method of claim 10, wherein soaking the first metallic surface in the first gas comprising the first surfactant molecules and soaking the first metallic surface in the second gas comprising the second surfactant molecules are performed in a same process chamber.

13. The method of claim 8, wherein the surfactant soaking process comprises:
  soaking the first metallic surface in a gas comprising a mixture of first surfactant molecules and second surfactant molecules, the first surfactant molecules comprising unsaturated carbon functional groups, and the second surfactant molecules comprising nitrogen-based functional groups, wherein the first surfactant molecules are adsorbed on the first metallic material of the first metallic surface through the unsaturated carbon functional groups, and wherein the second surfactant molecules are adsorbed on the second metallic material of the first metallic surface through the nitrogen-based functional groups.

14. The method of claim 8, wherein the surfactant soaking process comprises:
  soaking the first metallic surface in a gas comprising surfactant molecules, the surfactant molecules comprising unsaturated carbon functional groups and nitrogen-based functional groups, wherein a first group of the surfactant molecules is adsorbed on the first metallic material of the first metallic surface through the unsaturated carbon functional groups, and wherein a second group of the surfactant molecules is adsorbed on the second metallic material of the first metallic surface through the nitrogen-based functional groups.

15. A semiconductor structure comprising:
  a first conductive feature;
  a dielectric layer over the first conductive feature; and
  a second conductive feature within the dielectric layer and in electrical contact with the first conductive feature, the second conductive feature comprising:
    a conductive layer;
    a barrier layer interposed between a sidewall of the conductive layer and a sidewall of the dielectric layer, wherein the barrier layer does not extend between a bottom surface of the conductive layer and a top surface of the first conductive feature; and an adhesion layer interposed between the sidewall of the conductive layer and the barrier layer, wherein the adhesion layer does not extend between the bottom surface of the conductive layer and the top surface of the first conductive feature, wherein a portion of the conductive layer is interposed between a bottom surface of the adhesion layer and the top surface of the first conductive feature.

16. The semiconductor structure of claim 15, wherein the conductive layer is in physical contact with the sidewall of the dielectric layer.

17. The semiconductor structure of claim 15, further comprising a capping layer between the first conductive feature and the dielectric layer.

18. The semiconductor structure of claim 17, wherein the conductive layer is in physical contact with a sidewall of the capping layer.

19. The semiconductor structure of claim 17, wherein the barrier layer is in physical contact with a sidewall of the capping layer.

20. The semiconductor structure of claim 15, wherein the adhesion layer is spaced apart from the first conductive feature by a first distance, wherein the barrier layer is spaced apart from the first conductive feature by a second distance, wherein the first distance is greater than the second distance.

\* \* \* \* \*